(12) United States Patent  
Matsushita et al.

(10) Patent No.: US 7,538,013 B2
(45) Date of Patent: May 26, 2009

(54) METHOD OF MANUFACTURING A FIELD EFFECT TRANSISTOR COMPRISING AN INSULATING FILM INCLUDING METAL OXIDE HAVING CRYSTALLINITY AND DIFFERENT IN A LATTICE DISTANCE FROM SEMICONDUCTOR SUBSTRATE

(75) Inventors: Daisuke Matsushita, Kanagawa-Ken (JP); Yukie Nishikawa, Kanagawa-Ken (JP); Hideki Satake, Kanagawa-Ken (JP); Noburu Fukushima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 11/472,329

(22) Filed: Jun. 22, 2006

(65) Prior Publication Data

US 2006/0237837 A1    Oct. 26, 2006

Related U.S. Application Data

(62) Division of application No. 10/863,226, filed on Jun. 9, 2004, now Pat. No. 7,091,561.

(30) Foreign Application Priority Data

Jun. 13, 2003    (JP)    ............................ 2003-169467

(51) Int. Cl.
*H01L 21/20* (2006.01)
*H01L 21/36* (2006.01)
(52) U.S. Cl. .................. 438/479; 438/149; 438/517
(58) Field of Classification Search ............. 438/149, 438/479, 517
See application file for complete search history.

(56) References Cited

U.S. PATENT DOCUMENTS 6,333,215 B1 *  12/2001  Matsuda et al. ............. 438/149

(Continued)

FOREIGN PATENT DOCUMENTS

JP    10-144607    5/1998

(Continued)

OTHER PUBLICATIONS

Webster's II New Riverside University Dictionary, 1994, p. 308.*

(Continued)

*Primary Examiner*—Howard Weiss
(74) *Attorney, Agent, or Firm*—Finnegan, Henderson, Farabow, Garrett & Dunner, L.L.P.

(57)    ABSTRACT

There is provided a field effect transistor including: a first insulating film formed on a semiconductor substrate, and including at least a metal oxide having a crystallinity and different in a lattice distance of a crystal on an interface from the semiconductor substrate; a channel region formed above the first insulating film, and different in the lattice distance from the semiconductor substrate; a source region and a drain region formed above the first insulating film on side surfaces of the channel region, respectively; a second insulating film formed right above the channel region; a gate insulating film formed on a side surface of the channel region different from the side surfaces of the channel region on which the source region and the drain regions are formed; and a gate electrode formed through the gate insulating film on at least the side surface of the channel region different from the side surfaces of the channel region on which the source region and the drain region are formed.

16 Claims, 56 Drawing Sheets

U.S. PATENT DOCUMENTS

| | | |
|---|---|---|
| 6,787,433 B2 | 9/2004 | Mitani et al. |
| 6,914,312 B2 | 7/2005 | Nishikawa et al. |
| 2003/0057491 A1 | 3/2003 | Mitani et al. |
| 2005/0258477 A1 | 11/2005 | Saito |

FOREIGN PATENT DOCUMENTS

| | | |
|---|---|---|
| JP | 2001-284558 | 10/2001 |
| JP | 2002-118255 | 4/2002 |
| JP | 2002-176061 | 6/2002 |
| JP | 2002-198538 | 7/2002 |
| JP | 2002-237579 | 8/2002 |
| JP | 2002-289871 | 10/2002 |
| JP | 2002-324905 | 11/2002 |

OTHER PUBLICATIONS

Uchida et al., "Experimental Study on Carrier Transport Mechanism in Ultrathin-Body SOI n- and p- MOSFETs with SOI Thickness less than 5 nm," IEDM Tech. Dig. (2002), pp. 47-50.

Mizuno et al., "High Performance Strained-Si p-MOSFETs on SiGe-on-Insulator Substrates Fabricated by SIMOX Technology," IEDM 99 (1999), pp. 934-936.

Notification of Reason for Rejection issued by the Japanese Patent Office on May 18, 2007, for Japanese Patent Application No. 2003-169467, and English-language translation thereof.

* cited by examiner

A-A CROSS SECTION

B-B CROSS SECTION

P1~P4 : MEASUREMENT POINTS

P1~P5 : MEASUREMENT POINTS

A-A CROSS SECTION

B-B CROSS SECTION

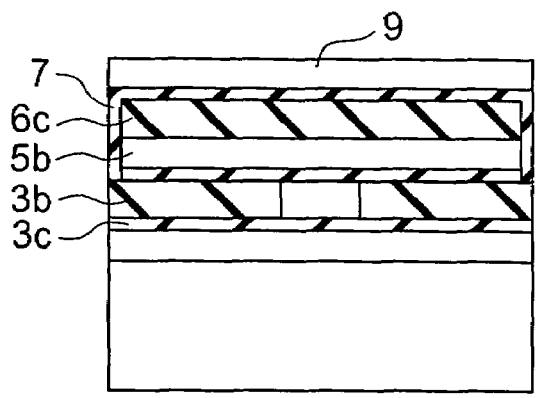
FIG. 41A
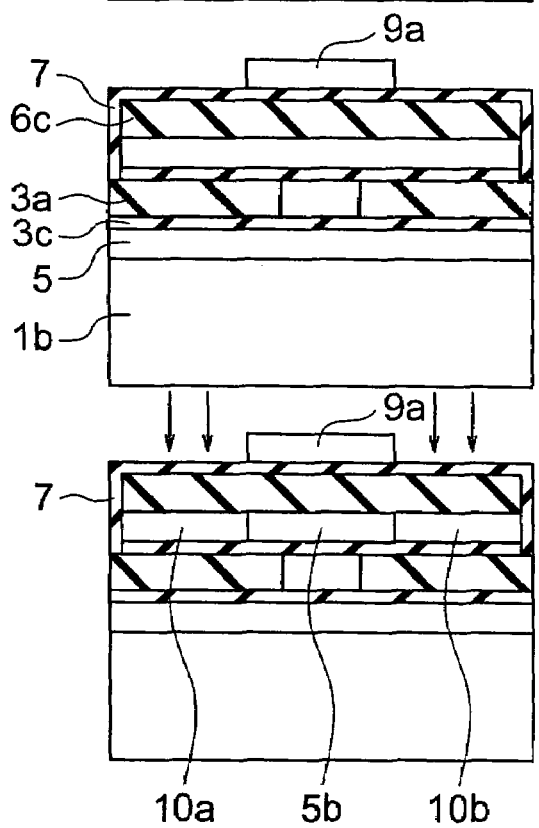
FIG. 41B
FIG. 41C
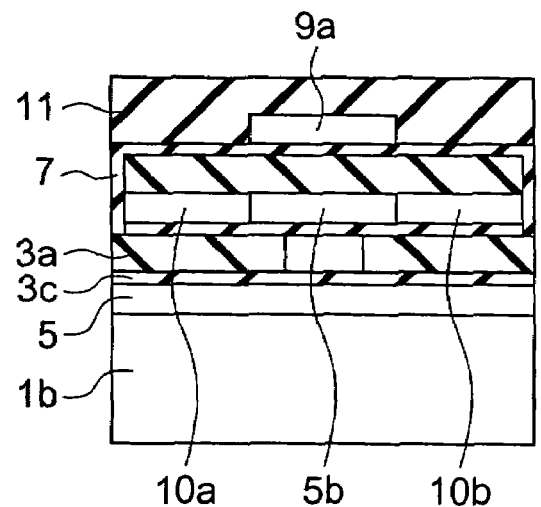
FIG. 41D

A-A CROSS SECTION

B-B CROSS SECTION

METHOD OF MANUFACTURING A FIELD EFFECT TRANSISTOR COMPRISING AN INSULATING FILM INCLUDING METAL OXIDE HAVING CRYSTALLINITY AND DIFFERENT IN A LATTICE DISTANCE FROM SEMICONDUCTOR SUBSTRATE

CROSS-REFERENCE TO RELATED APPLICATIONS

This is a division of application Ser. No. 10/863,226, filed Jun. 9, 2004 which matured to U.S. Pat. No. 7,091,561 on Aug. 15, 2006, which is incorporated herein by reference.

BACKGROUND OF THE INVENTION

1. Field of the Invention

The present invention relates to a field effect transistor and a method of manufacturing a field effect transistor.

2. Related Art

Following an improvement in performance, microfabrication and an increase of a density of a metal-oxide-semiconductor (MOS) field effect transistor (FET) are repeatedly achieved, and the MOS FET is increasingly reduced in size. A film thickness of a gate insulating film, for example, which consists of $SiO_2$, and a transistor operation of which can be checked, has reached less than one nanometer in a study phase. The thickness corresponds to that of six atomic layers of $SiO_2$. However, the reduction in size of the FET following a reduction in thickness of the gate insulating film disadvantageously causes an increase of a leak current, and an increase of power consumption. For this reason, a technique for suppressing the increase of the leak current while realizing the reduction in size is desired.

As a method for suppressing the increase of the leak current while reducing the size of the transistor, there is proposed a method using a material having a higher dielectric constant (a higher dielectric constant film) such as an Hf oxide in place of the conventional $SiO_2$ film or SiON film. The use of the high dielectric constant film has an advantage in that the leak current can be reduced while making a film thickness equivalent to the thickness of the $SiO_2$ film (hereinafter "EOT" (Equivalent Oxide Thickness)) thinner. The use of the high dielectric constant film has, however, disadvantages in that a carrier mobility is deteriorated and a driving force is thereby deteriorated as compared with the use of the $SiO_2$ film due to an increase of the density of an interface state and impurity scattering in the high dielectric constant film. Development of a technique for preventing deterioration of the carrier mobility is, therefore, desired.

Furthermore, there is no avoiding confronting a physical limit to the improvement in performance by the microfabrication. A technique for improving the MOSFET without relying on the microfabrication is also required. Examples of the technique include new structured MOSFET's for which new concepts such as band engineering and three-dimensional structure are introduced. Specifically, a very thin film SOI (Silicon on Insulator) MOSFET, a Fin MOSFET, a strained Si-MOSFET, and the like are potential new structured MOS-FET's.

The very thin SOI MOSFET is characterized by burying an $SiO_2$ film in a substrate to thereby make a channel region thin. Since complete depletion can be realized at a low impurity concentration, a short-channel effect can be suppressed and a switching rate can be accelerated. However, Si in the channel region is applied with a compressive strain from the buried $SiO_2$ film, an electron mobility is disadvantageously deteriorated. In addition, in order to apply a substrate potential, complex and elaborate manufacturing steps of etching the $SiO_2$ film, and then epitaxially growing the Si are disadvantageously required, and a manufacturing cost is thereby, disadvantageously increased. The Fin MOSFET is a development type of the very thin SOI MOSFET and characterized by including a Fin channel region formed on a buried $SiO_2$ film. Since the Fin MOSFET is double-gate MOSFET having right and left sides surrounded by gate electrodes, respectively, it is expected to not only suppress the short-channel effect but also increase an ON current, as compared with a conventional single-gate MOSFET.

However, similarly to the very thin SOI MOSFET, the conventional Fin MOSFET is structured so that the channel receives a compressive strain from the buried $SiO_2$ film. Due to this, the conventional Fin MOSFET is said to have a disadvantage of deterioration of an electron mobility. In addition, similarly to the very thin SIO MOSFET, complex and elaborate manufacturing steps are required so as to apply a substrate potential (see, for example, Japanese Patent Application Laid-Open No. 2002-118255). Further, since the right and left sides of the Fin MOSFET are surrounded by the gate electrodes, boron spike from the gate electrodes conspicuously occurs, thereby disadvantageously making it difficult to control a threshold.

The strained Si-MOSFET using SiGe is characterized by forming a substrate that includes an SiGe layer (to be also referred to as "SGOI (SiGe on Insulator) substrate", hereinafter) on an insulating film, and by epitaxially growing Si on the SGOI substrate. Since Si in a channel region is applied with a tensile strain from the SiGe layer, a carrier mobility can be advantageously improved. It is confirmed that the n-MOSFET has about 80% improvement and that the p-MOSFET has about 20% improvement in carrier mobility. The reason that the p-MOSFET does not exhibit notable improvement in mobility is not clear quantitatively. However, it is said that this is partly because only the tensile strain is applied to an Si layer serving as the channel region when the Si layer is formed on the SiGe layer. If the compressive strain is applied to the channel region, the mobility may possibly be improved. Therefore, a compressively strained p-MOSFET having an SiGe layer formed as a channel region is studied. According to a study report, the p-MOSFET has 130% improvement in hole mobility. Therefore, it is highly likely that a driving force of the p-MOSFET is improved by forming the channel region consisting of Si applied with a higher compressive strain. However, in the manufacturing of the SiGe substrate (or SGOI) substrate, complex methods including an SIMOX method, a bonding method, and an oxidation-concentration method are used, thereby disadvantageously increasing a manufacturing cost. Development of a technique for easily applying the tensile strain or the compressive strain in a manufacturing process is desired. Further, if the channel region is thinner, Ge diffused from the SiGe substrate and pass-through dislocation accelerate carrier scattering. Therefore, a method for manufacturing a strained Si without using SiGe is desired.

As stated above, there is no avoiding confronting the limit to the improvement in performance by the microfabrication. It is, therefore, necessary to propose a new MOSFET structure without relying on the microfabrication.

Nevertheless, the potential new structured MOSFET's such as the very thin SOI-MOSFET, the Fin MOSFET, and the strained SI-MOSFET have the disadvantages, as described. The very thin SOI-MOSFET and the Fin MOSFET have the disadvantage of the deterioration of the electron mobility because Si in the channel region is applied with the compressive strain from the buried $SiO_2$ film. The strained Si-MOSFET has the following disadvantage. If the channel region is thinner, then the carrier scattering is accelerated by Ge diffused in the channel region, and the mobility is deteriorated.

SUMMARY OF THE INVENTION

A field effect transistor according to a first aspect of the present invention includes: a first insulating film formed on a semiconductor substrate, and including at least a metal oxide having a crystallinity and different in a lattice distance of a crystal on an interface from the semiconductor substrate; a channel region formed above the first insulating film, and different in the lattice distance from the semiconductor substrate; a source region and a drain region formed above the first insulating film on side surfaces of the channel region, respectively; a second insulating film formed right above the channel region; a gate insulating film formed on a side surface of the channel region different from the side surfaces of the channel region on which the source region and the drain regions are formed; and a gate electrode formed through the gate insulating film on at least the side surface of the channel region different from the side surfaces of the channel region on which the source region and the drain region are formed.

A field effect transistor manufacturing method according to a second aspect of the present invention includes: forming a first insulating film, which includes at least a metal oxide film consisting of a crystalline metal oxide different in a lattice distance from a semiconductor substrate, on the semiconductor substrate; and changing a conduction of a region of a part of the metal oxide film included in the first insulating film.

BRIEF DESCRIPTION OF THE DRAWINGS

FIGS. 41A to 41D are cross-sectional views which depict manufacturing steps of the method for manufacturing the FET according to the ninth embodiment;

DETAILED DESCRIPTION OF THE INVENTION

First Embodiment

Figure 1:
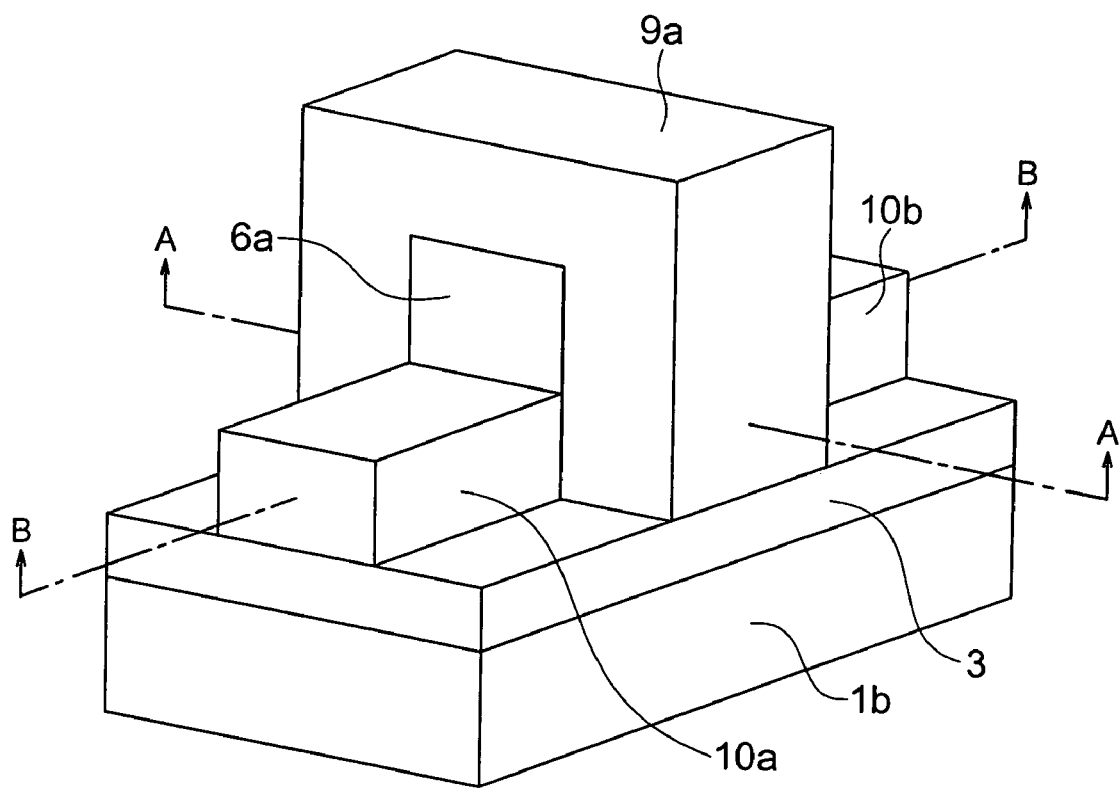
FIG. 1 is a perspective view which depicts configuration of a field effect transistor (FET) according to a first embodiment of the present invention.
Figure 2:
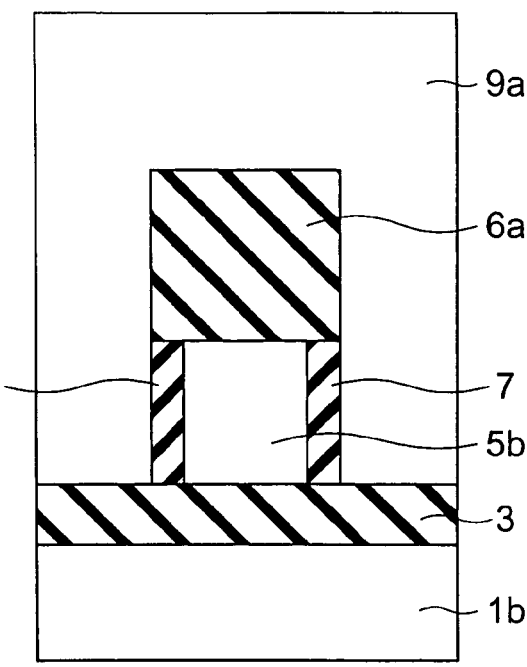
FIG. 2 is a cross-sectional view which depicts the configuration of the FET according to the first embodiment.
Figure 3:
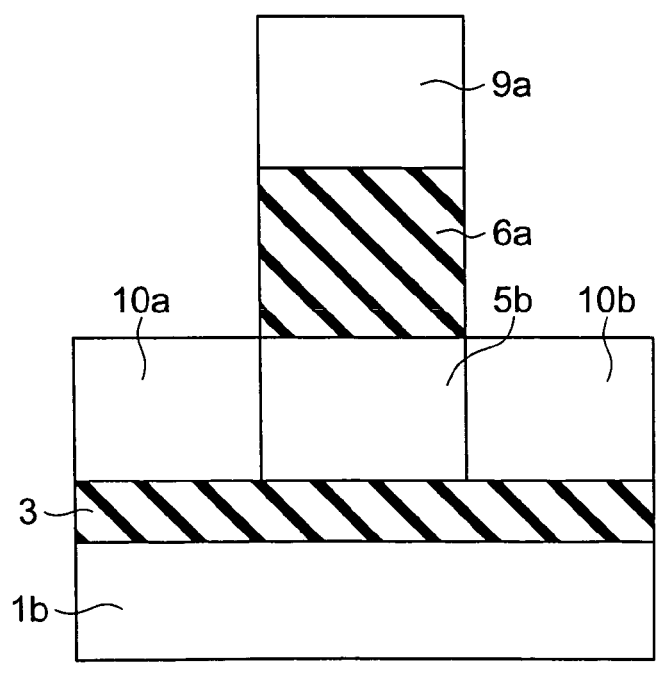
FIG. 3 is a cross-sectional view which depicts the configuration of the FET according to the first embodiment.

The configuration of a Fin metal insulator semiconductor (MIS) FET according to a first embodiment of the present invention will be described with reference to FIGS. 1 to 3. FIG. 1 is a perspective view which depicts the configuration of the Fin MISFET according to the first embodiment. FIG. 2 is a cross-sectional view taken along a line A-A of FIG. 1. FIG. 3 is a cross-sectional view taken along a line B-B of FIG. 1.

In the MISFET according to the first embodiment, an insulating film 3 that contains at least a crystalline metal oxide is formed on a surface of a semiconductor substrate 1b consisting of Si, and a channel region (channel layer) 5b is formed on the insulating film 3. A crystal lattice distance (hereinafter, "lattice distance") of the metal oxide that constitutes the insulating film 3 on an interface differs from a lattice distance of Si on an interface. Due to this, Si in the channel region 5b is applied with a stress from the insulating film 3, and a strained Si layer is thereby formed. "The lattice distance of the metal oxide that constitutes the insulating film 3 on an interface differs from the lattice distance of Si on an interface" means that the former interface differs from the latter interface in, for example, statistic average lattice distance. A source region 10a and a drain region 10b different in conduction type from the channel region 5b are formed on both sides of the channel region 5b, respectively. Further, an insulating film 7 is formed on a side surface of the channel region 5b. A gate insulating film 7 is formed on a side surface of the channel region 5b. A gate electrode 9a consisting of polysilicon is formed around the gate insulating film 7. Namely, the Fin MISFET according to the first embodiment is constituted so that the lattice distance of Si in the channel region 5b differs from that of Si in the semiconductor substrate 1b. If the MISFET according to this embodiment is an n-MISFET, then the lattice distance of the metal oxide film is set larger than that of Si, and the lattice distance of Si in the channel region is widened by a tensile stress. It is thereby possible to improve an electron mobility in the channel region (channel layer). If the MISFET is a p-MISFET, then the lattice distance of the metal oxide film is set either larger or smaller than that of Si, and the lattice distance of Si in the channel region is changed by the tensile stress or a compressive stress. It is thereby possible to improve a hole mobility in the channel region (channel layer).

Figure 8A:
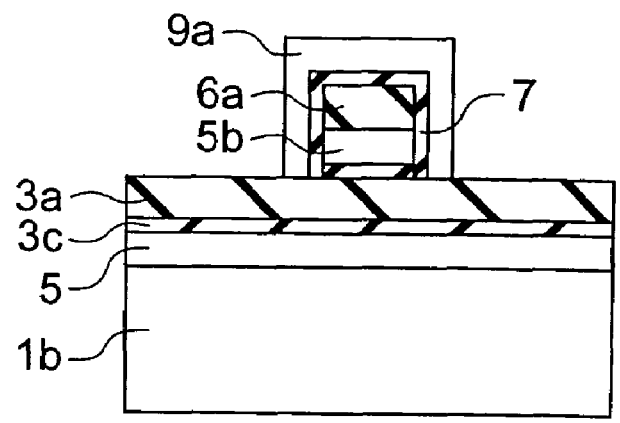
FIGS. 8A to 8C are cross-sectional views which depict manufacturing steps of the method for manufacturing the FET according to the first embodiment.
Figure 8B:
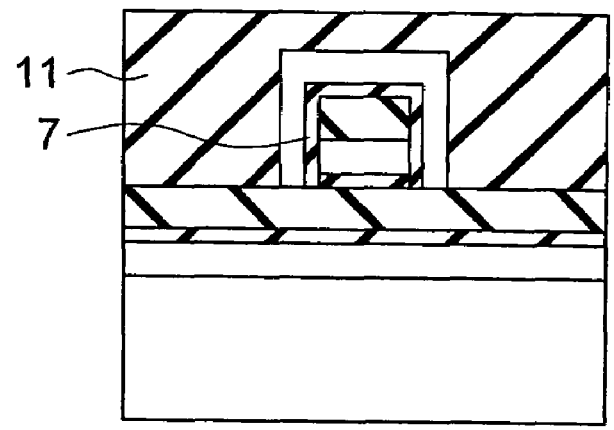
Figure 8C:
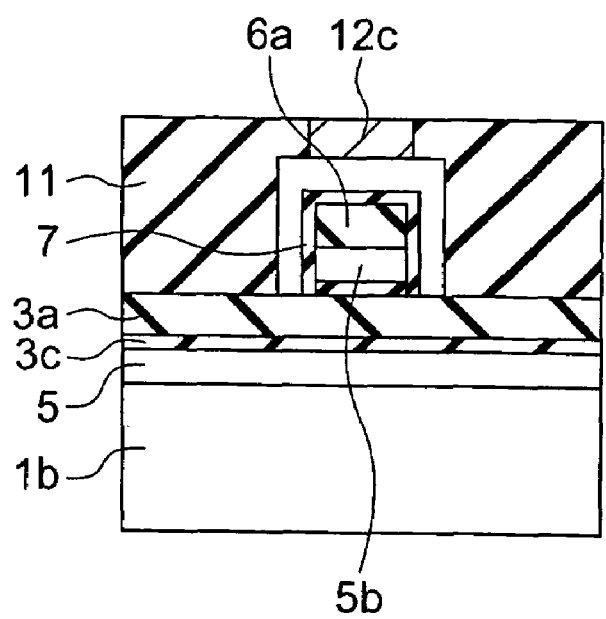
Figure 9A:
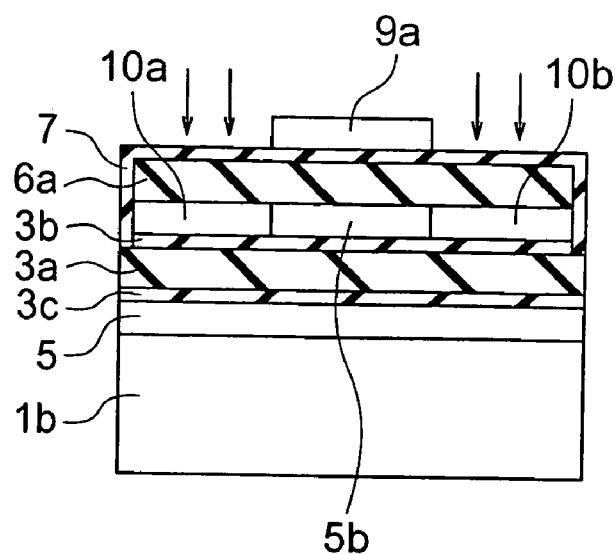
FIGS. 9A to 9C are cross-sectional views which depict manufacturing steps of the method for manufacturing the FET according to the first embodiment.
Figure 9B:
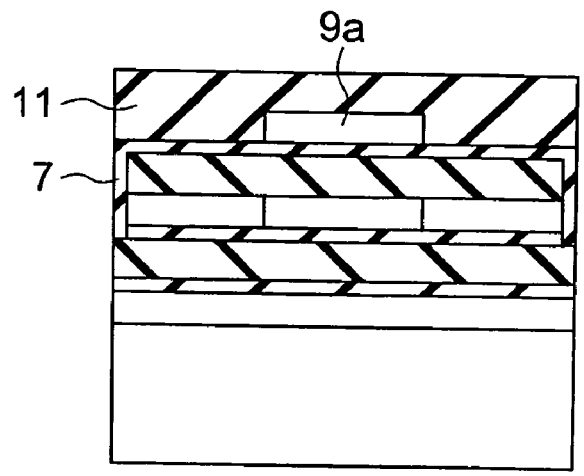
Figure 9C:
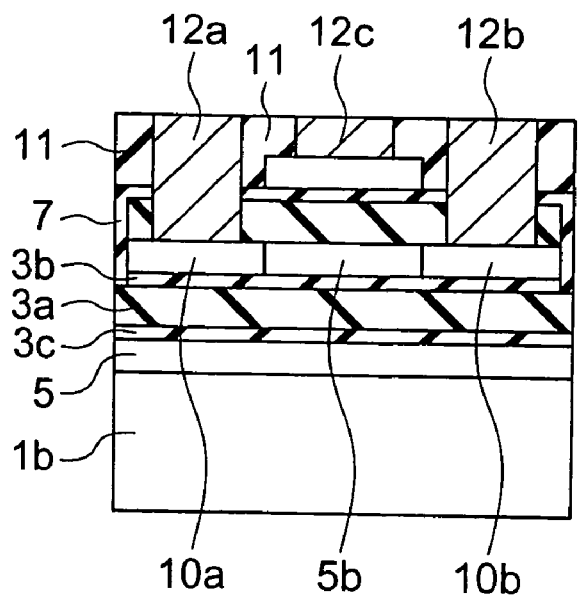

A method for manufacturing the n-MISFET according to this embodiment will next be described with reference to FIGS. 4A to 9C. FIGS. 4A to 4E are manufacturing step cross-sectional views taken along the line A-A of FIG. 1. FIGS. 5A to 5E are manufacturing step cross-sectional views corresponding to FIGS. 4A to 4E, respectively, and taken along the line B-B of FIG. 1. FIGS. 6A to 6E are manufacturing step cross-sectional views taken along the line A-A of FIG. 1. FIGS. 7A to 7E are manufacturing step cross-sectional views corresponding to FIGS. 6A to 6E, respectively, and taken along the line B-B of FIG. 1. FIGS. 8A to 8C are manufacturing step cross-sectional views taken along the line A-A of FIG. 1. FIGS. 9A to 9C are manufacturing step cross-sectional views corresponding to FIGS. 8A to 8C, respectively, and taken along the line B-B of FIG. 1.

First, hydrogen ions, for example, are implanted into an Si substrate $1a$ having (001) surface orientation at an energy of a dosage of $5 \times 10^{16}/cm^2$ and a peak range of, for example, a 50-nanometer depth from a surface, thereby forming a high hydrogen concentration region.

To recover the Si substrate $1a$ from a damage caused by the ion implantation, the Si substrate $1a$ is subjected to a heat treatment in a hydrogen atmosphere at 800° C. for 30 minutes, for example. By subjecting the Si substrate $1a$ to the heat treatment, the substrate $1a$ is recovered from the damage, an intermediate layer 2 having a lower mechanical strength than that of surroundings of the intermediate layer 2 is formed in the high hydrogen concentration region. At the same time, an Si layer $5a$ to serve as the channel region is formed (see FIGS. 4A and 5A). Microscopic vacancies are continuously formed in the intermediate layer 2, so that the intermediate layer has the lower mechanical strength. This can facilitate peeling off the intermediate layer 2 in a later step.

A depleted hydrofluoric acid treatment is carried out to terminate a surface of the Si substrate $1a$ by hydrogen. The resultant substrate $1a$ is introduced into an electron beam evaporations system. While a substrate temperature is set at, for example, 500° C. and $Pr_6O_{11}$ is used as an evaporation source, a metal oxide $Pr_2O_3$ is evaporated by a thickness of, for example, five nanometers, thereby forming a $Pr_2O_3$ layer (see FIGS. 4B and 5B). At this time, Si on a $Pr_2O_3$ layer $3a$-side interface of the Si layer $5a$ is oxidized, and an $SiO_2$ layer $3b$ having a thickness of 0.5 nanometer is formed between the Si layer $5a$ and the metal oxide $Pr_2O_3$ layer $3a$. Further, in this embodiment, an oxygen partial pressure is precisely controlled to $1 \times 10^{-7}$ Torr, thereby improving an orientation degree of the metal oxide $Pr_2O_3$ and improving a crystallinity thereof. In addition, an X-ray diffraction evaluation indicates that the $Pr_2O_3$ layer $3a$ is an epitaxial layer oriented in a direction of (001) surface orientation, and that a lattice distance of $Pr_2O_3$ in a direction parallel to an interface between the $SiO_2$ layer $3b$ and the $Pr_2O_3$ layer $3a$, i.e., in the direction of (001) surface orientation is 5.52 angstroms. The lattice distance of 5.52 angstroms is larger by 1.7% than the lattice distance of Si in the direction of (001) surface orientation. The X-ray diffraction evaluation also indicates that a half-value width of the X-ray diffraction is narrow, and that the insulating film 3 consisting of $Pr_2O_3$ is a film strongly oriented in the direction of (001) surface orientation and having a high crystallinity.

An Si layer 5 having a thickness of, for example, one micrometer is formed by a chemical vapor deposition (CVD) method. At this time, Si on a $Pr_2O_3$ layer $3a$-side interface of the Si layer 5 is oxidized, and an $SiO_2$ layer $3c$ having a thickness of 0.5 nanometer is formed between the Si layer 5 and the $Pr_2O_3$ layer $3a$. Namely, with this manufacturing method, the insulating film having a three-layer structure composed by the $SiO_2$ layer $3b$ having a thickness of 0.5 nanometer, the $Pr_2O_3$ layer $3a$ having a thickness of five nanometers, and the $SiO_2$ layer $3c$ having a thickness of 0.5 nanometer is formed between the Si layer $5a$ and the Si layer 5 (see FIGS. 4C and 5C).

Figure 4A:
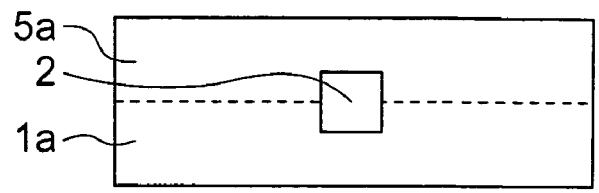
FIGS. 4A to 4E are cross-sectional views which depict manufacturing steps of a method for manufacturing the FET according to the first embodiment.
Figure 4B:
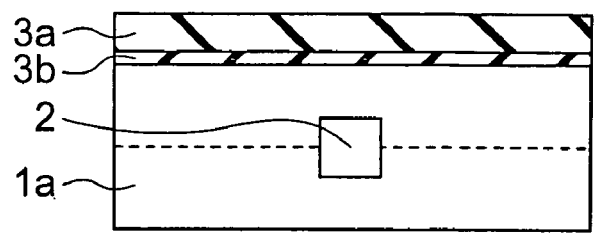
Figure 4C:
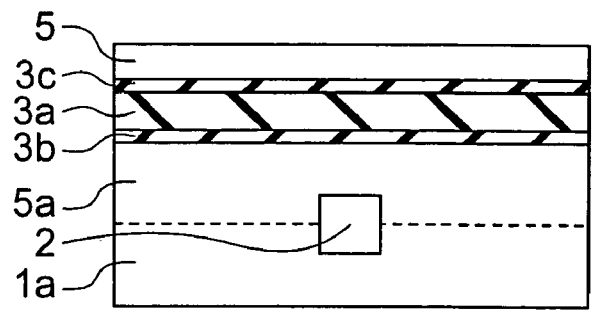
Figure 4D:
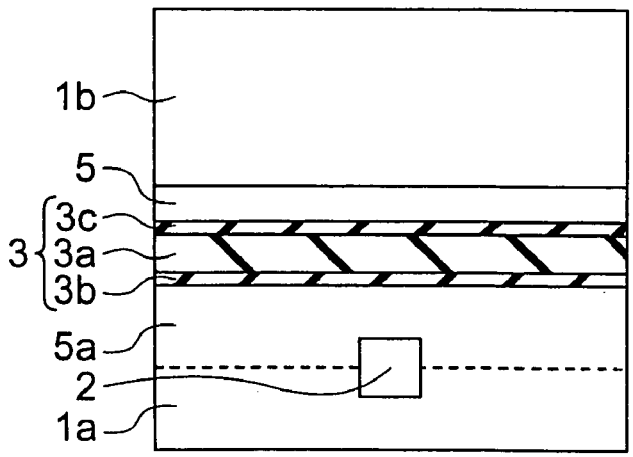
Figure 4E:
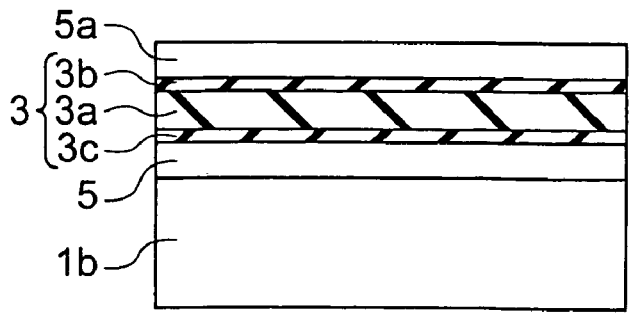
Figure 5A:
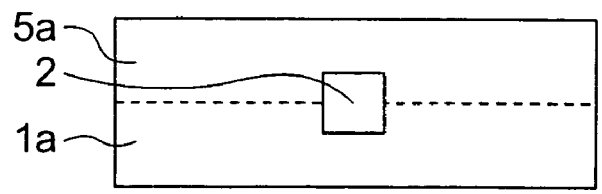
FIGS. 5A to 5E are cross-sectional views which depict manufacturing steps of the method for manufacturing the FET according to the first embodiment.
Figure 5B:
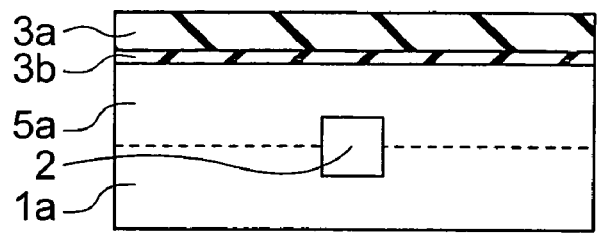
Figure 5C:
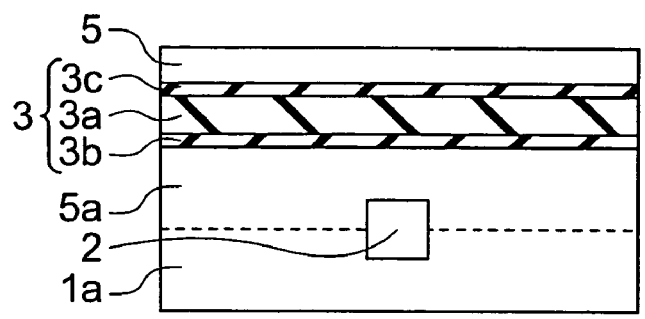
Figure 5D:
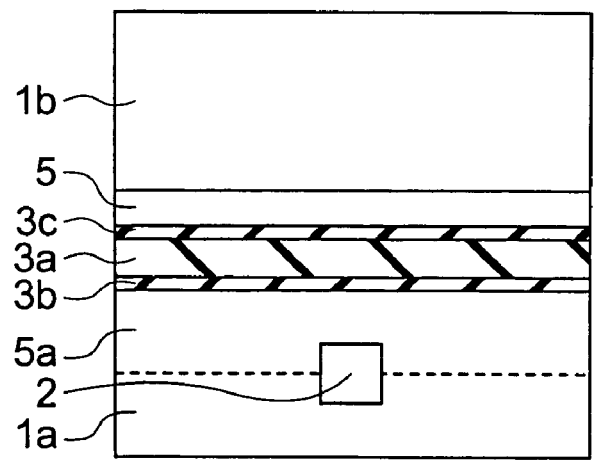
Figure 5E:
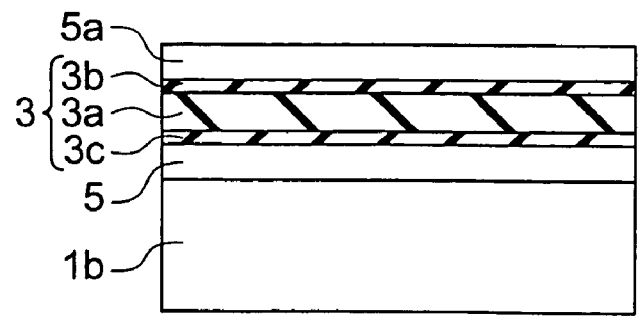

A surface of the Si layer 5 is bonded to the substrate $1b$ (see FIGS. 4D and 5D). Thereafter, the substrate $1b$ is peeled off with the intermediate layer 2 set as a boundary, thereby exposing the Si layer $5a$ onto the insulating film 3 consisting of the metal oxide $Pr_2O_3$. The exposed surface of the Si layer $5a$ is planarized by, for example, a chemical mechanical polishing (CMP) method (see FIGS. 4E and 5E).

Figure 6A:
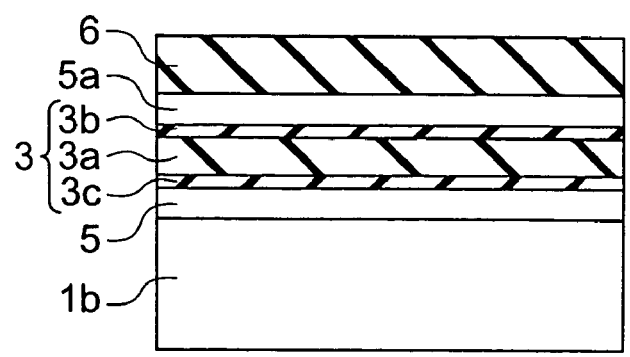
FIGS. 6A to 6E are cross-sectional views which depict manufacturing steps of the method for manufacturing the FET according to the first embodiment.
Figure 7A:
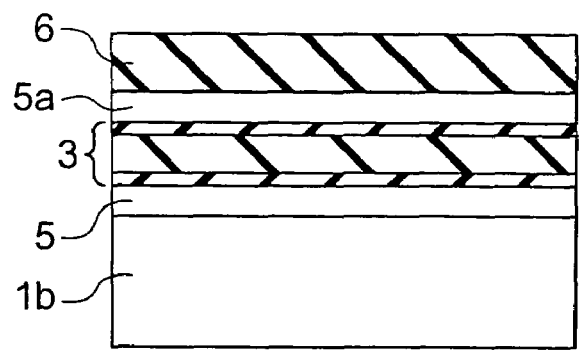
FIGS. 7A to 7E are cross-sectional views which depict manufacturing steps of the method for manufacturing the FET according to the first embodiment.

As shown in FIGS. 6A and 7A, $SiO_2$ having a thickness of 50 nanometers is coated on an entire surface of the Si layer $5a$, thereby forming an insulating film 6. An impurity profile can be then formed in the Si layer $5a$, to serve as the channel region, by implanting boron ions through the insulating film 6.

Figure 6B:
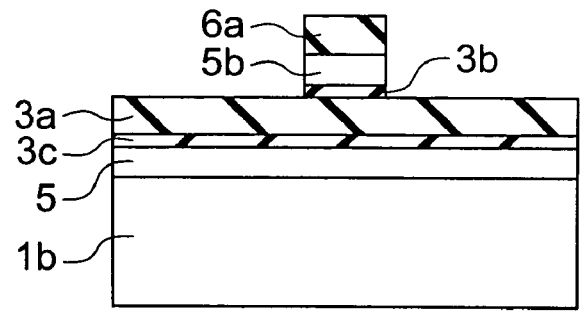
Figure 7B:
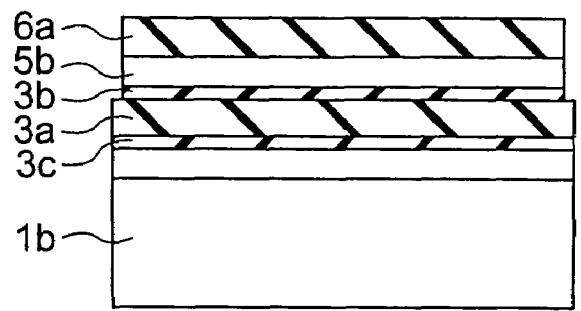

As shown in FIGS. 6B and 7B, the insulating film 6 and the Si layer $5a$ are patterned by an anisotropic etching method such as a reactive ion etching (RIE) method, thereby forming a channel region $5b$ and an insulating film $6a$. At the same time, the $SiO_2$ layer $3b$ formed between the $Pr_2O_3$ layer $3a$ and the Si layer $5a$ is patterned (see FIGS. 6B and 7B).

Figure 6C:
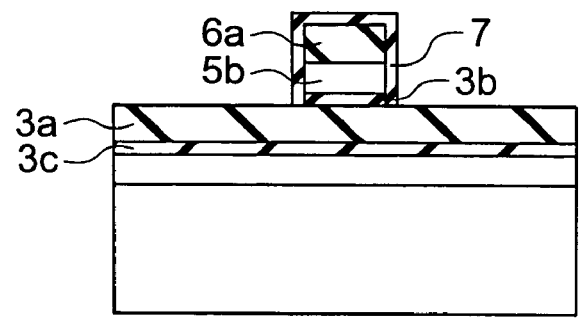
Figure 6D:
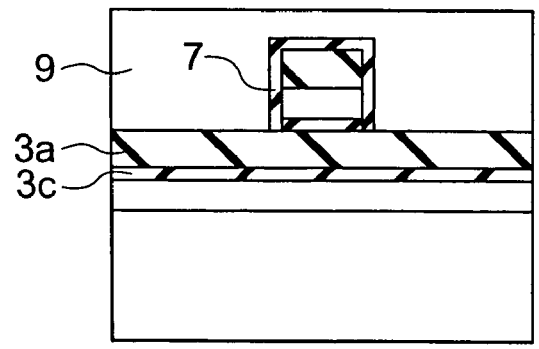
Figure 7C:
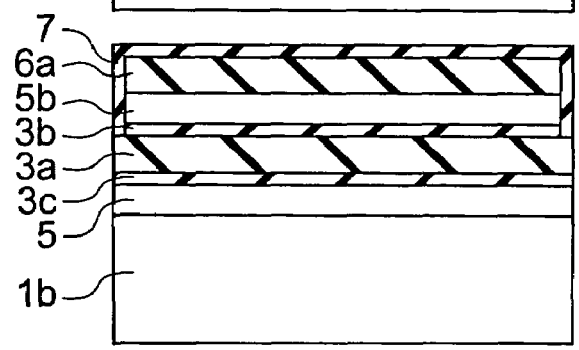

As shown in FIGS. 6C and 7C, a gate insulating film 7 having a thickness of three nanometers and consisting of $SiO_2$ is formed around the channel region $5b$. At this time, a height (gate width) of a Fin channel region is set at 20 nanometers, a Fin width (channel region width) is set at 20 nanometers, and a Fin length is set at 200 nanometers, for example. Next, a polysilicon film 9 serving as a gate electrode is deposited on entire surfaces of the $Pr_2O_3$ film $3a$ and the gate insulating film 7 by the CVD method (see FIGS. 6D and 7D).

Figure 6E:
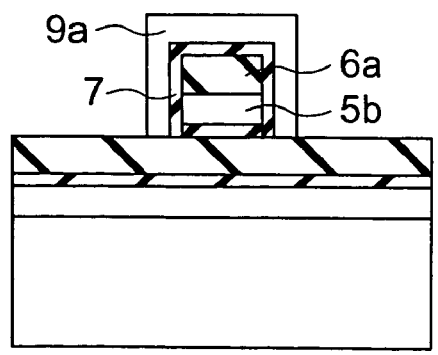
Figure 7D:
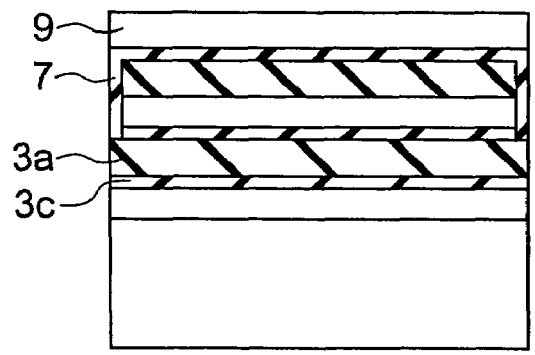
Figure 7E:
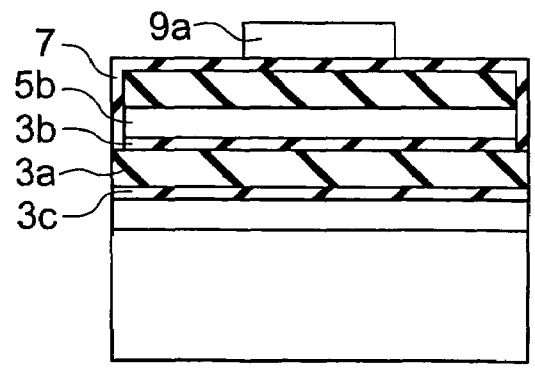

The polysilicon film 9 is patterned by the anisotropic etching method such as the RIE method, thereby forming a gate electrode $9a$ (see FIGS. 6E and 7E). Using the gate electrode $9a$ as a mask, ion implantation and a heat treatment are carried out, thereby forming the source and drain regions $10a$ and $10b$ doped with impurities (see FIGS. 8A and 9A). An interlayer insulating film 11 consisting of $SiO_2$ is deposited on entire surfaces of the $Pr_2O_3$ film $3a$ and the gate electrode $9a$ by the CVD Method (see FIGS. 8B and 9B).

As shown in FIGS. 8C and 9C, contact holes are formed on the source and drain regions $10a$ and $10b$, metal such as Al is evaporated to form a metal film on the entire surfaces, thereby forming source and drain electrodes $12a$ and $12b$. The Fin n-MISFET is thus completed.

Figure 10:
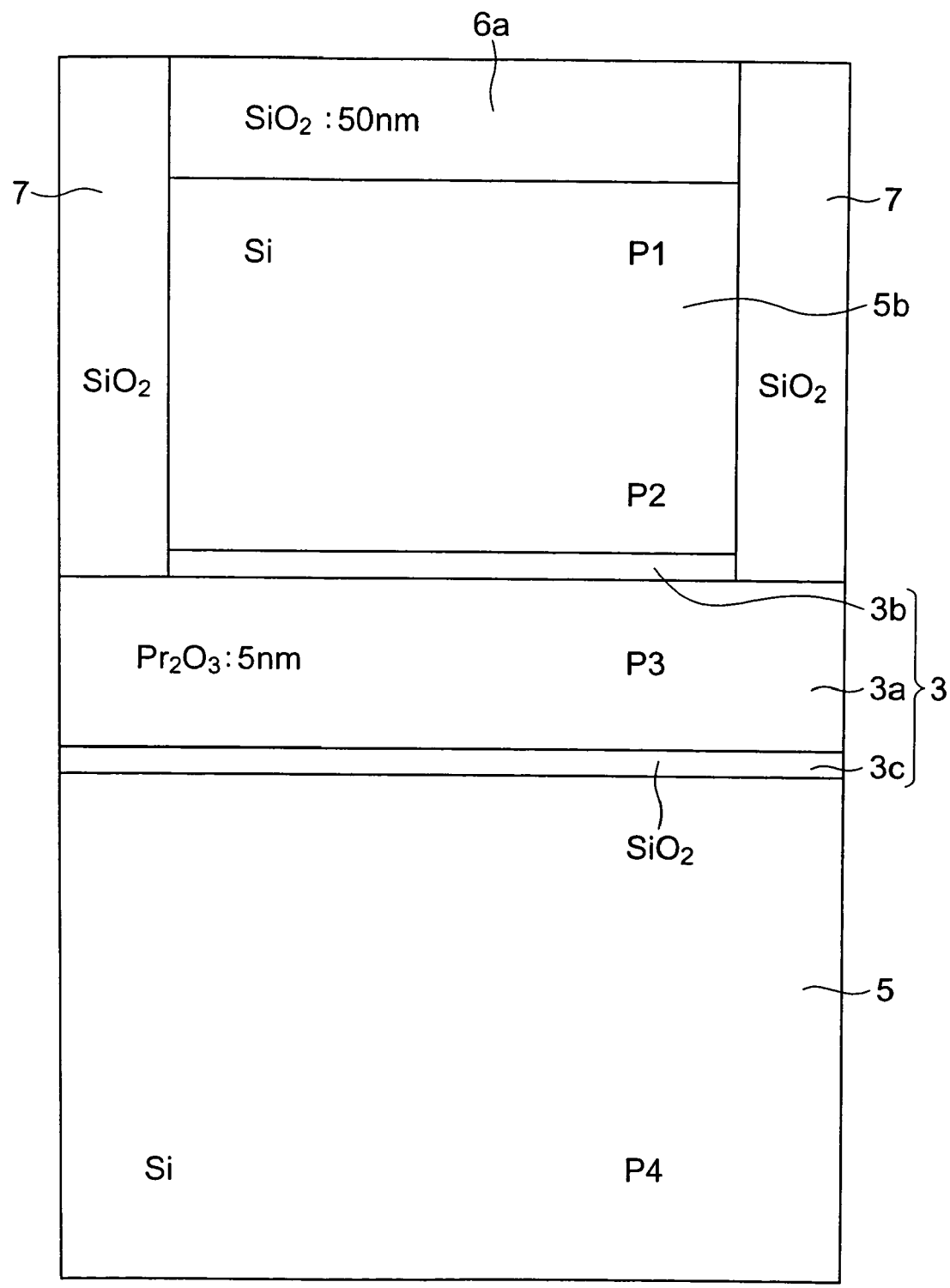
FIG. 10 is a typical view which depicts a cross section of $Pr_2O_3/SiO_2/Si$ interfaces of the FET according to the first embodiment.
Figure 11:
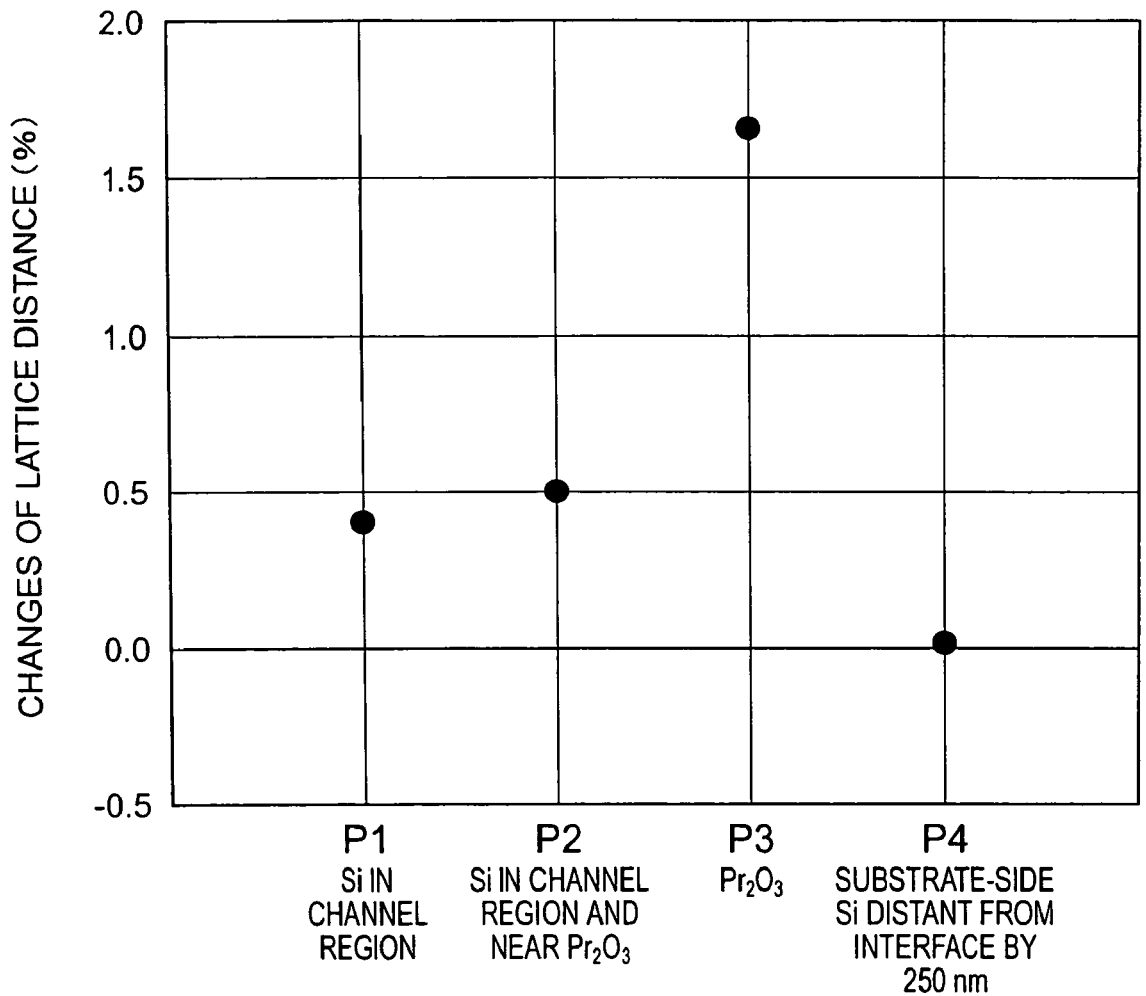
FIG. 11 is a chart which depicts changes of a lattice distance at predetermined positions of the FET according to the first embodiment.

Characteristics of the insulating film 3 of the Fin n-MISFET having the structure shown in FIGS. 4A to 9C will next be described in detail. Normally, even if a metal oxide used as an insulating film is crystalline, the lattice distance of the metal oxide does not influence Si of a channel layer. However, the inventors of the present application discovered that by forming the $Pr_2O_3$ layer $3a$ strongly oriented to (001) surface orientation and having high crystallinity, the tensile stress is applied to Si in the channel region in a channel direction and the lattice distance is changed. FIG. 10 is an enlarged view of the insulating film 3 and the channel region $5b$ in the n-MISFET having the structure shown in FIGS. 4A to 9C, and is a typical view which depicts a cross-sectional structure of the MISFET in the $Pr_2O_3$ layer 3a, the $SiO_2$ layers 3b and 3c, and the channel region 5b. FIG. 11 depicts changes of the lattice distance obtained from an electron beam diffraction image measured using a transparent electron microscope (hereinafter, "TEM").

The lattice distance measured herein is that in a direction parallel to the interface. As shown in FIG. 10, measurement points are a point P1 of Si in the channel region 5b distant from the interface between the $Pr_2O_3$ layer 3a/$SiO_2$ layer 3b and the Si layer 5b by 20 nanometers, a position P2 of Si near the interface between the $Pr_2O_3$ layer 3a/$SiO_2$ layer 3b and the Si layer 5b, a position P3 in the $Pr_2O_3$ layer 3a, and a position P4 of Si in the substrate 5 distant from the interface between the $Pr_2O_3$ layer 3a/$SiO_2$ layer 3c and the Si layer 5 by 250 nanometers. In FIG. 11, the vertical axis indicates changes of the lattice distance at the respective measurement points with reference to the lattice distance of Si in the substrate 5 distant from the interface between the $Pr_2O_3$ layer 3a/$SiO_2$ layer 3c and the Si layer 5 by 250 nanometers, that is, with reference to the lattice distance at the position P4.

A lattice distance change of the $Pr_2O_3$ layer is +1.7%, which coincides with a result obtained from the X-ray diffraction. Further, Si on the interface is strained in the form in which Si is pulled by this $Pr_2O_3$ layer 3a, and a lattice distance change at the position P2 near the interface between the $Pr_2O_3$ layer 3a/$SiO_2$ layer 3b and the Si layer 5 is +0.5%. The position P1 of Si in the channel region 5b distant by 20 nanometers from the interface between the $Pr_2O_3$ layer 3a/$SiO_2$ layer 3b and the Si layer 5 undergoes a lattice distance change, and the lattice distance is widened by +0.4%.

This result shows that if the insulating film consisting of the high crystalline metal oxide different in lattice distance from Si is used as a underlying insulating film of the channel region 5b, the lattice distance of the Si layer in the channel region can be changed. The reason is considered as follows. By improving the crystallinity of the metal oxide, an elastic constant of the metal oxide is increased, that is, crystals of the metal oxide are hardened qualitatively. Due to this, the lattice distance of the metal oxide greatly influences Si, so that a lattice deformation occurs even to the channel region 5b distant from the interface by 20 nanometers.

Figure 12:
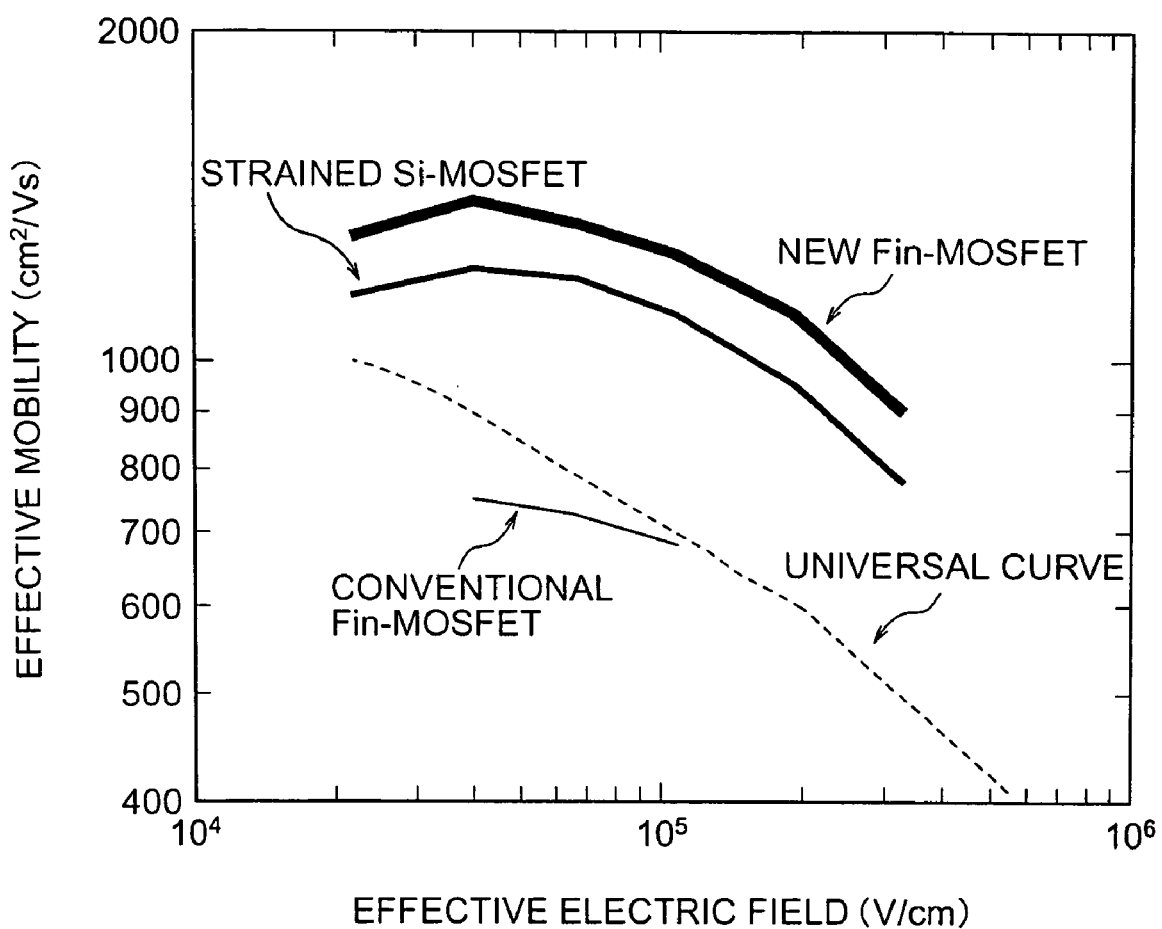
FIG. 12 is a characteristic chart which depicts the relationship between an effective electric field and an electron mobility of the FET according to the first embodiment and that of an FET according to a comparison example.
Figure 13:
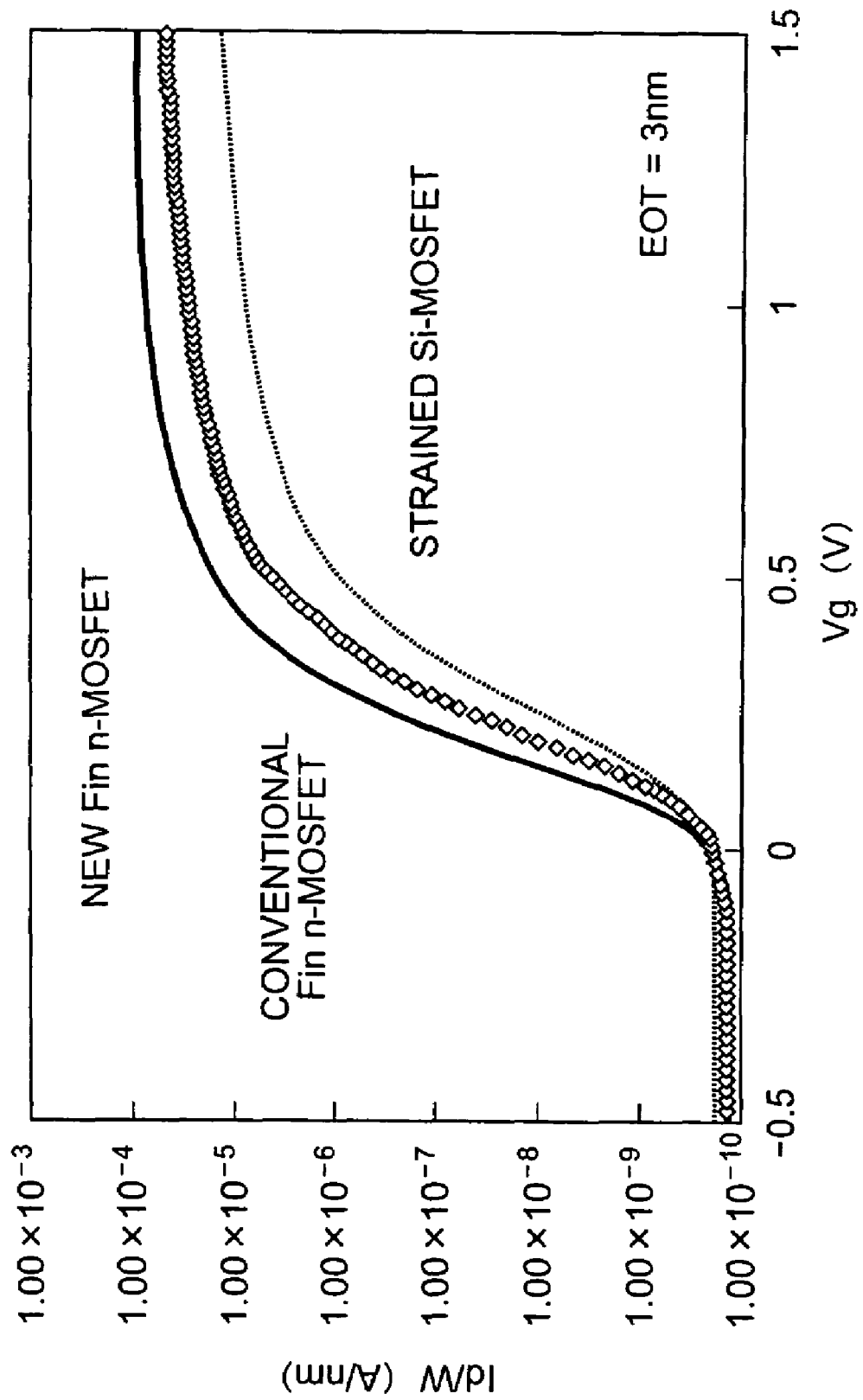
FIG. 13 is a characteristic chart which depicts the relationship between a gate voltage and a ratio of a channel width to a drain current of the FET according to the first embodiment and that of the FET according to the comparison example.

Next, characteristics of a new Fin n-MISFET in which the crystalline $Pr_2O_3$ layer 3 different in lattice distance from Si is used as the underlying insulating film according to the first embodiment, a conventional Fin n-MISFET in which the $SiO_2$ film is used as the underlying insulating film, and a strained Si n-MISFET using SiGe will be described with reference to FIGS. 12 and 13. It is noted that a strain of the strained Si n-MISFET and that of the new Fin n-MISFET are set equal. FIG. 12 is a characteristic chart which depicts the relationship between an effective electric field and an effective mobility of electrons. FIG. 13 is a characteristic chart which depicts the relationship between a gate voltage Vg and Id/w (a ratio of a drain current Id to a channel width w). The "effective electric field" means an electric field actually applied to the insulating film. The "effective mobility" means a mobility of carriers (electrons in this embodiment) when the effective electric field is applied to the insulating film.

Attention will be first paid to the relationship between the effective electric field and the electron mobility shown in FIG. 12. In FIG. 12, a broken line indicates a universal curve, a solid line (a thin line) indicates a characteristic curve of the conventional Fin n-MISFET having the $SiO_2$ film used as the underlying insulating film, a solid line (an intermediate thick line) indicates a characteristic curve using SiGe and having a Ge concentration of 13% of the strained Si n-MISFET having the $Pr_2O_3$ layer used as the underlying insulating film, and a solid line (a thick line) indicates a characteristic curve of the new Fin n-MISFET having the $Pr_2O_3$ layer used as the underlying insulating film. The universal curve is a curve that shows the relationship between the effective electric field and the effective mobility if the gate insulating film of an ordinary flat MISFET other than the Fin MISFET is the $SiO_2$ film.

As is obvious from FIG. 12, the mobility of the conventional Fin n-MISFET having the $SiO_2$ film used as the underlying insulating film is lower than that of the universal curve. This is because the channel region is applied with the compressive strain from the underlying $SiO_2$ film, an effective mass of electrons is heavier, and the mobility is thereby lowered. On the other hand in strained Si n-MISFET introducing the applying the tensile strain into the channel region the mobility is higher than that of the universal curve. The mobility of the new Fin n-MISFET having the $Pr_2O_3$ layer used as the underlying insulating film is far higher than that of the conventional Fin n-MISFET having the $SiO_2$ film used as the underlying insulating film. Besides, despite the equal strain, the mobility of the new Fin n-MISFET is higher than that of the strained Si n-MISFET. This is because the channel region is free from the compression strain caused by the $SiO_2$ film by using the metal oxide layer as the underlying insulating film, and the carrier scattering caused by Ge and pass-through dislocation can be avoided.

Attention will be next paid to the relationship between the gate voltage Vg and Id/w shown in FIG. 13. By applying the tensile strain into the channel region, the Id/w ratio of the new Fin n-MISFET is improved, i.e., twice or more as high as that of the strained Si n-MISFET. This is because the carrier scattering caused by Ge and pass-through dislocation can be avoided and the mobility can be improved by not only forming the Fin channel but also using the metal oxide layer as the underlying insulating film.

As described so far in detail, according to the first embodiment, differently from the strained Si n-MISFET using the SGOI substrate, the carrier scattering caused by Ge does not occur. Therefore, even with the same strain, the electron mobility can be improved. Furthermore, the disadvantage of the conventional Fin FET using the $SiO_2$ film as the underlying insulating film, that is, the disadvantage of the deterioration of the electron mobility can be solved. Therefore, the advantageous character of the Fin FET in which the Id can be doubled can be made use of, and it is thereby possible to realize the Id/w ratio twice or more as high as that of the strained Si MISFET.

Second Embodiment

A p-MISFET according to a second embodiment of the present invention will be described. The p-MISFET according to the second embodiment is constituted so that a metal oxide film smaller than Si in lattice distance, e.g., $Dy_2O_3$ is used so as to apply a compressive stress to SI in a channel region. Namely, in the p-MISFET according to the second embodiment, the metal oxide film that constitutes the insulating film 3 is $Dy_2O_3$ in place of $Pr_2O_3$, and the channel region 5b has an n conduction type and the source region 10a and the drain region 10b have p conduction type, as compared with the n-MISFET according to the first embodiment. A manufacturing method for the p-MISFET is substantially equal to the method shown in FIGS. 4A to 9C. In this embodiment, the metal oxide film consisting of $Dy_2O_3$ is formed by the electron beam evaporation method. In the p-MISFET according to the second embodiment, similarly to the first embodiment, the insulating film 3 is a layer structure in which a $Dy_2O_3$ layer having a thickness of 5 nanometers is put between $SiO_2$ layers each having a thickness of 0.5 nanometers. Similarly to the first embodiment, an oxygen partial pressure is precisely controlled to $1×10^{-7}$ Torr during formation of the $Dy_2O_3$ layer, thereby improving an orientation degree of the $Dy_2O_3$ layer and improving a crystallinity thereof.

An X-ray diffraction evaluation indicates that the $Dy_2O_3$ layer is an epitaxial layer oriented in the direction of (001) surface orientation, and that a lattice distance of $Dy_2O_3$ in a direction parallel to an interface between Si and $Pr_2O_3$, i.e., in the direction of (001) surface orientation is 5.33 angstroms. The lattice distance of 5.33 angstroms is smaller by 1.8% than the lattice distance of Si in the direction of (001) surface orientation. The X-ray diffraction evaluation also indicates that a half-value width of the X-ray diffraction is narrow, and that the $Dy_2O_3$ layer is a film strongly oriented in the direction of (001) surface orientation and having a high crystallinity. A result of a lattice distance evaluation using the electron beam diffraction indicates that if the $Dy_2O_3$ layer strongly oriented in the direction of (001) surface orientation and having the high crystallinity, the compressive stress is applied to Si in the channel region and the lattice distance is narrowed.

A lattice distance change of the $Dy_2O_3$ layer parallel to the interface with Si, that is, in the direction of (001) surface orientation is −1.8%, Si on the interface is strained following this $Dy_2O_3$ layer, and a lattice distance change of the $Dy_2O_3$ layer parallel to the interface is −0.5%. Even Si distant from the interface by 20 nanometers undergoes a lattice distance change of −0.4%. This result shows that if the insulating film consisting of the metal oxide film smaller in lattice distance than Si and high in crystallinity is used as a gate insulating film, the lattice distance of the Si layer in the channel region can be narrowed.

Figure 14:
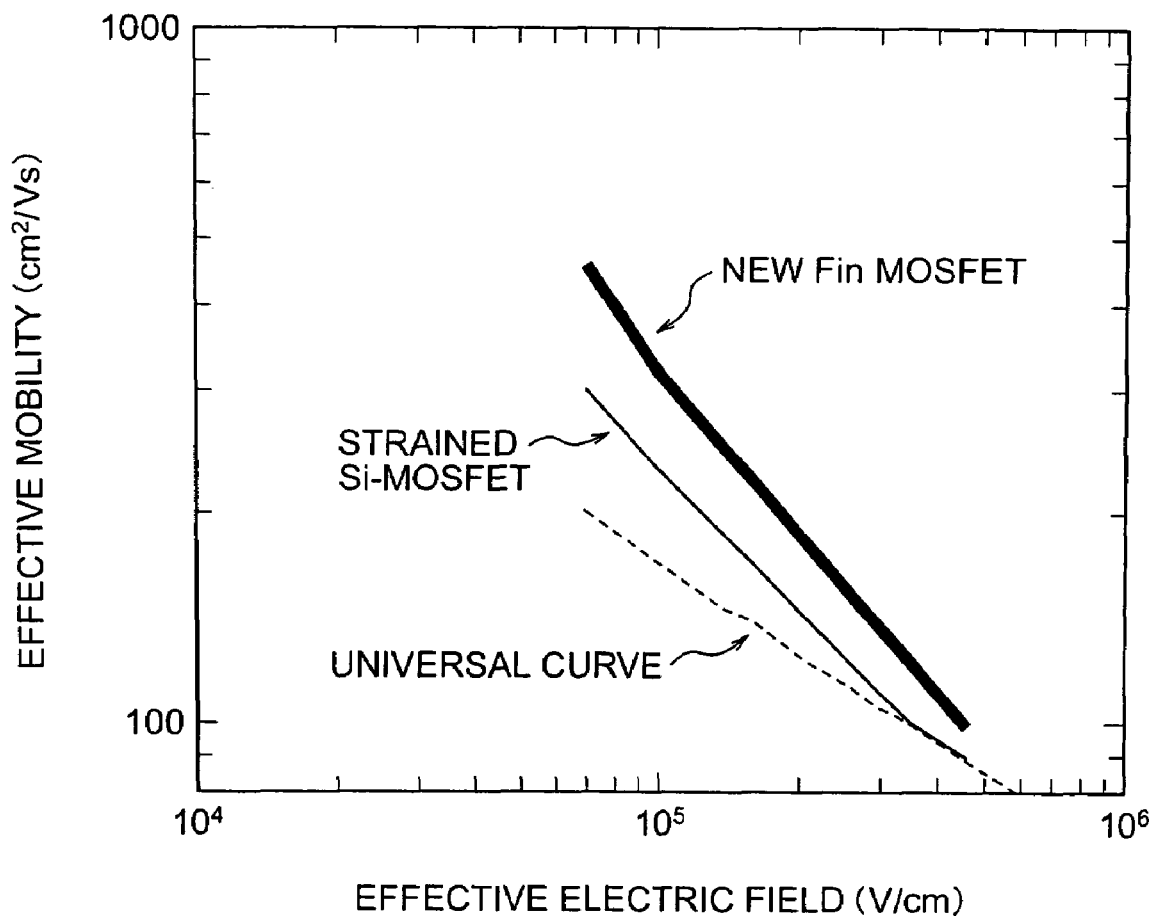
FIG. 14 is a characteristic chart which depicts the relationship between an effective electric field and a hold mobility of a new Fin FET according to a second embodiment of the present invention and that according to the comparison example.

Next, characteristics of a Fin p-MOSFET having the $Dy_2O_3$ different in lattice distance from Si used as a underlying insulating film according to the second embodiment and a strained Si p-MOSFET using SiGe will be described with reference to FIG. 14. FIG. 14 is a characteristic chart which depicts the relationship between an effective electric field and an effective mobility of holes. In FIG. 14, a broken line indicates a universal curve, a solid line (a thin line) indicates a characteristic curve of the strained Si p-MOSFET using SiGe and having a Ge concentration of 13%, and a solid line (a thick line) indicates a characteristic curve of the new Fin p-MOSFET having $Dy_2O_3$ layer used as a underlying insulating film.

As is obvious from FIG. 14, the mobility of the strained Si p-MOSFET in which a tensile strain is introduced into the channel region is higher than that of the universal curve. Therefore, the strained Si p-MOSFET exhibits an effect of introducing the tensile stress. The new Fin p-MOSFET having the $Dy_2O_3$ layer applied with a compressive strain and used as the underlying insulating film exhibits a greater effect than the strained Si p-MOSFET. This is because by using the metal oxide smaller in lattice distance than Si as the underlying insulating film, the compressive strain can be introduced into the channel region, an effective mass of holes is lighter than that if the tensile strain is introduced, and scattering caused by Ge can be avoided.

As described above in detail, according to this embodiment, the compressive strain can be applied to the channel region, so that the hole mobility can be improved more effectively than the strained Si transistor using SiGe.

According to this embodiment, by using the insulating film consisting of the metal oxide different in lattice distance from Si as a buried insulating film, both the tensile strain and the compressive strain can be applied to the channel region. Due to this, the Fin transistor characteristics of the p-MISFET, i.e., the driving force can be greatly improved similarly to the n-MISFET.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of Si. If the rare-earth oxide containing at least one selected from Ce, Dy, Y, La, Pr and Gd is used, in particular, a film having a high crystallinity scan be realized and a particularly excellent effect can be obtained.

The first and the second embodiments have been described while referring to the instances of using $Pr_2O_3$ and $Dy_2O_3$ as the crystalline metal oxides, respectively. Alternatively, the crystalline metal oxide may be an oxide having a perovskite structure such as $SrTiO_3$, $SrZrO_3$, $Sr(TiZr)O_3$, or $SrCeO_3$. Further, an oxide having a rock-salt structure such as MgO, CaO, SrO or BaO, $Al_2O_3$, or $MgAl_2O_4$ having a spinel structure exhibits an equivalent effect. The crystalline metal oxide having crystal orientation has been used in the first and the second embodiments. If a monocrystalline metal oxide film having uniform orientation is used, a larger lattice distance change occurs. As the film formation method for the crystalline metal oxide, the electron beam evaporation method has been used. Alternatively, the other film formation method such as the CVD method, the sputtering method, or a molecular beam epitaxy (MBE) method may be used.

The selection of one of the crystalline metal oxides stated above depends on whether the tensile stress or the compressive stress is to be applied to Si. If the n-MISFET is manufactured, the electron mobility is improved in Si applied with the tensile stress. Therefore, one of the metal oxides larger in lattice distance than Si may be selected. If the p-MISFET is manufactured, the hole mobility of the p-MISFET can be improved whether the tensile stress or the compressive stress. Therefore, one of the metal oxides different in lattice distance from Si may be selected. In addition, depending on the stress to be applied to Si, the lattice distance of the metal oxide may be selected. If a desired lattice distance and a desired stress cannot be achieved by the metal oxide consisting only of one metal element, a metal oxide consisting of two or more metal elements may be used. For example, by using $(Eu_xDy_{1-x})_2O_3$ containing two metal elements of Eu and Dy, the lattice distance change of the metal oxide relative to Si can be arbitrarily varied in a range between zero to −1.8%.

Third Embodiment

An n-MISFET according to a third embodiment of the present invention will be described. In this embodiment, a metal oxide having an oxygen blending ratio lower than a stoichiometric ratio, e.g., a Ce oxide is used so as to apply a tensile stress to Si in a channel region. Namely, the n-MISFET according to this embodiment is constituted so that the metal oxide film that constitutes an insulating film 3 is the Ce oxide in place of $Pr_2O_3$, as compared with the n-MISFET according to the first embodiment shown in FIGS. 1 to 9C. In this embodiment, the insulating film 3 is composed by a single Ce oxide layer as will be described later. A method for manufacturing the n-MISFET according to this embodiment is substantially equal to the method shown in FIGS. 4A to 9C.

A substrate consisting of Si having (111) surface orientation is used. The Ce oxide is formed by the MBE method.

After an Si surface in the channel region is subjected to a depleted hydrofluoric acid treatment to terminate a surface of the Si substrate by hydrogen, the Si substrate is introduced into an MBE system. While a substrate temperature is set at, for example, 700° C. and Ce is used as an evaporation source, Ce is evaporated to form a 0.6 monolayer. Thereafter, an ozone $O_3$ gas or an oxygen gas is supplied, thereby forming an insulating film consisting of the Ce oxide and having a thickness of five nanometers. An oxygen partial pressure during film formation is controlled to $1 \times 10^{-8}$ Torr. By using this film formation method, the monocrystalline Ce oxide film directly bonded to Si and oriented in a direction of (111) surface orientation can be epitaxially grown without forming an amorphous layer such as an $SiO_2$ layer on an interface. The inventors of the present invention already made a report that a very thin gate insulating film can be realized using this method (see Y. Nishikawa et al., "Ext. Abst. Inter. Conf. on Solid State Devices and Materials", Tokyo, p. 174, 2001).

Figure 15:
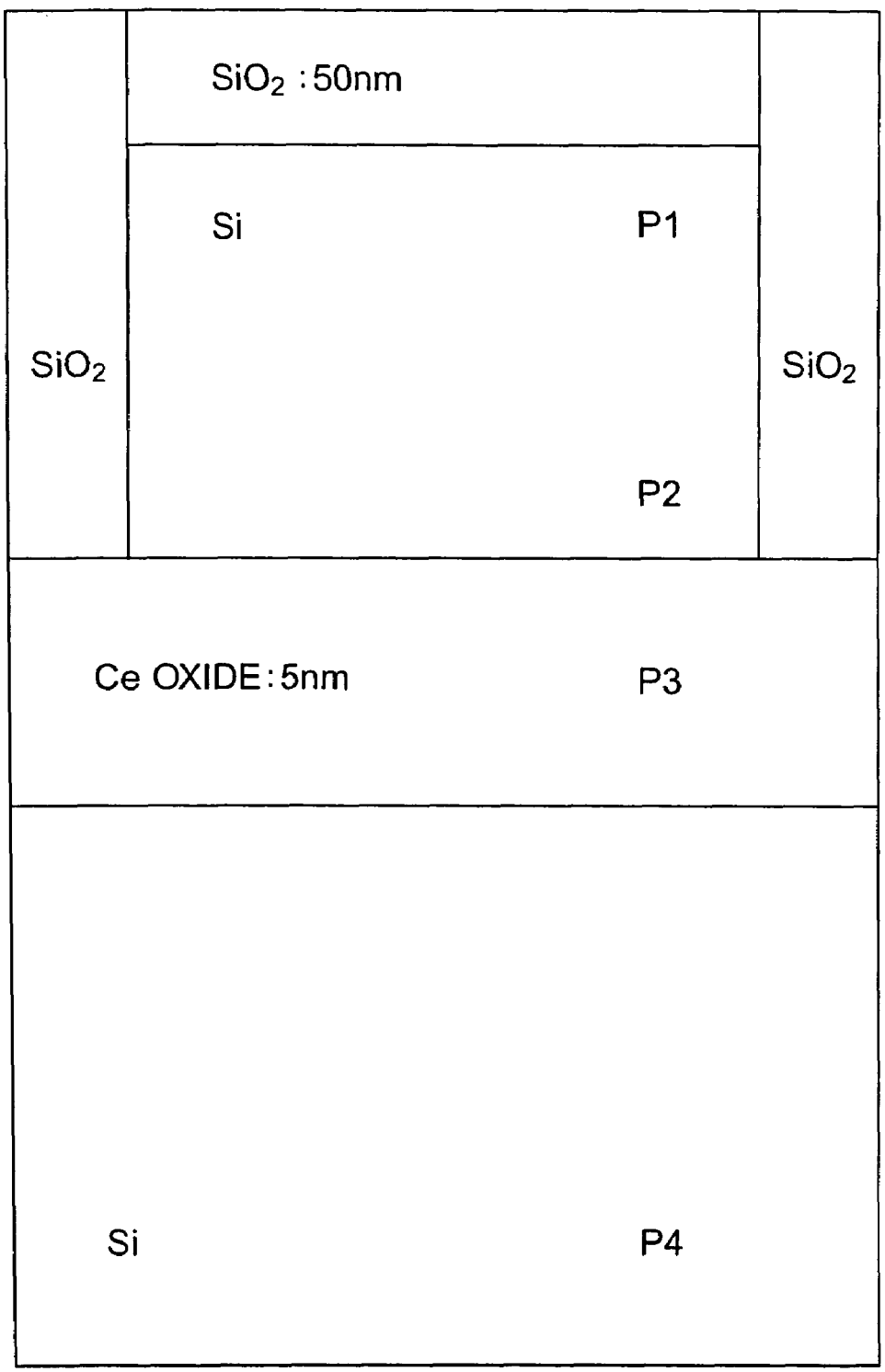
FIG. 15 depicts measurement positions of a Ce oxide/Si interface according to a third embodiment of the present invention.
Figure 16:
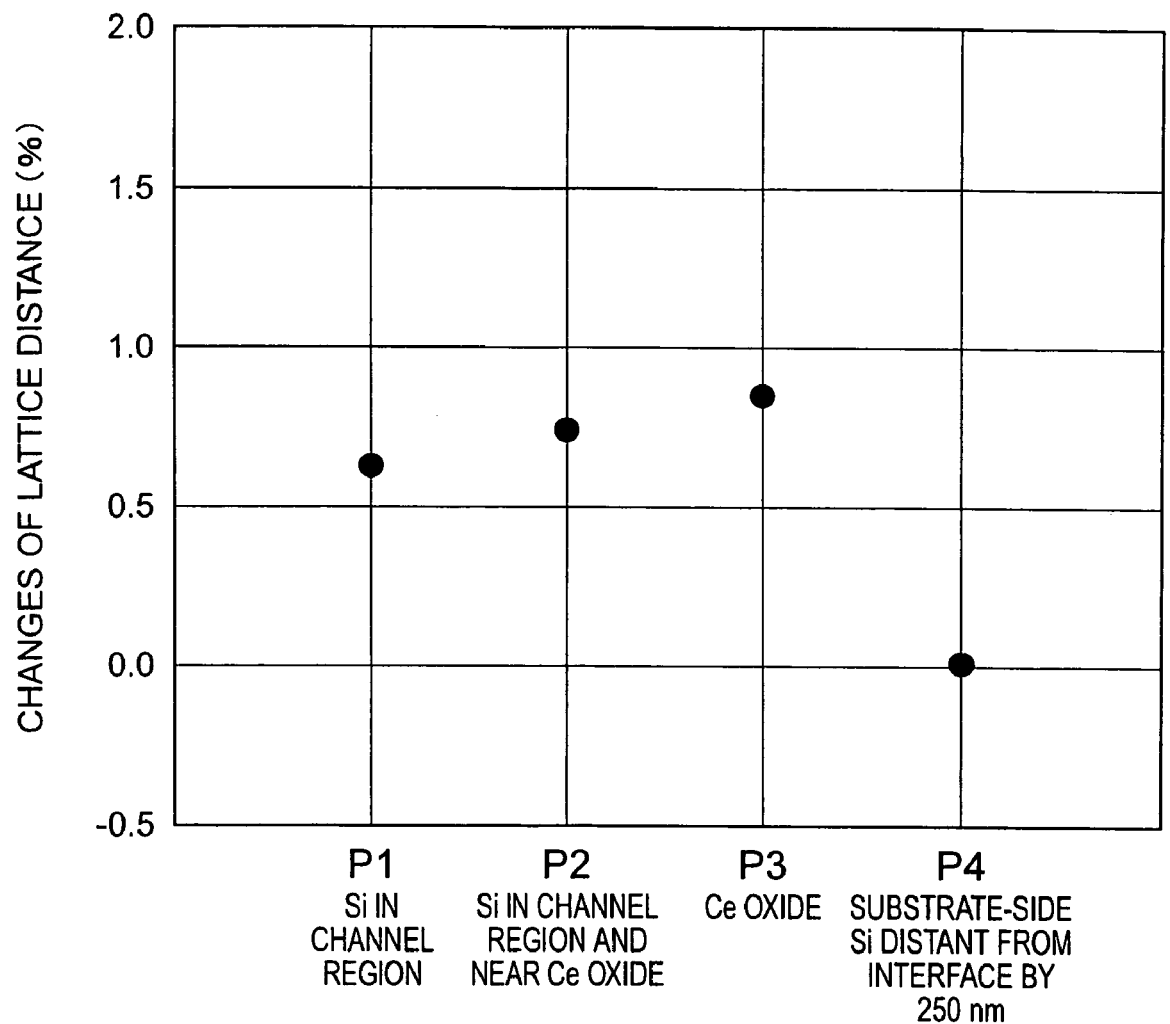
FIG. 16 is a chart that depicts changes of a lattice distance at the measurement positions shown in FIG. 15.

Characteristics of the gate insulating film of the n-MISFET according to the third embodiment will next be described in detail with reference to FIGS. 15 and 16. The n-MISFET according to this embodiment is constituted so that the insulating film 3 consists of the Ce oxide, as compared with the first embodiment. FIG. 15 is an enlarged view of the insulating film consisting of the Ce oxide and the channel region, and a typical view of a cross-sectional structure of the insulating film consisting of the Ce oxide and of the channel region. FIG. 16 depicts changes of the lattice distance obtained from the electron beam diffraction image measured by the TEM. The lattice distance measured herein is that in a direction parallel to the interface. As shown in FIG. 15, measurement points are a point P1 of Si in the channel region distant from the interface between the insulating film consisting of the Ce oxide and Si by 20 nanometers, a position P2 of Si near the interface between the Ce oxide serving as a first insulating film and Si, a position P3 of the Ce oxide serving as the first insulating film, and a position P4 of substrate-side Si distant from the interface by 250 nanometers.

In FIG. 16, changes of the lattice distance at the respective measurement points with reference to the lattice distance of substrate-side Si distant from the interface by 250 nanometers, that is, with reference to the lattice distance at the position P4. The lattice distance of the Ce oxide at the position P3 is larger than Si by about +0.8%. Following this, Si in the channel region near the interface between the Ce oxide and Si at the position P2 is strained by +0.75%. I addition, Si in the channel region distant from the interface between the Ce oxide as the first insulating film and Si by 20 nanometers at the position P1 undergoes a lattice distance change, which is as large as +0.65%. Since $CeO_2$ is directly bonded to Si and the difference in lattice distance influences the Si layer more directly, the Si layer is largely strained and has the lattice distance change is increased to be substantially equal to that of the $CeO_2$ layer.

Figure 17:
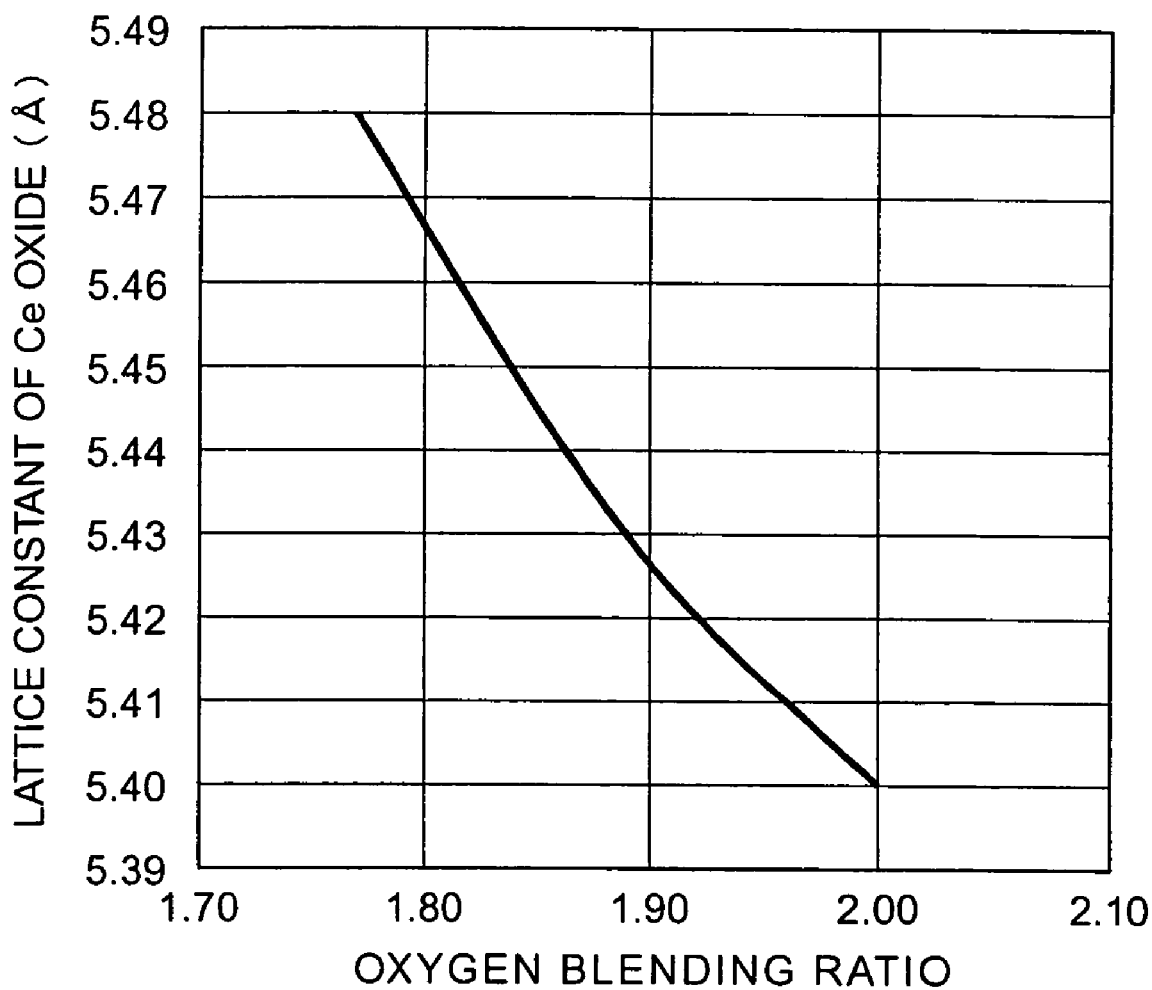
FIG. 17 is a chart that depicts the relationship between a blending ratio of metal to oxygen and a lattice distance of a Ce oxide of the FET according to the third embodiment.

The lattice distance of $CeO_2$ that is a bulky Ce oxide is reported as 5.411 angstroms. As compared with the lattice distance of Si (5.430 angstroms), the lattice distance of $CeO_2$ must be small. However, according to an experimental result of the inventors of the present invention, the lattice distance of $CeO_2$ is completely opposite to the reported lattice distance of $CeO_2$, and the Ce oxide is larger in lattice distance than Si as shown in FIG. 16. The inventors of the present invention considered causes for this experimental result in detail. As a result, the inventors obtained a new knowledge that if the oxygen blending ratio of the Ce oxide changes, the lattice distance changes, accordingly. FIG. 17 depicts the relationship between the oxygen blending ratio and the lattice distance of the Ce oxide (CeOx). The oxygen blending ratio is measured by energy-dispersive X-ray fluorescent spectroscopy (EDX). When the oxygen blending ratio is the stoichiometric ratio (x=2.0), the lattice distance is 5.411 angstroms, which coincides with the reported lattice distance of the Ce oxide ($CeO_2$).

Figure 18:
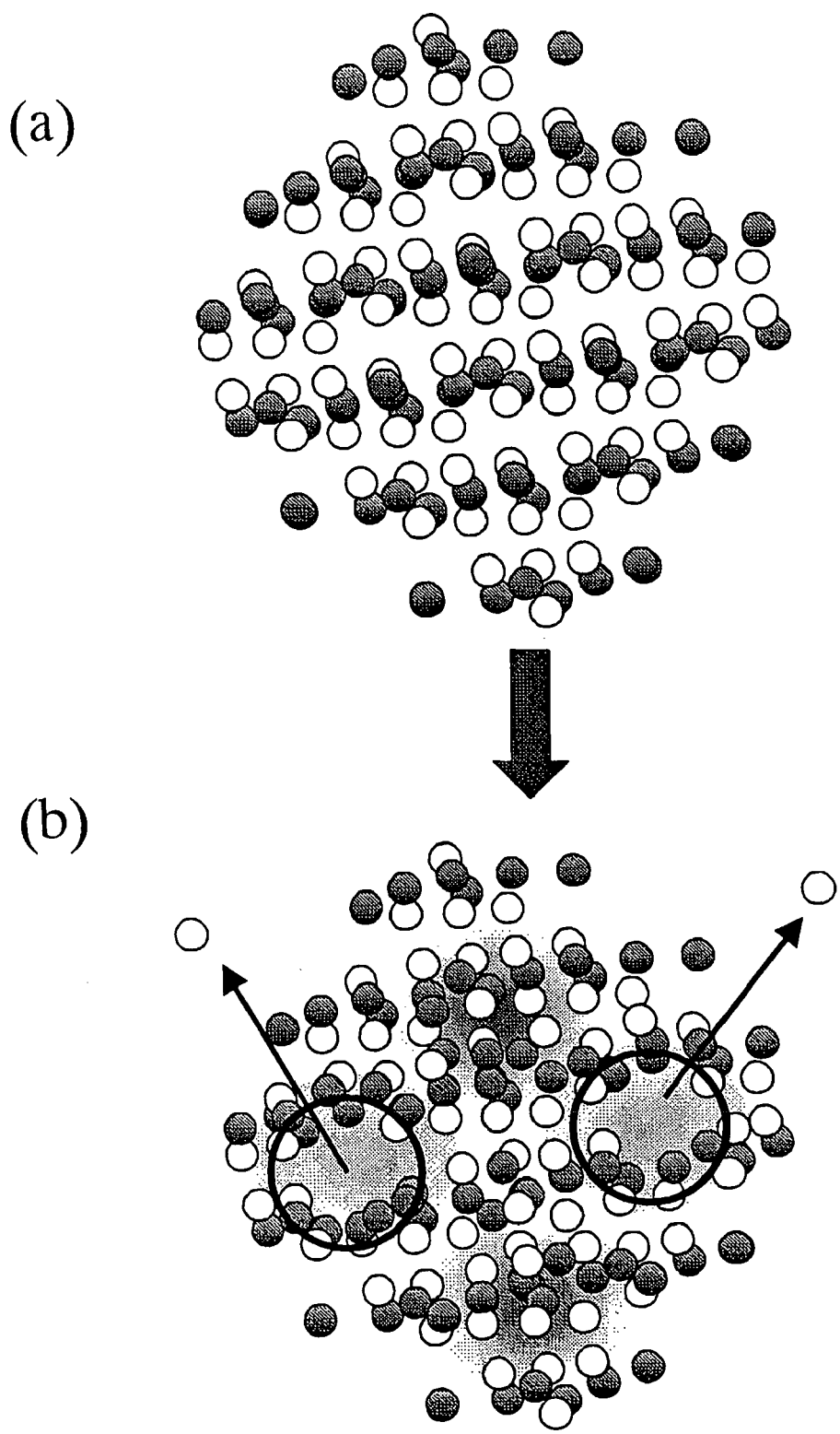
FIGS. 18(a) and 18(b) are typical views which depict that oxygen is separated from the Ce oxide, oxygen deficiency occurs, and an average lattice distance increases in the FET according to the third embodiment.

If the oxygen blending ratio is lower than the stoichiometric ratio and less than 2.0 (x<2.0), the lattice distance is widened. The reason that the lattice distance of the Ce oxide is greatly changed according to the oxygen blending ratio is considered as follows. The Ce oxide is a crystal forming strong ionic bonds. FIGS. 18(a) and 18(b) are typical views which depict oxygen depletion in the Ce oxide. If oxygen atoms at lattice positions in the crystal are separated (FIG. 18(a)→FIG. 18(b)), then Ce atoms bound with the separated oxygen atoms are pulled to the other oxygen atoms, lattice positions of the Ce atoms bound with the separated oxygen atoms are changed from the original positions. As a result, an average distance between the lattices is widened and the lattice distance is widened, accordingly.

The Ce oxide used in this embodiment is larger in lattice distance than Si by +0.8% and has an oxygen blending ratio of 1.77. The oxygen blending ratio is lowered because the oxygen partial pressure during the film formation of MBG is set as low as $1 \times 10^8$ Torr. By controlling the oxygen partial pressure, the oxygen blending ratio of the Ce oxide can be changed. If the oxygen partial pressure is controlled to $1 \times 10^{-7}$ Torr, the blending ratio is 1.89.

Figure 19:
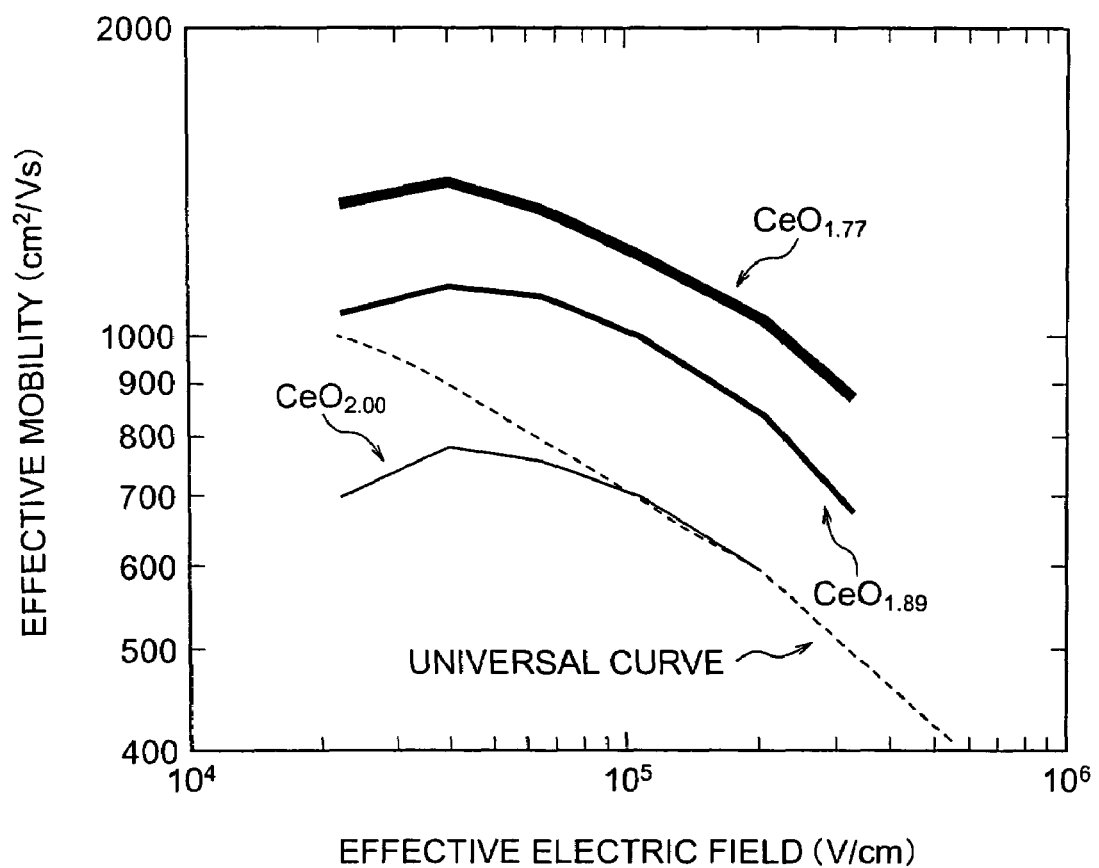
FIG. 19 is a characteristic chart which depicts the relationship between the effective electric field and the electron mobility of a new Fin FET according to the third embodiment and that according to the comparison example.

Characteristics of a new Fin n-MOSFET in which the crystalline Ce oxide film different in lattice distance from Si is used as a underlying insulating film will be described. FIG. 19 depicts the relationship between an effective electric field and an effective mobility of electrons. In FIG. 19, a broken line indicates a universal curve, and two solid lines indicate the electron mobility of the new Fin n-MOSFET with different oxygen blending ratios, respectively. As is obvious from FIG. 19, if the oxygen blending ratio is lower, the mobility is higher. The reason is as follows. If the oxygen blending ratio is lower, the lattice distance of the Ce oxide is larger. Accordingly, the lattice distance of Si in the channel region is larger, thereby improving the electron mobility.

Figure 20:
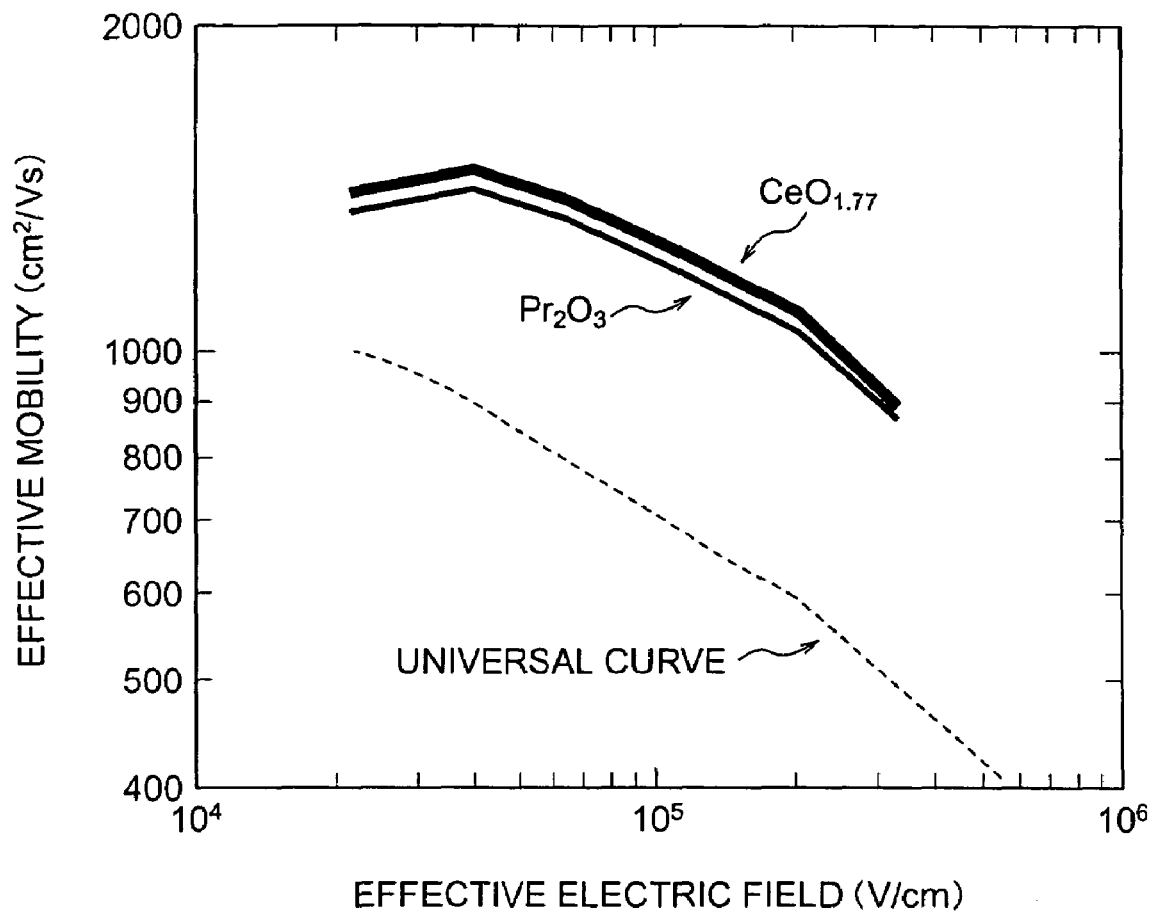
FIG. 20 is a characteristic chart which depicts the relationship between the effective electric field and the electron mobility of the new Fin FET according to the third embodiment and that according to the comparison example.

Characteristics of the new Fin n-MOSFET in which the Ce oxide film is used as the underlying insulating film according to this embodiment and the new Fin n-MOSFET having the $PrO_3$ layer as the underlying insulating film when a strain of Si in the channel region of the former new Fin n-MOSFET and that of the latter new Fin n-MOSFET are set equal will be described with reference to FIG. 20. FIG. 20 depicts the relationship between the effective electric field and the effective mobility of electrons. In FIG. 20, a broken line indicates a universal curve, and a solid line (a thin line) indicates a characteristic curve of the new Fin n-MOSFET using the $Pr_2O_3$ layer as the underlying insulating film, and a solid line (a thick line) indicates a characteristic curve of the new Fin n-MOSFET using the Ce oxide film as the underlying insulating film. As is obvious from FIG. 20, if the Ce oxide film is used as the underlying insulating film, the mobility is improved.

Using a low angle incident in-plane X-ray diffraction method, a diffraction spectrum of Si of a transistor having a direct bonded film in which the Ce oxide is directly bonded to Si similarly to this embodiment, and that of a transistor in which the $SiO_2$ film is present on an interface between the Ce oxide and Si are measured. In the measurement, the strain of Si of the former is set equal to that of the latter. According to a measurement result, in the transistor having the directly bonded film, a half-value width is substantially equal to that of bulky Si. In the transistor in which the SiO$_2$ film is present on the interface, a half-value with is larger. This indicates the following respects. Even with the equal strain on average, the transistor having the SiO$_2$ film present on the interface has a large irregularity in strain, and the transistor having the directly bonded film has a small irregularity in strain. The inventors of the present invention discovered that if the SiO$_2$ film is present on the interface, an inclined grain boundary occurs to a metal oxide film and the lattice distance in a constant direction locally differs. This is considered to cause the irregularity in strain. The irregularity in strain, in turn, causes an irregularity in mobility and, further, the deterioration of the mobility. Accordingly, as a result of using the directly bonded film capable of reducing the irregularity, the mobility of the new Fin n-MOSFET according to this embodiment is improved.

As described above in detail, according to the embodiment in which the directly bonded film is used, the tensile stress can be uniformly applied to the channel region, and the electron mobility can be improved as compared with the transistor having the SiO$_2$ film present on the interface.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) forming strong ionic bonds is used as the crystalline metal oxide. If the oxide containing at least one of Ce, Dy, Y, La, Pr, and Gd is used, in particular, the oxygen blending ratio can be precisely controlled and the particularly excellent effect can be obtained.

The third embodiment has been described while referring to the instance of using CeO$_2$ as the crystalline metal oxide. However, the equivalent advantage can be obtained even if any other crystalline metal oxide forming strong ionic bonds is used. Namely, the crystalline oxide having a perovskite structure such as SrTiO$_3$, SrZrO$_3$, Sr(TiZr)O$_3$ or SrCeO$_3$ may be used. Further, an oxide having a rock-salt structure such as MgO, CaO, SrO or BaO, Al$_2$O$_3$, or MgAl$_2$O$_4$ having a spinel structure may be used. The monocrystalline Ce oxide has been used in this embodiment. However, if a polycrystalline oxide film having uniform orientation is used, the equivalent advantage can be obtained. As the film formation method for the crystalline metal oxide, the MBE method is used in this embodiment. Alternatively, the other film formation method such as the CVD method, the sputtering method, or the electron beam evaporation method may be used.

The MISFET is formed on the Si substrate having (001) surface orientation according to the first and the second embodiments. The MISFET is formed on the Si substrate having (111) surface orientation according to the third embodiment. The surface orientation of the Si substrate may be either (001) or (111). In addition, the surface orientation of the Si substrate on which the MISFET is formed may be (110), or may be shifted from these surface orientations.

Fourth Embodiment

A p-MISFET according to a fourth embodiment of the present invention will be described. The p-MISFET according to this embodiment is constituted so that a metal oxide having a rock-salt structure is put between a crystalline metal oxide and a channel region so as to strain Si in the channel region more effectively. Namely, as compared with the n-MISFET according to the first embodiment shown in FIGS. 1 to 3, the p-MISFET according to this embodiment is constituted so that the metal oxide having a rock-salt structure is put between a metal oxide film that constitutes an insulating film 3 and a channel region 5$b$, and so that the channel region 5$b$ has an n conduction type and a source region 10$a$ and a drain region 10$b$ have a p conduction type. A manufacturing method for the p-MISFET is substantially equal to the method shown in FIGS. 4$a$ to 9C. SrO is used as the metal oxide having the rock-salt structure, Dy$_2$O$_3$ is used as the metal oxide. The two metal oxide are formed by the MBE method.

After an Si surface in the channel region 5$b$ is subjected to a depleted hydrofluoric acid treatment to terminate a surface of the Si substrate by hydrogen, the Si substrate is introduced into an MBE system. While a substrate temperature is set at, for example, 300° C. and metal Sr is used as an evaporation source, Sr is evaporated to form two atomic layers. Thereafter, an oxygen gas is supplied, thereby forming an SrO. Next, the substrate temperature is set at, for example, 700° C. and metal Dy and the oxygen gas are supplied, thereby forming a Dy$_2$O$_3$ layer having a thickness of five nanometers. An oxygen partial pressure during film formation is controlled to $1\times10^{-7}$ Torr. By forming the two atomic layers of SrO on Si, the Dy$_2$O$_3$ layer is formed without forming the SiO$_2$ layer as shown in the second embodiment. This is because SrO prevents oxygen diffusion. Namely, the insulating film has a layered structure composed by the two SrO atomic layers and the Dy$_2$O$_3$ layer having a thickness of five nanometers.

An X-ray diffraction evaluation indicates that the Dy$_2$O$_3$ layer thus formed has a high orientation degree and a good crystallinity. The evaluation also indicates that the Dy$_2$O$_3$ layer is an epitaxial layer oriented in a direction of (001) surface orientation, and that a lattice distance of Dy$_2$O$_3$ in a direction parallel to an interface between Si and Dy$_2$O$_3$, i.e., in the direction of (001) surface orientation is 5.33 angstroms.

The lattice distance of 5.33 angstroms is smaller by 1.8% than the lattice distance of Si having (001) surface orientation. A lattice distance evaluation using electron beam diffraction indicates that a compressive stress is applied to Si in the channel region and the lattice distance of Si is thereby narrowed. A lattice distance change of Dy$_2$O$_3$ is −1.8% and a lattice distance change of SI near the interface in a direction parallel to the interface is 0.8%. Even Si distant from the interface by 20 nanometers undergoes a lattice distance change, which is −0.7% in the direction parallel to the interface. An amount of this lattice distance change of Si is increased to be about twice as large as that according to the second embodiment in which the SrO layer is not used. The reason is as follows. Since the amorphous SiO$_2$ layer is not formed, the difference between the metal oxide films in lattice distance influences the Si layer more directly. In addition, the lattice distance of SrO is 5.12 angstroms, which is smaller than that of DY$_2$O$_3$, so that the effect of applying the compressive stress is improved.

In the fourth embodiment, the thickness of the SrO layer is the two atomic layer thickness. It is known that the thickness of the SrO layer is preferably in a range of one to three atomic layers. A matter such as SrO or MgO is unstable in the air. Due to this, if the thickness of the SrO layer is made larger than the two atomic layer, the crystallinity of the SrO layer changes with the passage of time and the characteristic thereof is deteriorated. If the thickness is smaller than one atomic layer, the effect of suppressing oxygen diffusion cannot be obtained and the SiO$_2$ layer is generated.

Figure 21:
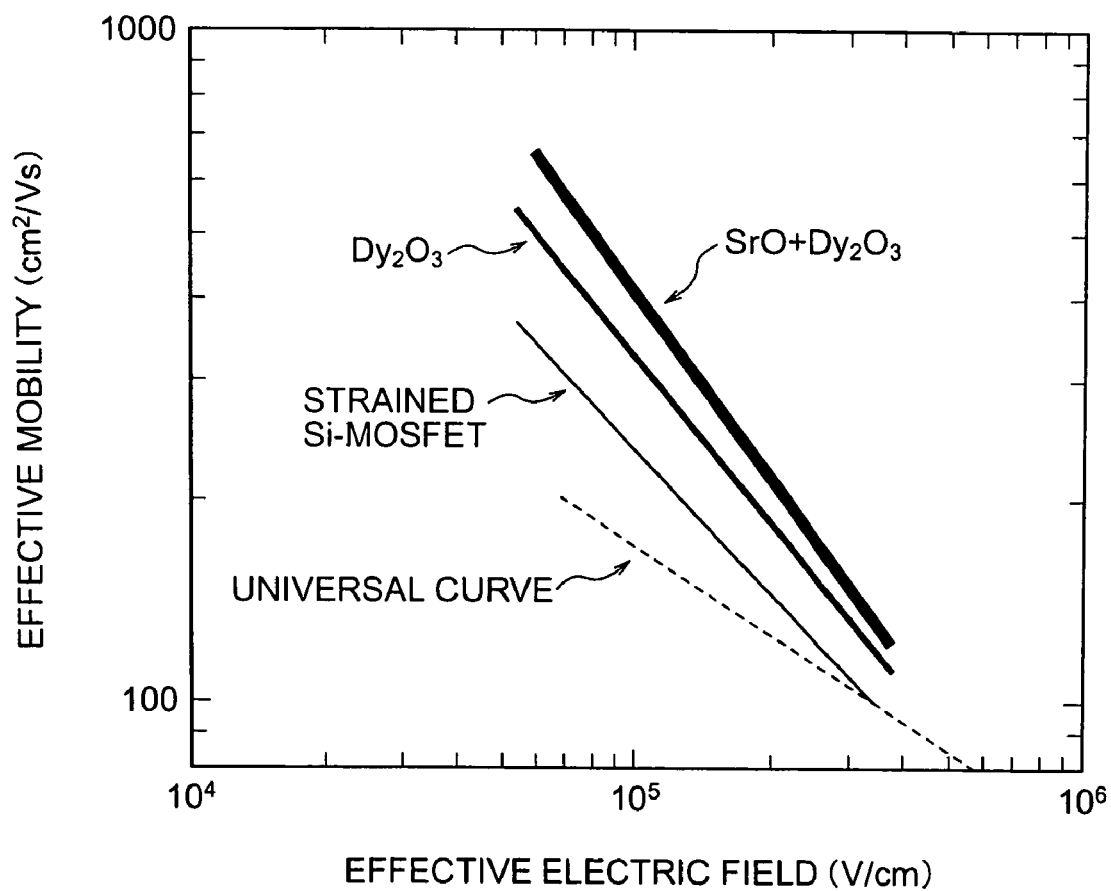
FIG. 21 is a characteristic chart which depicts the relationship between the effective electric field and the hole mobility of the new Fin FET according to the third embodiment and that according to the comparison example.

Characteristics of a new Fin p-MOSFET having a underlying insulating film that includes the SrO layer and the Dy$_2$O$_3$ layer as stated above, a new Fin p-MOSFET having a underlying insulating film composed only by the Dy$_2$O$_3$ layer, and a strained Si p-MOSFET using SiGe will be described with reference to FIG. 21. FIG. 21 depicts the relationship between an effective electric field and an effective mobility of holes. In FIG. 21, a broken line indicates a universal curve, a solid line (a thin line) indicates a characteristic curve of the strained Si p-MOSFET using SiGe and having a Ge concentration of 13%, a solid line (an intermediate thick line) indicates a characteristic curve of the new Fin p-MOSFET having the underlying insulating film composed only by the $Dy_2O_3$ layer, and a solid line (a thick line) indicates a characteristic curve of the new Fin p-MOSFET having the underlying insulating film that includes the SrO layer and the $Dy_2O_3$ layer.

As is obvious from FIG. 21, even if the underlying insulating layer is composed only by the $Dy_2O_3$ layer, a compressive strain can be introduced into the channel region and carrier spattering caused by Ge can be avoided. Therefore, the hole mobility of the new Fin p-MOSFET having the underlying insulating film composed only by the $Dy_2O_3$ layer is improved from the strained Si p-MOSFET. If the underlying insulating film has the layered structure of the SrO layer and the $Dy_2O_3$ layer, the mobility is further improved. This is because a sufficient compressive strain can be applied to the Si layer in the channel region by putting the SrO layer between the $Dy_2O_3$ layer and the channel region.

As stated above in detail, according to this embodiment, the compressive strain can be effectively applied to the channel region, and the hole mobility can be improved more effectively than the strained Si transistor using SiGe.

As can be seen, according to this embodiment, by inserting the metal oxide having the rock-salt structure, the effect of using the metal oxide different in lattice distance from Si can be more improved. In this embodiment, SrO is used as the metal oxide having the rock-salt structure. Alternatively, the other metal oxide having the rock-salt structure may be used. If the metal oxide film having the rock-salt structure such as SrO, MgO, CaO, or BaO film, in particular, the effect of suppressing oxygen diffusion can be conspicuously observed and the transistor characteristics can be greatly improved. If the tensile stress is to be applied to Si, BaO that is the metal oxide having the rock-salt structure and larger in lattice distance than Si is preferably used. If the compressive stress is to be applied to Si, SrO, MgO, or CaO that is the metal oxide having the rock-salt structure and smaller in lattice distance than Si is preferably used. However, the lattice distance change of the Si layer mainly depends on the crystalline metal oxide having a large thickness. In the structure, for example, in which SrO smaller in lattice distance than Si is provided, and in which $Pr_2O_3$ larger in lattice distance than Si is provided on SrO, Si in the channel region is applied with the tensile stress. Therefore, a combination of the metal oxide having the rock-salt structure and the crystalline metal oxide can be arbitrarily selected.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of S. If the rare-earth oxide containing at least one selected from Ce, Dy, Y, La, Pr and Gd is used, in particular, a film having a high crystallinity scan be realized and a particularly excellent effect can be obtained.

The fourth embodiment has been described while referring to the instance of using $Dy_2O_3$ as the crystalline metal oxide. The crystalline metal oxide may be a crystalline oxide having a perovskite structure such as $SrTiO_3$, $SrZrO_3$, $Sr(TiZr)O_3$ or $SrCeO_3$. Further, even if $Al_2O_3$ or $MgAl_2O_4$ having a spinel structure is used, the equivalent advantage can be obtained. The crystalline metal oxide having crystal orientation has been used in the fourth embodiment. If a monocrystalline metal oxide film having uniform orientation is used, a larger lattice distance change occurs. As the film formation method for the crystalline metal oxide, the electron beam evaporation method has been used. Alternatively, the other film formation method such as the CVD method, the sputtering method, or the MBE method may be used.

In the fourth embodiment, the instance of using the Si substrate having (001) surface orientation has been described. However, the surface orientation of the Si substrate may be any one of (111), (111), and (110). Further, the surface orientation may be shifted from these surface orientations.

In the fourth embodiment, the n-MISFET has been described. However, the fourth embodiment can be carried out using a p-MISFET by the similar method. The selection of one of the crystalline metal oxides stated above depends on whether the tensile stress or the compressive stress is to be applied to Si. If the n-MISFET is manufactured, the electron mobility is improved in Si applied with the tensile stress. Therefore, one of the metal oxides larger in lattice distance than Si may be selected. If the p-MISFET is manufactured, the hole mobility of the p-MISFET can be improved whether the tensile stress or the compressive stress. Therefore, one of the metal oxides different in lattice distance from Si may be selected. In addition, depending on the stress to be applied to Si, the lattice distance of the metal oxide may be selected. If a desired lattice distance and a desired stress cannot be achieved by the metal oxide consisting only of one metal element, a metal oxide consisting of two or more metal elements may be used. For example, by using $(Eu_xDy_{1-x})_2O_3$ containing two metal elements of Eu and Dy, the lattice distance change of the metal oxide relative to Si can be arbitrarily varied in a range between zero to −1.8%.

Fifth Embodiment

The configuration of a MISFET according to a fifth embodiment of the present invention will be described with reference to FIGS. 1 to 9C. The MISFET according to this embodiment is constituted so that the insulating film 6a includes at least a crystalline metal oxide film, and so that lattice distances of metal oxide films included in the insulating films 3 and 6a are both larger or smaller than Si, as compared with the MISFET according to the first embodiment shown in FIGS. 1 to 3. Therefore, Si in the channel region 5b is applied with stresses from both the insulating films 3 and 6a, thereby forming a strained Si layer.

That is, according to this embodiment, the lattice distance of Si in the channel region 3 is set different from that of Si in the semiconductor substrate 1b. In case of an n-MISFET, the lattice distances of the metal oxide films that constitute the respective insulating films 3 and 6a are set larger than that of Si, and the lattice distance of Si in the channel layer 5a is widened by a tensile stress. The electron mobility on the channel region can be thereby improved. In case of a p-MISFET, the lattice distances of the metal oxide films that constitute the respective insulating films 3 and 6a are set larger or smaller than that of Si, and the lattice distance of Si in the channel region is changed by the tensile stress or the compressive stress. The hole mobility in the channel region 5a can be thereby improved. Further, the metal oxide films different in lattice distance from Si are arranged above and below the channel region 5a, a change of the lattice distance uniform in a depth direction can be generated in the entire channel region. Accordingly, as compared with the first to the fourth embodiments, the carrier mobility is expected to be improved according to the fifth embodiment.

A method for manufacturing the MISFET according to this embodiment will be described, taking the n-MISFET as an example with reference to FIGS. 4A to 9C.

First, hydrogen ions, for example, are implanted into a Si substrate 1a having (001) surface orientation at an energy of a dosage of $5 \times 10^{16}/cm^2$ and a peak range of, for example, a 50-nanometer depth from a surface, thereby forming a high hydrogen concentration region. To recover the Si substrate 1a from a damage caused by the ion implantation, the Si substrate 1a is subjected to a heat treatment in a hydrogen atmosphere at 800° C. for 30 minutes, for example. By subjecting the Si substrate 1a to the heat treatment, the substrate 1a is recovered from the damage, an intermediate layer 2 having a lower mechanical strength than that of surroundings of the intermediate layer 2 is formed in the high hydrogen concentration region. At the same time, an Si layer 5a to serve as the channel region is formed (see FIGS. 4A and 5A). Microscopic vacancies are continuously formed in the intermediate layer 2, so that the intermediate layer has the lower mechanical strength. This can facilitate peeling off the intermediate layer 2 in a later step.

A depleted hydrofluoric acid treatment is carried out to terminate a surface of the Si substrate 1a by hydrogen. The resultant substrate 1a is introduced into an electron beam evaporations system. While a substrate temperature is set at, for example, 600° C. and $La_2O_3$ is used as an evaporation source, a metal oxide $La_2O_3$ is evaporated by a thickness of five nanometers, thereby forming a $La_2O_3$ layer (see FIGS. 4B and 5B). At this time, Si on an $La_2O_3$ layer 3a-side interface of the Si layer 5a is oxidized, and an $SiO_2$ layer 3b having a thickness of 0.5 nanometer is formed between the Si layer 5a and the $La_2O_3$ layer 3a. Further, an oxygen partial pressure is precisely controlled to $5 \times 10^{-7}$ Torr, thereby improving an orientation degree of the metal oxide $La_2O_3$ and improving a crystallinity thereof. In addition, an X-ray diffraction evaluation indicates that the $La_2O_3$ layer 3a is an epitaxial layer oriented in a direction of (001) surface orientation, and that a lattice distance of $La_2O_3$ in a direction parallel to an interface between the $SiO_2$ layer 3b and the $La_2O_3$ layer 3a, i.e., in the direction of (001) surface orientation is 5.70 angstroms. The lattice distance of 5.70 angstroms is larger by 5.0% than the lattice distance of Si in the direction of (001) surface orientation. The X-ray diffraction evaluation also indicates that a half-value width of the X-ray diffraction is narrow, and that the $La_2O_3$ layer is a film strongly oriented in the direction of (001) surface orientation and having a high crystallinity.

Si is deposited by the CVD method, thereby forming an Si layer 5 having a thickness of, for example, one micrometer (see FIGS. 4C and 5C). At this time, Si on an $La_2O_3$ layer 3a-side interface of the Si layer 5 is oxidized, and an $SiO_2$ layer 3c having a thickness of 0.5 nanometer is formed between the Si layer 5 and the $La_2O_3$ layer 3a. Namely, the insulating film 3 has a three-layer structure composed by the $SiO_2$ layer 3b having a thickness of 0.5 nanometer, the $La_2O_3$ layer 3a having a thickness of five nanometers, and the $SiO_2$ layer 3c having a thickness of 0.5 nanometer is formed (see FIGS. 4C and 5C).

A surface of the Si layer 5 is bonded to the substrate 1b (see FIGS. 4D and 5D). Thereafter, the substrate 1b is peeled off with the intermediate layer 2 set as a boundary, thereby exposing the Si layer 5a onto the insulating film 3 including the metal oxide. The exposed surface of the Si layer 5a is planarized by, for example, the CMP method (see FIGS. 4E and 5E). An impurity profile can be then formed in the Si layer 5a, to serve as the channel region, by implanting boron ions.

As shown in FIGS. 6A and 7A, a depleted hydrofluoric acid treatment is carried out to terminate a surface of the Si layer 5a by hydrogen. The resultant substrate 1a is introduced into the MBE system. While the substrate temperature is set at, for example, 600° C. and $La_2O_3$ is used as an evaporation source, a metal oxide $La_2O_3$ is evaporated by a thickness of five nanometers, thereby forming an insulating film 6. At this time, the oxygen partial pressure is precisely controlled to $5 \times 10^{-7}$ Torr, thereby improving the orientation degree of the $La_2O_3$ and improving the crystallinity thereof. In addition, although not shown in the figures, an oxide film consisting of $SiO_2$ is formed on the interface between the Si layer 5a and the insulating film 6.

As shown in FIGS. 6B and 7B, the insulating film 6 and the Si layer 5a are patterned by an anisotropic etching method such as the RIE method, thereby forming a channel region 5b and an insulating film 6a. At the same time, the SiO.sub.2 layer 3b formed between the La.sub.2O.sub.3 layer 3a and the Si layer 5a is patterned (see FIGS. 6B and 7B).

As shown in FIGS. 6C and 7C, a gate insulating film 7 having a thickness of three nanometers and consisting of $SiO_2$ is formed around the channel region 5b. At this time, a height (gate width) of a Fin channel region is set at 20 nanometers, a Fin width (channel region width) is set at 20 nanometers, and a Fin length is set at 200 nanometers, for example. Next, a polysilicon film 9 serving as a gate electrode is deposited on entire surfaces of the $La_2O_3$ film 3a and the gate insulating film 7 by the CVD method (see FIGS. 6D and 7D).

The polysilicon film 9 is patterned by the anisotropic etching method such as the RIE method, thereby forming a gate electrode 9a (see FIGS. 6E and 7E). Using the gate electrode 9a as a mask, ion implantation and a heat treatment are carried out, thereby forming the source and drain regions 10a and 10b doped with impurities (see FIGS. 8A and 9A). An interlayer insulating film 11 consisting of $SiO_2$ is deposited on entire surfaces of the $La_2O_3$ film 3a and the gate electrode 9a by the CVD Method (see FIGS. 8B and 9B).

As shown in FIGS. 8C and 9C, contact holes are formed on the source and drain regions 10a and 10b, metal such as Al is evaporated to form a metal film on the entire surfaces, thereby forming source and drain electrodes 12a and 12b and a gate electrode 12c. The n-MISFET is thus completed.

Figure 22:
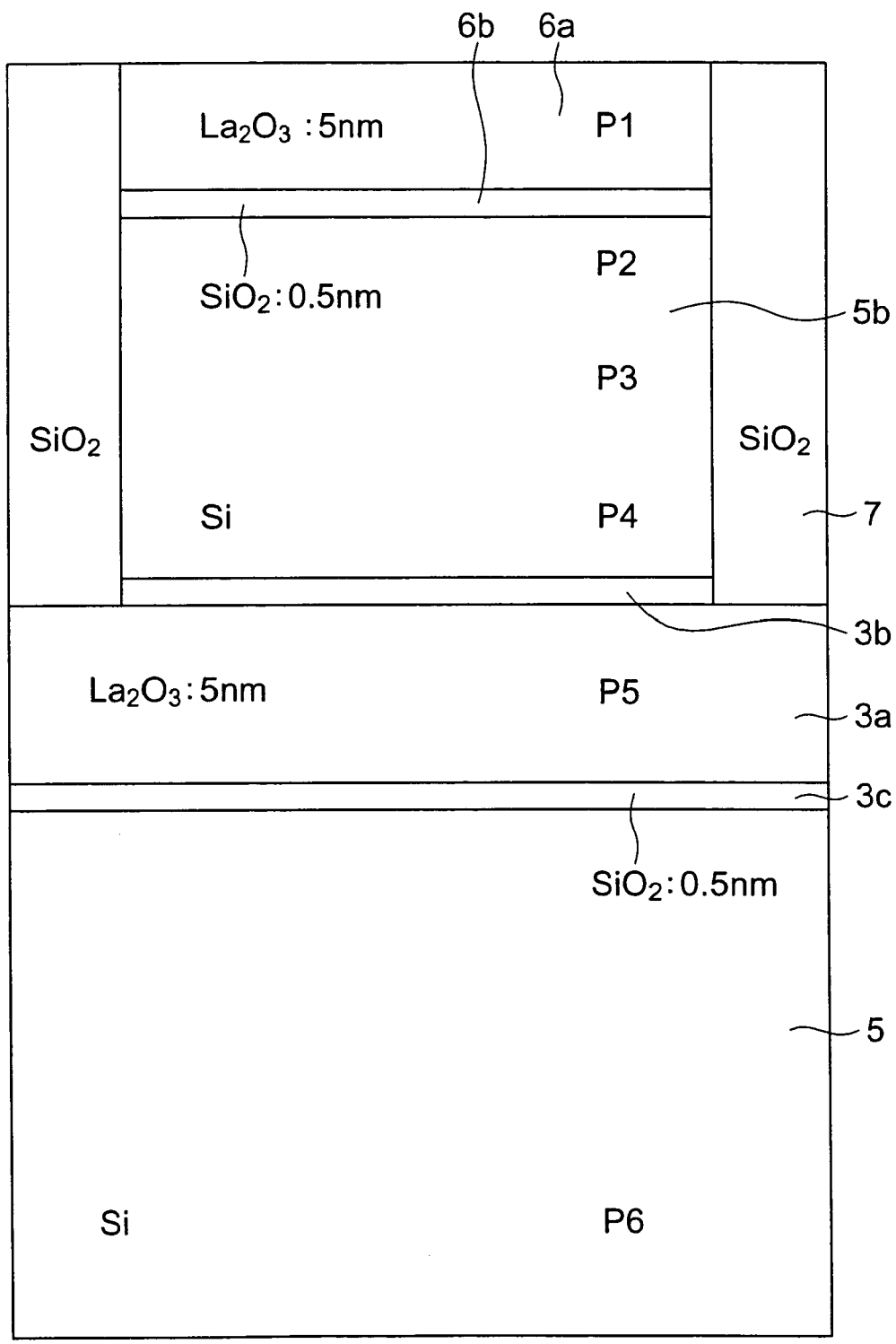
FIG. 22 depicts measurement positions of $Si/SiO_2/La_2O_3/SiO_2/Si/SiO_2$ interfaces according to a fifth embodiment of the present invention.
Figure 23:
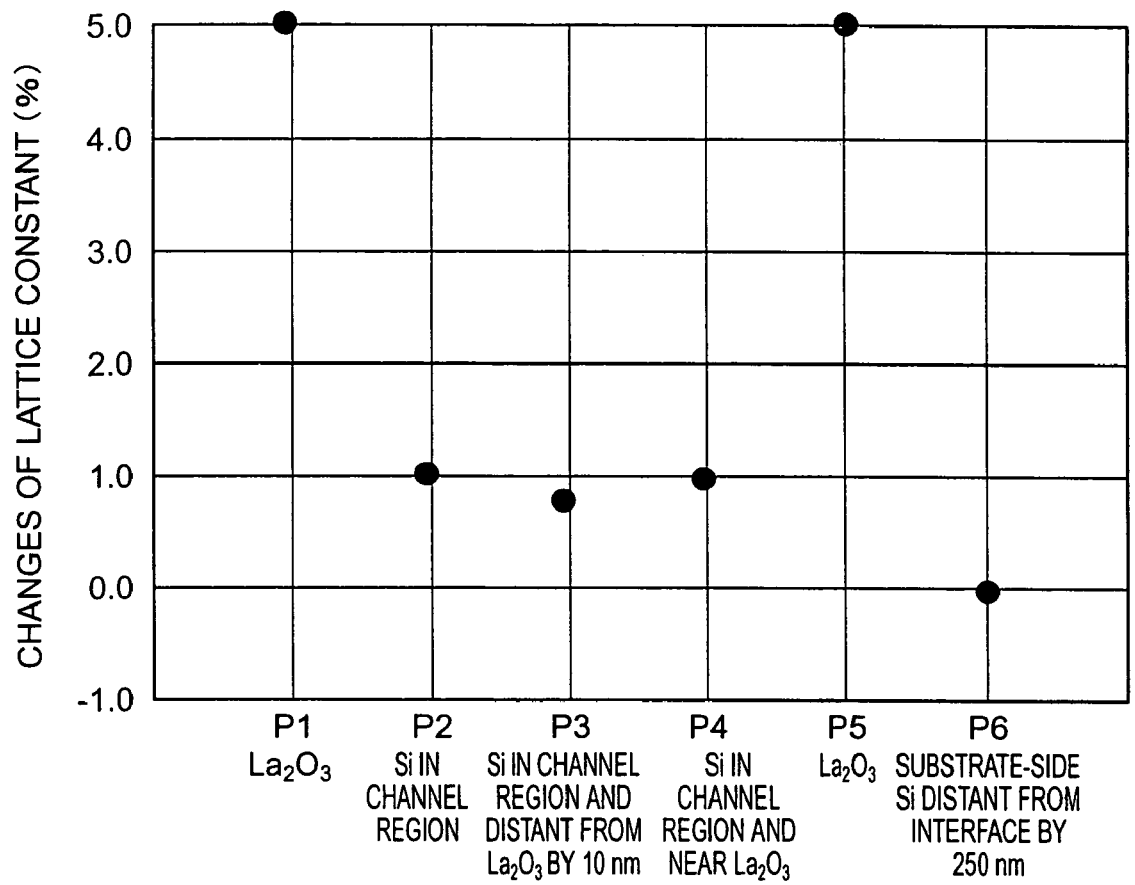
FIG. 23 is a chart that depicts changes of a lattice distance at the measurement positions shown in FIG. 22.

Characteristics of the channel region 5a of the n-MISFET according to this embodiment will next be described in detail. FIG. 22 is an enlarged view of the insulating film having the layered structure of the $SiO_2$ layer 3b/$La_2O_3$ layer 3a/$SiO_2$ layer 3c and the channel region 5b, and is a typical view which depicts a cross-sectional structure. FIG. 23 depicts changes of the lattice distance obtained from an electron beam diffraction image measured using the TEM. The lattice distance measured herein is the lattice distance in a direction of (100) surface orientation parallel to the interface. As shown in FIG. 22, measurement points are a point P1 of the $La_2O_3$ layer 6a, a point P2 of Si in the channel region 5b on the interface between the $La_2O_3$ layer 6a and the Si layer 5b, a point P3 of Si in the channel region 5b distant from the interface between the $La_2O_3$ layer 6a and the Si layer 5b by ten nanometers, a position P4 of Si in the channel region 5b on the interface between the $La_2O_3$ layer 6a and the Si layer, a point P5 of the $La_2O_3$ layer 3a, and a point P6 of Si distant from the interface between the $La_2O_3$ layer 3a and the Si layer 5 by 250 nanometers. In FIG. 22, the $SiO_2$ layer 6b having a thickness of 0.5 nanometer is formed between the $La_2O_3$ layer 6a and the Si layer 5b. This $SiO_2$ layer 6b is an oxide film formed during the formation of the $La_2O_3$ layer 6a.

In FIG. 23, changes of the lattice distance are shown with reference to the lattice distance of substrate-side Si distant from the interface by 250 nanometers at the position P6. A lattice distance change of each of the $La_2O_3$ layers 3a and 6a is +5.0%, which coincides with a result obtained from the X-ray diffraction. Si in the channel region 5a near the interface with the $La_2O_3$ layer 6a at the position P2, and Si in the channel region 5a near the interface with the $La_2O_3$ layer 3a at the position P4 are strained each by +1.0% to follow the lattice distance change of this $Pr_2O_3$ layer 3a. Si in an intermediate portion of the channel region 5a distant from the interfaces each by ten nanometers at the position P3 undergoes lattice distance change, which is as large as +0.8%. This result shows that by arranging the insulating films larger in lattice change than Si and each consisting of the metal oxide having the high crystallinity in the substrate and above the channel region, the lattice distance of the Si in the channel region can be made wide.

Figure 24:
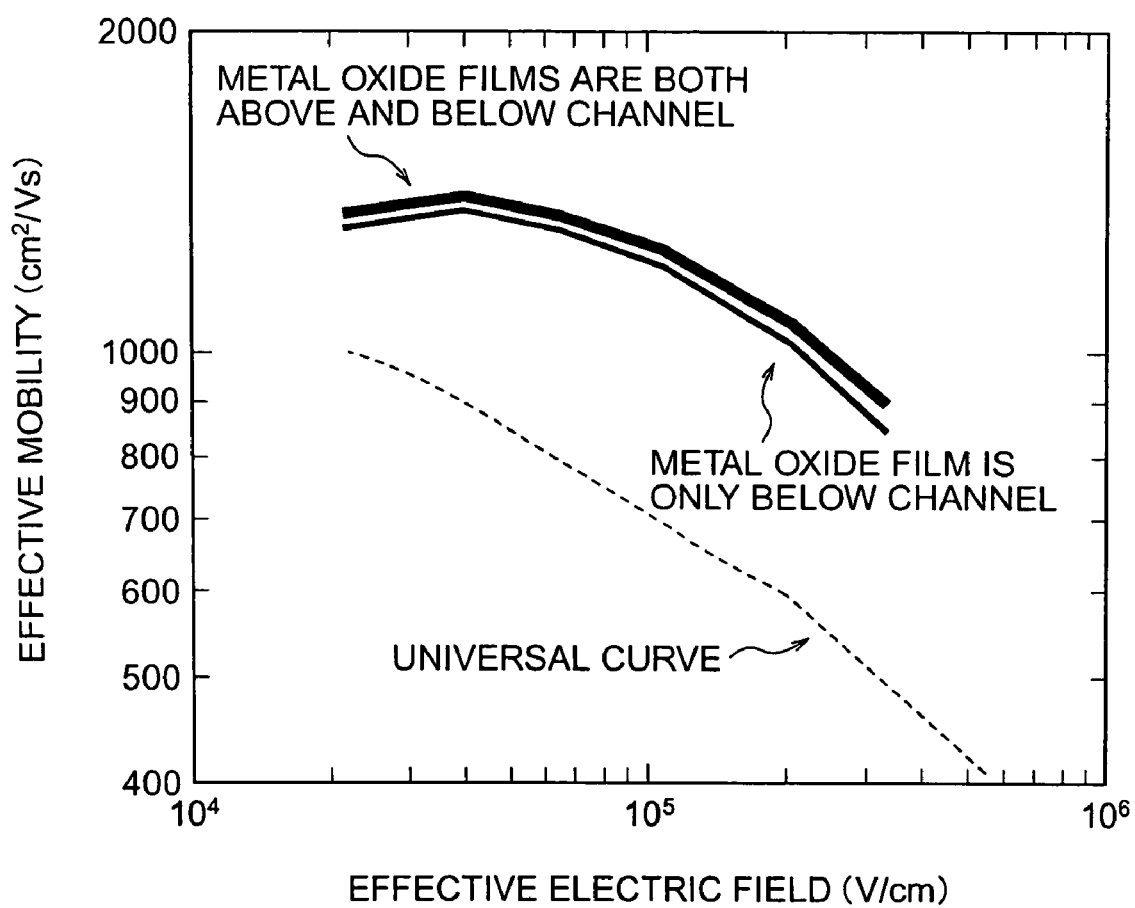
FIG. 24 is a characteristic chart which depicts the relationship between the effective electric field and the electron mobility of a new Fin FET according to the fifth embodiment and that according to the comparison example.

Characteristics of a new Fin n-MOSFET in which crystalline metal oxide ($La_2O_3$) films different in lattice distance from Si are arranged above and below the channel region, respectively according to this embodiment, and a new Fin n-MOSFET in which only a underlying insulating film consists of the metal oxide ($La_2O_3$) will be compared. FIG. 24 depicts the relationship between an effective electric field and an effective mobility of electrons. In FIG. 24, a broken line indicates a universal curve, a solid line (a thin line) indicates a characteristic curve of the new Fin n-MOSFET in which only the underlying insulating film consists of the metal oxide, and a solid line (a thick line) indicates a characteristic curve of the new Fin n-MOSFET having the metal oxide films arranged above and below the channel region, respectively.

As is obvious from FIG. 24, the new Fin n-MOSFET in which the metal oxide films are arranged above and below the channel region, respectively is higher in mobility than the new Fin n-MOSFET having only the underlying insulating film consisting of the metal oxide. This is because by arranging the metal oxides larger in lattice distance than Si above and below the channel region, respectively, a uniform tensile strain can be applied to Si layer in the entire channel region, thereby improving the electron mobility.

As stated above, according to this embodiment, the uniform tensile strain can be applied to Si in the entire channel region of the Fin transistor, and the higher electron mobility than that of the new Fin n-MOSFET having only the underlying insulating film consisting of the metal oxide can be attained.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of Si. If the rare-earth oxide containing at least one selected from Ce, Dy, Y, La, Pr and Gd is used, in particular, a film having a high crystallinity scan be realized and a particularly excellent effect can be obtained.

The fifth embodiment has been described while referring to the instance of using $La_2O_3$ as the crystalline metal oxide. The crystalline metal oxide may be a crystalline oxide having a perovskite structure such as $SrTiO_3$, $SrZrO_3$, $Sr(TiZr)O_3$ or $SrCeO_3$. Further, even if an oxide having a rock-salt structure such as MgO, CaO, SrO or BaO, $Al_2O_3$, or $MgAl_2O_4$ having a spinel structure exhibits an equivalent effect. The crystalline metal oxide having crystal orientation has been used in the fifth embodiment. If a monocrystalline metal oxide film having uniform orientation is used, a larger lattice distance change occurs. As the film formation method for the crystalline metal oxide, the sputtering method has been used. Alternatively, the other film formation method such as the CVD method, the electron beam evaporation method, or the MBE method may be used.

In the fifth embodiment, the n-MISFET has been described. However, the fifth embodiment can be carried out using a p-MISFET by the similar method. The selection of one of the crystalline metal oxides stated above depends on whether the tensile stress or the compressive stress is to be applied to Si. If the n-MISFET is manufactured, the electron mobility is improved in Si applied with the tensile stress. Therefore, one of the metal oxides larger in lattice distance than Si may be selected. If the p-MISFET is manufactured, the hole mobility of the p-MISFET can be improved whether the tensile stress or the compressive stress. Therefore, one of the metal oxides different in lattice distance from Si may be selected. In addition, depending on the stress to be applied to Si, the lattice distance of the metal oxide may be selected. If a desired lattice distance and a desired stress cannot be achieved by the metal oxide consisting only of one metal element, a metal oxide consisting of two or more metal elements may be used. For example, by using $(Eu_xDy_{1-x})_2O_3$ containing two metal elements of Eu and Dy, the lattice distance change of the metal oxide relative to Si can be arbitrarily varied in a range between zero to −1.8%.

Sixth Embodiment

An n-MISFET according to a sixth embodiment of the present invention will be described. In the n-MISFET according to this embodiment, a metal oxide having an oxygen blending ratio lower than a stoichiometric ratio, e.g., a Ce oxide is used as each of a underlying insulating film and an insulating film above a channel region so as to apply a tensile stress to Si in the channel region. Namely, the n-MISFET according to this embodiment is constituted so that the metal oxide film that constitutes each of insulating films 3 and 6a is the Ce oxide in place of $La_2O_3$, as compared with the n-MISFET according to the fifth embodiment. In this embodiment, differently from the fifth embodiment, no $SiO_2$ layers are formed between the $La_2O_3$ layer 3a and the Si layer 5, between the $La_2O_3$ layer 3a and the Si layer 5a, and between the $La_2O_3$ layer 6 and the Si layer 5a, respectively, as will be described later.

A method for manufacturing the n-MISFET according to this embodiment is substantially equal to the method according to the fifth embodiment. A substrate consisting of Si having (111) surface orientation is used. The Ce oxide is formed by the MBE method. After an Si surface of the substrate is subjected to a depleted hydrofluoric acid treatment to terminate the surface by hydrogen, the Si substrate is introduced into an MBE system. While a substrate temperature is set at, for example, 700° C. and metal Ce is used as an evaporation source, Ce is evaporated to form a 0.6 monolayer. Thereafter, an ozone $O_3$ gas or an oxygen gas is supplied, thereby forming an insulating film consisting of the Ce oxide and having a thickness of five nanometers. An oxygen partial pressure during film formation is controlled to $1\times10^{-8}$ Torr. By using this film formation method, the monocrystalline. Ce oxide film directly bonded to Si and oriented in a direction of (111) surface orientation can be epitaxially grown without forming an amorphous layer such as an $SiO_2$ layer on an interface. Thereafter, by executing the same steps as those in the fifth embodiment, the n-MISFET is completed.

A blending ratio of metal to oxygen of the Ce oxide (CeOx) thus formed is 1.77 and a lattice distance thereof is wider by +0.8% than that of Si. As described in the third embodiment, the reason that the oxygen blending ratio of the Ce oxide is lowered is that the oxygen partial pressure is set as low as $1 \times 10^{-8}$ Torr during film formation by the MBE method. A strain of Si in the channel region near the Ce oxide film serving as the underlying insulating film consisting of the Ce oxide having the blending ratio x of 1.77 is +0.75%, that of Si in a central portion of the channel region is +0.60%, and that of Si near the insulating film above the channel region is +0.50%. By contrast, in the channel region near the Ce oxide films arranged above and below the channel region, respectively, a strain of Si in the central portion of the channel region near the Ce oxide film serving as the first insulating film arranged above the channel region is +0.75%, that is Si in the central portion of the channel region is +0.70%, and that of Si near the Ce oxide film serving as the second insulating film arranged below the channel region is +0.75%. This indicates that by arranging the metal oxide films above and below the channel region, respectively, a uniform strain is applied to Si.

Figure 25:
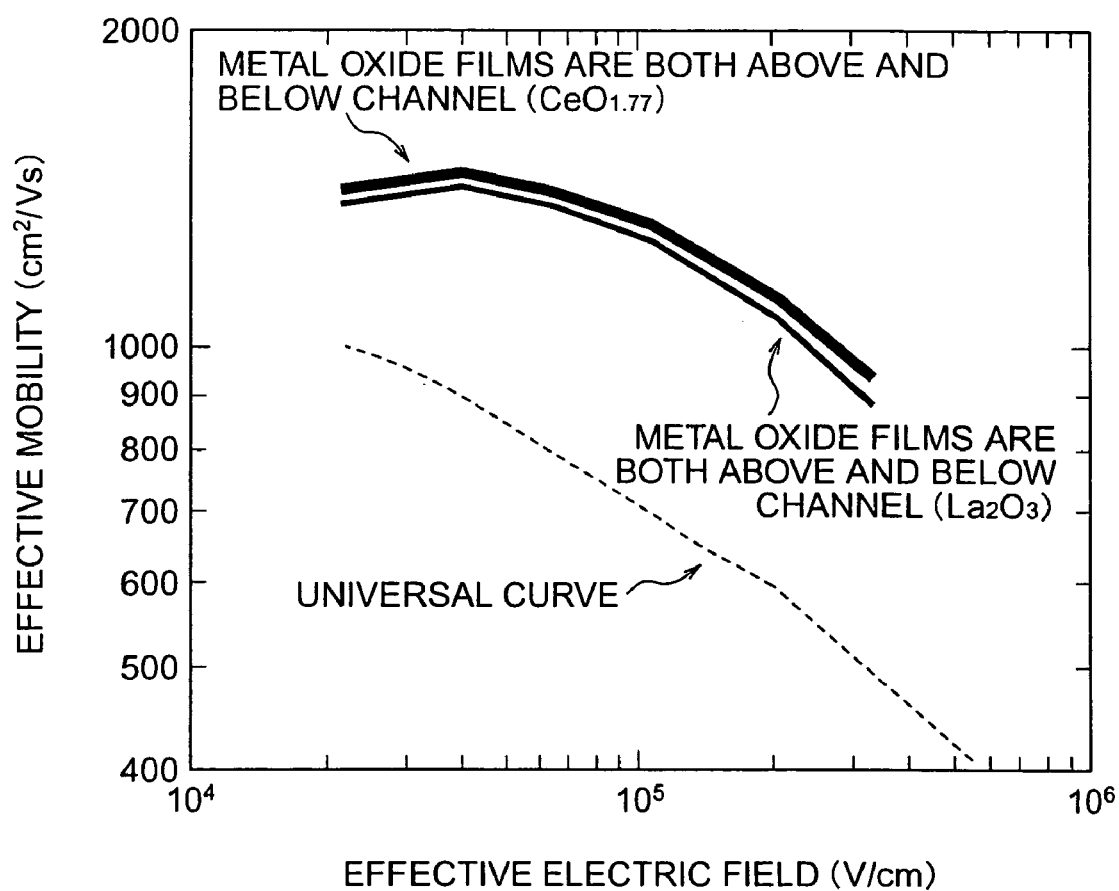
FIG. 25 is a characteristic chart which depicts the relationship between the effective electric field and the electron mobility of a new Fin FET according to a sixth embodiment and that according to the comparison example.

Characteristics of a new Fin n-MOSFET in which the crystalline Ce oxide different in lattice distance from Si is arranged each of above and below the channel region according to this embodiment, and those of the new Fin n-MOSFET in which the metal oxide $La_2O_3$ is arranged each of above and below the channel region according to the fifth embodiment will be compared. FIG. 25 depicts the relationship between an effective electric field and an effective mobility of electrons. In FIG. 25, a broken line indicates a universal curve, a solid line (a thick line) denotes a characteristic curve of the new Fin n-MOSFET in which $La_2O_3$ is arranged each of above and below the channel region, and a solid line (a thick line) denotes a characteristic curve of the new Fin n-MOSFET according to the present invention in which the Ce oxide (blending ratio x of 1.77) is used as the insulating film arranged each of above and below the channel region. It is noted that a strain of Si in the channel region 5a of the former new Fin n-MOSFET and that of the latter new Fin n-MOSFET are set equal. As is obvious from FIG. 25, if the Ce oxide film is used as the insulating film arranged each of above and below the channel region, the mobility is improved, as compared with the new Fin n-MOSFET in which $La_2O_3$ is arranged each of above and below the channel region. This is because by directly bonding the Ce oxides to Si in the channel region, an irregularity in strain applied to Si in the channel region is reduced.

As described above in detail, according to the embodiment, the tensile stress smaller in irregularity can be uniformly applied to the channel region, and the electron mobility can be improved as compared with the n-MOSFET in which the metal oxide film is not directly bonded to Si.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) forming strong ionic bonds is used as the crystalline metal oxide. If the oxide containing at least one of Ce, Dy, Y, La, Pr, and Gd is used, in particular, the oxygen blending ratio can be precisely controlled and the particularly excellent effect can be obtained.

The sixth embodiment has been described while referring to the instance of using $CeO_2$ as the crystalline metal oxide. However, the equivalent advantage can be obtained even if any other crystalline metal oxide forming strong ionic bonds is used. Namely, the crystalline oxide having a perovskite structure such as $SrTiO_3$, $SrZrO_3$, $Sr(TiZr)O_3$ or $SrCeO_3$ may be used. Further, an oxide having a rock-salt structure such as MgO, CaO, SrO or BaO, $Al_2O_3$, or $MgAl_2O_4$ having a spinel structure may be used. The monocrystalline Ce oxide has been used in this embodiment. However, if a polycrystalline oxide film having uniform orientation is used, the equivalent advantage can be obtained. As the film formation method for the crystalline metal oxide, the MBE method is used in this embodiment. Alternatively, the other film formation method such as the CVD method, the sputtering method, or the electron beam evaporation method may be used.

The MISFET is formed on the Si substrate having (001) surface orientation according to the fifth embodiment. The MISFET is formed on the Si substrate having (111) surface orientation according to the sixth embodiment. The surface orientation of the Si substrate may be either (001) or (111). In addition, the surface orientation of the Si substrate on which the MISFET is formed may be (110), or may be shifted from these surface orientations.

Seventh Embodiment

The configuration of a MISFET according to a seventh embodiment of the present invention will be described with reference to FIGS. 1 to 9C. The MISFET according to this embodiment is constituted so that the gate insulating film 7 includes at least a crystalline metal oxide film, and so that a metal oxide film included in the insulating film 3 arranged just below the channel region 5a and that included in the gate insulating film 7 differ in lattice distance from Si in the channel region 5a. Namely, the MISFET according to this embodiment is constituted so that if the lattice distance of the insulating film 3 is larger than that of Si, the lattice distance of the metal oxide film included in the gate insulating film 7 is smaller than that of Si, and so that if the lattice distance of the insulating film 3 is smaller than that of Si, the lattice distance of the metal oxide film included in the gate insulating film 7 is larger than that of Si.

Accordingly, Si in the channel region 5b is applied with stresses from both the insulating film 3 and the gate insulating films 7, and a strained Si layer having a uniform strain is provided. That is, if the MISFET according to this embodiment is an n-MISFET, then the lattice distance of the metal oxide film included in the insulating film 3 is set larger than that of Si, and the lattice distance of the metal oxide film included in the gate insulating film 7 is set smaller than that of Si, thereby widening the lattice distance of Si in the channel region 5a by tensile stresses. It is thereby possible to improve an electron mobility in the channel region.

If the MISFET according to this embodiment is a p-MISFET, by contrast, the lattice distance of the metal oxide film included in the insulating film 3 is set larger than that of Si, and the lattice distance of the metal oxide film included in the gate insulating film 7 is set smaller than that of Si, thereby changing the lattice distance of Si in the channel region 5b according to the tensile stresses. Alternatively, the lattice distance of the metal oxide film included in the insulating film 3 is set smaller than that of Si, and the lattice distance of the metal oxide film included in the gate insulating film 7 is set larger than that of Si, thereby changing the lattice distance of Si in the channel region 5b according to compressive stresses. It is thereby possible to improve a hole mobility in the channel region. Besides, since the metal oxide films different in lattice distance from Si are arranged on a side surface of the channel region and below the channel region, respectively, a strain of Si in the channel region can be further increased, and the carrier mobility is expected to be further improved, as compared with the first to the fourth embodiments.

A method for manufacturing the MISFET according to this embodiment will be described, taking the n-MISFET as an example with reference to FIGS. 4A to 9C.

First, hydrogen ions, for example, are implanted into a Si substrate 1a having (001) surface orientation at an energy of a dosage of $5\times10^{16}/cm^2$ and a peak range of, for example, a 50-nanometer depth from a surface, thereby forming a high hydrogen concentration region. To recover the Si substrate 1a from a damage caused by the ion implantation, the Si substrate 1a is subjected to a heat treatment in a hydrogen atmosphere at 800° C. for 30 minutes, for example. By subjecting the Si substrate 1a to the heat treatment, the substrate 1a is recovered from the damage, an intermediate layer 2 having a lower mechanical strength than that of surroundings of the intermediate layer 2 is formed in the high hydrogen concentration region. At the same time, an Si layer 5a to serve as the channel region is formed (see FIGS. 4A and 5A). Microscopic vacancies are continuously formed in the intermediate layer 2, so that the intermediate layer has the lower mechanical strength. This can facilitate peeling off the intermediate layer 2 in a later step.

A depleted hydrofluoric acid treatment is carried out to terminate an Si surface of the Si substrate 1a by hydrogen. The resultant substrate 1a is introduced into the electron beam evaporations system. While a substrate temperature is set at, for example, 600° C. and $La_2O_3$ is used as an evaporation source, a metal oxide $La_2O_3$ is evaporated by a thickness of five nanometers, thereby forming a $La_2O_3$ layer 3a (see FIGS. 4B and 5B). At this time, Si on an $La_2O_3$ layer 3a-side interface of the Si layer 5a is oxidized, and an $SiO_2$ layer 3b having a thickness of 0.5 nanometer is formed between the Si layer 5a and the $La_2O_3$ layer 3a. Further, an oxygen partial pressure is precisely controlled to $5\times10^{-7}$ Torr, thereby improving an orientation degree of the metal oxide $La_2O_3$ and improving a crystallinity thereof. In addition, an X-ray diffraction evaluation indicates that the $La_2O_3$ layer 3a is an epitaxial layer oriented in a direction of (001) surface orientation, and that a lattice distance of $La_2O_3$ in a direction parallel to an interface between the $SiO_2$ layer 3b and the $La_2O_3$ layer 3a, i.e., in the direction of (001) surface orientation is 5.70 angstroms. The lattice distance of 5.70 angstroms is larger by 5.0% than the lattice distance of Si in the direction of (001) surface orientation. The X-ray diffraction evaluation also indicates that a half-value width of the X-ray diffraction is narrow, and that the $La_2O_3$ layer is a film strongly oriented in the direction of (001) surface orientation and having a high crystallinity.

Si is deposited by the CVD method, thereby forming an Si layer 5 having a thickness of, for example, one micrometer (see FIGS. 4C and 5C). At this time, Si on an $La_2O_3$ layer 3a-side interface of the Si layer 5 is oxidized, and an $SiO_2$ layer 3c having a thickness of 0.5 nanometer is formed between the Si layer 5 and the $La_2O_3$ layer 3a. Namely, with this manufacturing method, the insulating film having a three-layer structure composed by the $SiO_2$ layer 3b having a thickness of 0.5 nanometer, the $La_2O_3$ layer 3a having a thickness of five nanometers, and the $SiO_2$ layer 3c having a thickness of 0.5 nanometer is formed (see FIGS. 4C and 5C).

A surface of the Si layer 5 is bonded to the substrate 1b (see FIGS. 4D and 5D). Thereafter, the substrate 1b is peeled off with the intermediate layer 2 set as a boundary, thereby exposing the Si layer 5a onto the insulating film 3 including the $La_2O_3$ layer 3a. The exposed surface of the Si layer 5a is planarized by, for example, the CMP method (see FIGS. 4E and 5E).

As shown in FIGS. 6A and 7A, $SiO_2$ having a thickness of 50 nanometers is coated on an entire surface of the $SiO_2$, thereby forming an insulating film 6. An impurity profile can be then formed in the Si layer 5a, to serve as the channel region, by implanting boron ions through the insulating film 6. As shown in FIGS. 6B and 7B, the insulating film 6 and the Si layer 5a are patterned by an anisotropic etching method such as the RIE method, thereby forming a channel region 5b and an insulating film 6a. At the same time, the $SiO_2$ layer 3b formed between the $La_2O_3$ layer 3a and the Si layer 5a is patterned.

Next, the resultant substrate 1b is introduced into the electron beam evaporations system. While the substrate temperature is set at, for example, 600° C. and $Dy_2O_3$ is used as an evaporation source, a metal oxide $Dy_2O_3$ is evaporated by a thickness of five nanometers, thereby forming a gate insulating film 7 around the channel region 5b (see FIGS. 6C and 7C). At this time, an $SiO_2$ layer (not shown) having a thickness of 0.5 nanometer is formed between the gate insulating film 7 and the Si layer 5a. In this embodiment, a height (gate width) of a Fin channel region is set at 20 nanometers, a Fin width (channel region width) is set at 20 nanometers, and a Fin length is set at 200 nanometers, for example. Further, the oxygen partial pressure is precisely controlled to $1\times10^{-7}$ Torr, thereby improving an orientation degree of $Dy_2O_3$ and a crystallinity thereof. Next, a polysilicon film 9 serving as a gate electrode is deposited on entire surfaces of the $La_2O_3$ film 3a and the gate insulating film 7 by the CVD method (see FIGS. 6D and 7D).

The polysilicon film 9 is patterned by the anisotropic etching method such as the RIE method, thereby forming a gate electrode 9a (see FIGS. 6E and 7E). Using the gate electrode 9a as a mask, ion implantation and a heat treatment are carried out, thereby forming the source and drain regions 10a and 10b doped with impurities (see FIGS. 8A and 9A). An interlayer insulating film 11 consisting of $SiO_2$ is deposited on entire surfaces of the $La_2O_3$ film 3a and the gate electrode 9a by the CVD Method (see FIGS. 8B and 9B).

As shown in FIGS. 8C and 9C, contact holes are formed on the source and drain regions 10a and 10b, metal such as Al is evaporated to form a metal film on the entire surfaces, thereby forming source and drain electrodes 12a and 12b and a gate electrode 12c. The n-MISFET is thus completed.

Figure 26:
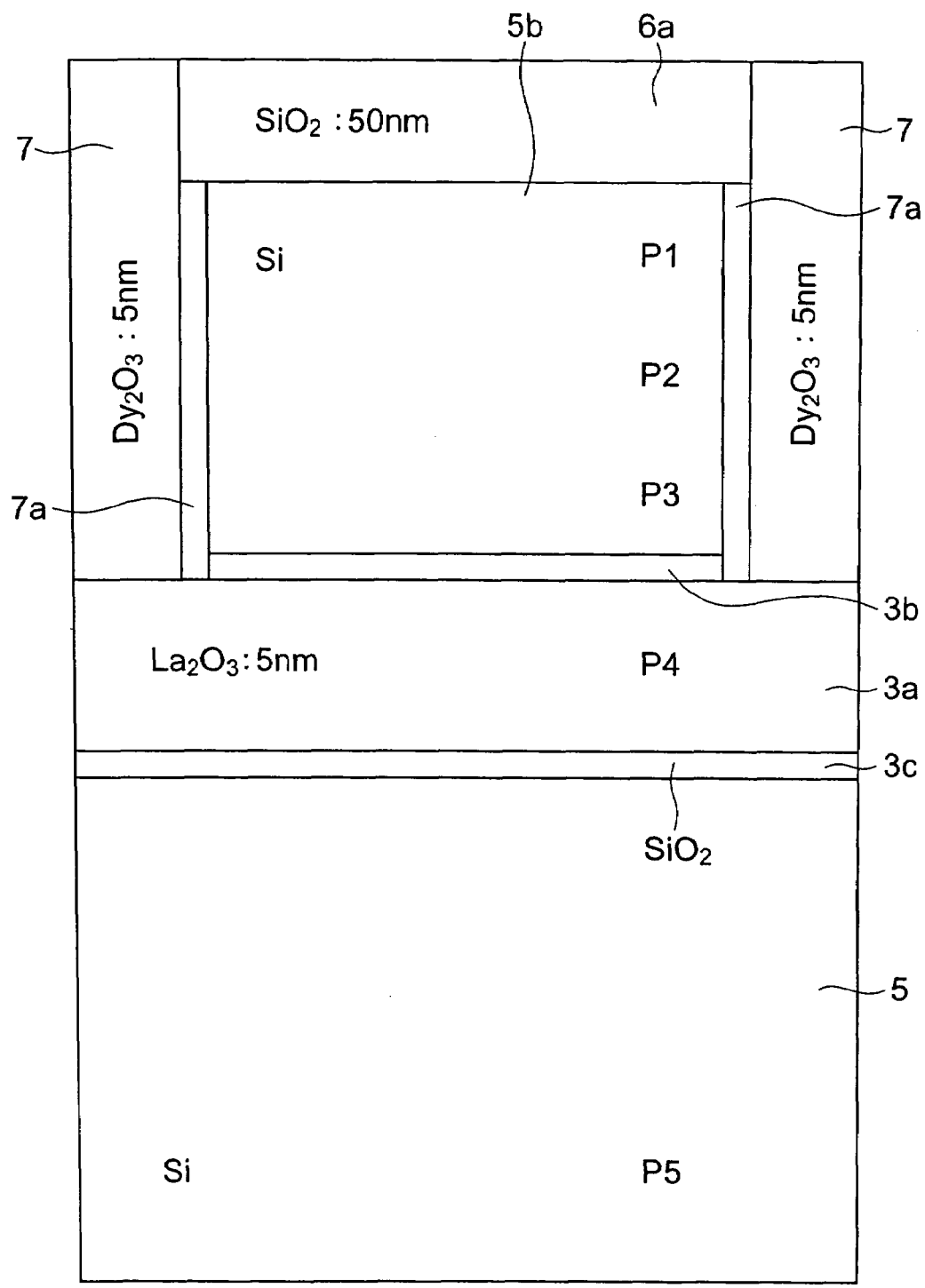
FIG. 26 depicts measurement positions of $Si/SiO_2/La_2O_3/SiO_2/Si/SiO_2$ interfaces according to a seventh embodiment of the present invention.
Figure 27:
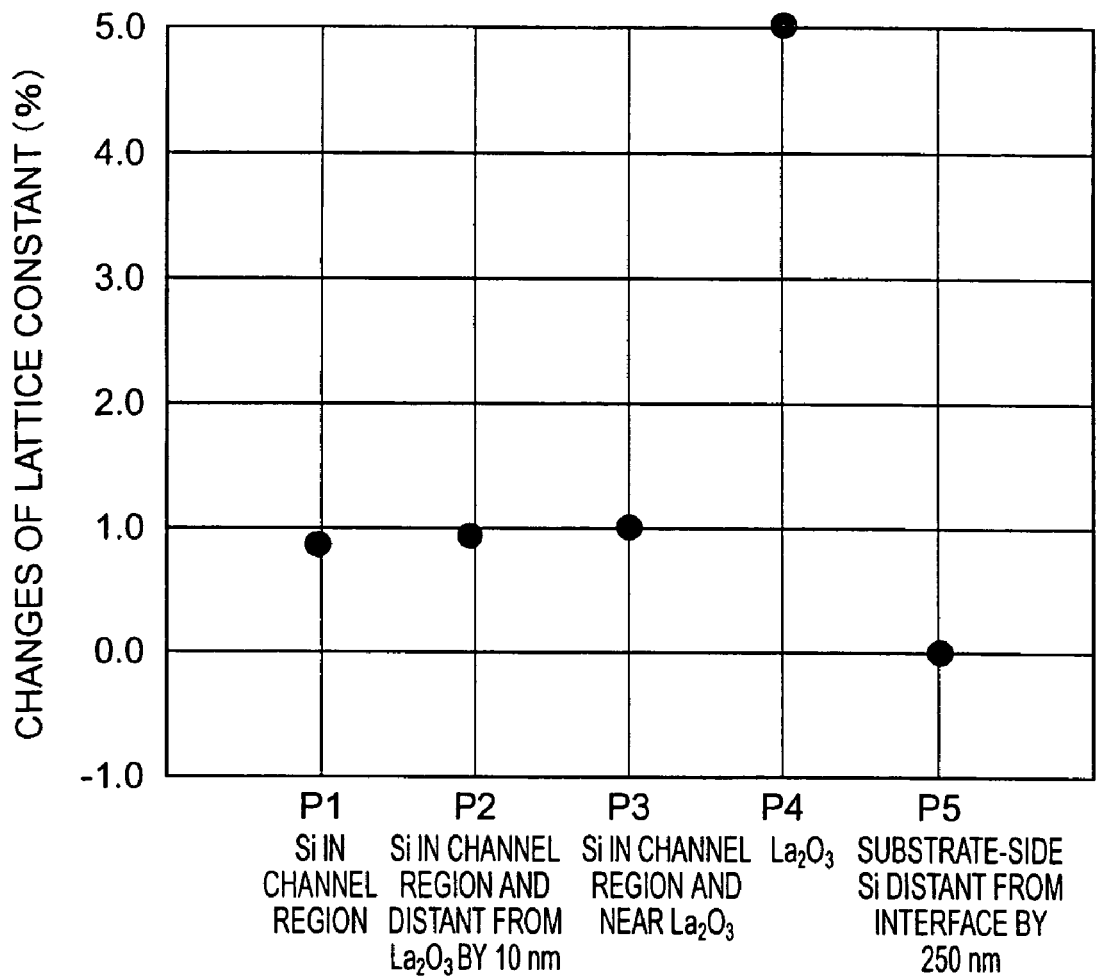
FIG. 27 is a chart that depicts changes of a lattice distance at the measurement positions shown in FIG. 26.
Figure 28:
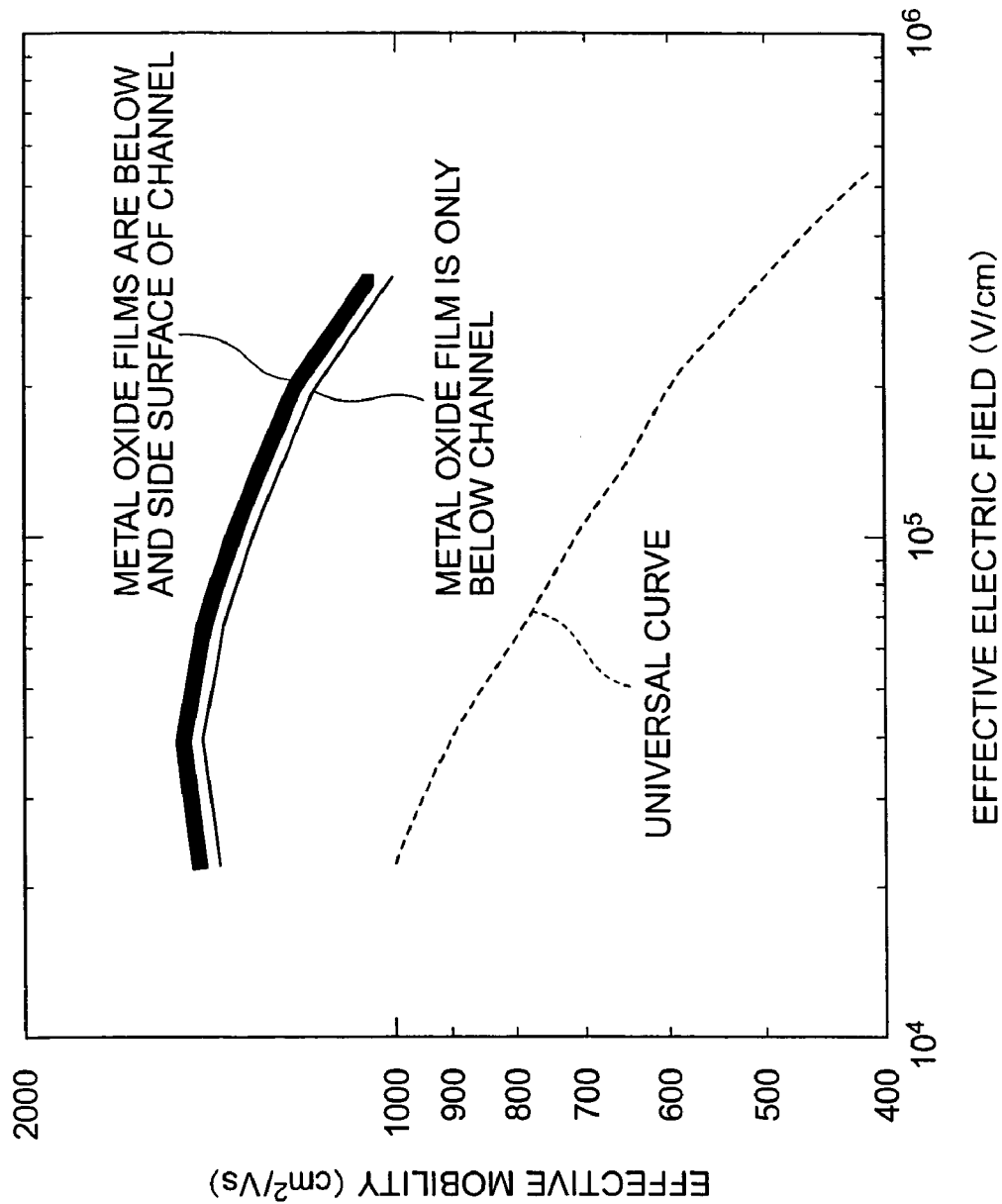
FIG. 28 is a characteristic chart which depicts the relationship between the effective electric field and the electron mobility of a new Fin FET according to the seventh embodiment and that according to the comparison example.

Characteristics of the channel region 5b of the n-MISFET according to this embodiment will next be described with reference to FIGS. 26 to 28. FIG. 26 is an enlarged view of the insulating film 3 having the layered structure of the $SiO_2$ layer 3b/$La_2O_3$ layer 3a/$SiO_2$ layer 3c and the channel region 5b, and is a typical view which depicts a cross-sectional structure. FIG. 27 depicts changes of the lattice distance obtained from an electron beam diffraction image measured using the TEM. The lattice distance measured herein is the lattice distance in a direction of (100) surface orientation parallel to the interface. As shown in FIG. 26, measurement points are a point P1 of Si in the channel region 5b on the interface between the insulating film 6a consisting of $SiO_2$ and the Si layer 5b, a point P2 of Si in the channel region distant from the interface between the insulating film 6a and the Si layer 5b by ten nanometers, a point P3 of Si in the channel region 5b on the interface between the $La_2O_3$ layer 3a and the Si layer 5b, a position P4 of the $La_2O_3$ layer 3a, and a point P5 of Si distant from the interface between the $La_2O_3$ layer 3a and the Si layer 5 by 250 nanometers. In FIG. 26, the $SiO_2$ layer 7a having a thickness of 0.5 nanometer is formed between the $Dy_2O_3$ layer 7 and the Si layer 5b. This $SiO_2$ layer 7a is an oxide film formed during the formation of the $Dy_2O_3$ layer 7.

In FIG. 27, changes of the lattice distance are shown with reference to the lattice distance of Si distant from the interface by 250 nanometers at the position P5. A lattice distance change of the $La_2O_3$ layers 3a at the position P4 is +5.0%, which coincides with a result obtained from the X-ray diffraction. Si in the channel region 5b on the interface between the La$_2$O$_3$ layer 3a and the Si layer 5b at the position P3 is strained by +1.0% to follow the lattice distance change of the La$_2$O$_3$ layer 3a. Si in the channel region distant from the interface between the insulating film 6a and the Si layer 5b by ten nanometers at the position P2 is strained by +0.95%. Si in the channel region on the interface between the insulating film 6a and the Si layer 5b at the position P1 is strained by 0.95%. This result shows that by using the insulating films larger in lattice distance than Si and each including the metal oxide having the high crystallinity as the insulating film 3 in the substrate and the gate insulating film 7 arranged on the side surface of the channel region, respectively, the lattice distance of the Si in the entire channel region can be made wide.

Characteristics of a new Fin n-MOSFET in which crystalline metal oxide (La$_2$O$_3$) films different in lattice distance from Si are arranged on the side surface of the channel region and below the channel region, respectively according to this embodiment, and a new Fin n-MOSFET in which only a underlying insulating film consists of the metal oxide will be described with reference to FIG. 28. FIG. 28 depicts the relationship between an effective electric field and an effective mobility of electrons. In FIG. 28, a broken line indicates a universal curve, a solid line (a thin line) indicates a characteristic curve of the new Fin n-MOSFET in which only the underlying insulating film consists of the metal oxide, and a solid line (a thick line) indicates a characteristic curve of the new Fin n-MOSFET having the metal oxide films arranged on the side surface of the channel region and below the channel region, respectively. By arranging the metal oxides on the side surface of the channel region and below the channel region, respectively, the mobility is improved, as compared with the Fin n-MOSFET in which only the underlying insulating film consists of the metal oxide. This is because by arranging the metal oxides different in lattice distance from Si and different in strain direction from each other on the side surface of the channel region and below the channel region, respectively, a uniform tensile strain can be applied to Si in the channel region, thereby improving the electron mobility.

As stated above in detail, according to this embodiment, the uniform tensile strain can be applied to Si in the entire channel region of the Fin transistor, and the higher electron mobility than that of the new Fin n-MOSFET having only the underlying insulating film consisting of the metal oxide can be attained.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of Si. If the rare-earth oxide containing at least one selected from Ce, Dy, Y, La, Pr and Gd is used, in particular, a film having a high crystallinity scan be realized and a particularly excellent effect can be obtained.

The seventh embodiment has been described while referring to the instance of using La$_2$O$_3$ and Dy$_2$O$_3$ as the crystalline metal oxides. The crystalline metal oxide may be a crystalline oxide having a perovskite structure such as SrTiO$_3$, SrZrO$_3$, Sr(TiZr)O$_3$ or SrCeO$_3$. Further, even if an oxide having a rock-salt structure such as MgO, CaO, SrO or BaO, Al$_2$O$_3$, or MgAl$_2$O$_4$ having a spinel structure exhibits an equivalent effect The crystalline metal oxide having crystal orientation has been used in the seventh embodiment. If a monocrystalline metal oxide film having uniform orientation is used, a larger lattice distance change occurs. As the film formation method for the crystalline metal oxide, the electron beam evaporation method has been used. Alternatively, the other film formation method such as the CVD method, the sputtering method, or the MBE method may be used.

In the seventh embodiment, the instance of using the Si substrate having (001) surface orientation has been described. However, the surface orientation of the Si substrate may be any one of (111), (111), and (110). Further, the surface orientation may be shifted from these surface orientations.

In the seventh embodiment, the n-MISFET has been described. However, the seventh embodiment can be carried out using a p-MISFET by the similar method. The selection of one of the crystalline metal oxides stated above depends on whether the tensile stress or the compressive stress is to be applied to Si. If the n-MISFET is manufactured, the electron mobility is improved in Si applied with the tensile stress. Therefore, the metal oxide larger in lattice distance than Si may be selected as that included in the insulating film 3 and the metal oxide smaller in lattice distance than Si may be selected as that included in the insulating film 7. If the p-MISFET is manufactured, the hole mobility of the p-MISFET can be improved whether the tensile stress or the compressive stress. Therefore, the metal oxide larger in lattice distance than Si may be selected as that included in the insulating film 3 and the metal oxide smaller in lattice distance than Si may be selected as that included in the insulating film 7. Alternatively, the metal oxide smaller in lattice distance than Si may be selected as that included in the insulating film 3 and the metal oxide larger in lattice distance than Si may be selected as that included in the insulating film 7. In addition, depending on the stress to be applied to Si, the lattice distance of each metal oxide may be selected. If a desired lattice distance and a desired stress cannot be achieved by the metal oxide consisting only of one metal element, a metal oxide consisting of two or more metal elements may be used. For example, by using (Eu$_x$Dy$_{1-x}$)$_2$O$_3$ containing two metal elements of Eu and Dy, the lattice distance change of each metal oxide relative to Si can be arbitrarily varied in a range between zero to −1.8%.

Eighth Embodiment

The configuration of a MISFET according to an eighth embodiment of the present invention will be described with reference to FIGS. 1 to 9C. The MISFET according to this embodiment is constituted so that the insulating film 6a formed right above the channel region 5b includes at least a crystalline metal oxide film, and so that the gate insulating film 7 formed on the side surface of the channel region 5b includes a metal oxide film consisting of a crystalline metal oxide, as compared with the MISFET according to the first embodiment shown in FIGS. 1 to 3. A lattice distance of the metal oxide film included in the gate insulating film 7 differ from those of the metal oxide films included in the insulating films 3 and 6a in magnitude relative to the lattice distance of Si, respectively. If the lattice distances of the metal oxide films included in the insulating films 3 and 6a are larger than that of Si, the lattice distance of the metal oxide film included in the gate insulating film 7 is smaller than that of Si. If the lattice distances of the metal oxide films included in the insulating films 3 and 6a are smaller than that of Si, the lattice distance of the metal oxide film included in the gate insulating film 7 is larger than that of Si.

Accordingly, Si in the channel region 5b is applied with stresses from all of the insulating films 3 and 6a and the gate insulating films 7, and a strain Si layer having a uniform strain is provided.

That is, according to this embodiment, the lattice distance of Si in the channel region 5b is set different from that of Si in the semiconductor substrate 1b. If the MISFET according to this embodiment is an n-MISFET, then the lattice distances of the metal oxide films included in the respective insulating films 3 and 6a in a channel direction are set larger than that of Si, and the lattice distance of the metal oxide film included in the gate insulating film 7 in the channel direction is set smaller than that of Si. It is thereby possible to widen the lattice distance of Si in the channel region 5b by a tensile stress, and improve an electron mobility in the channel region 5b.

If the MISFET according to this embodiment is a p-MISFET, by contrast, the lattice distances of the metal oxide films are set larger or smaller than that of Si, thereby changing the lattice distance of Si in the channel region 5b according to the tensile stress or the compressive stress. It is thereby possible to improve a hole mobility in the channel region. Besides, since the metal oxide films different in lattice distance from Si are arranged above and below the channel region, respectively, a change of the lattice distance uniform in a depth direction can be generation in the entire channel region. Therefore, the carrier mobility is expected to be further improved, as compared with the first to the seventh embodiments.

A method for manufacturing the MISFET according to this embodiment will be described, taking the n-MISFET as an example with reference to FIGS. 4A to 9C.

First, hydrogen ions, for example, are implanted into a Si substrate 1a having (001) surface orientation at an energy of a dosage of $5\times10^{16}/cm^2$ and a peak range of, for example, a 50-nanometer depth from a surface, thereby forming a high hydrogen concentration region. To recover the Si substrate 1a from a damage caused by the ion implantation, the Si substrate 1a is subjected to a heat treatment in a hydrogen atmosphere at 800° C. for 30 minutes, for example. By subjecting the Si substrate 1a to the heat treatment, the substrate 1a is recovered from the damage, an intermediate layer 2 having a lower mechanical strength than that of surroundings of the intermediate layer 2 is formed in the high hydrogen concentration region. At the same time, an Si layer 5a to serve as the channel region is formed (see FIGS. 4A and 5A). Microscopic vacancies are continuously formed in the intermediate layer 2, so that the intermediate layer has the lower mechanical strength.

A depleted hydrofluoric acid treatment is carried out to terminate an Si surface of the Si substrate 1a by hydrogen. The resultant substrate 1a is introduced into the electron beam evaporations system.

While a substrate temperature is set at, for example, 600° C. and $La_2O_3$ is used as an evaporation source, a metal oxide $La_2O_3$ is evaporated by a thickness of five nanometers, thereby forming a $La_2O_3$ layer 3a (see FIGS. 4B and 5B). At this time, Si on an $La_2O_3$ layer 3a-side interface of the Si layer 5a is oxidized, and an $SiO_2$ layer 3b having a thickness of 0.5 nanometer is formed between the Si layer 5a and the $La_2O_3$ layer 3a.

Further, an oxygen partial pressure is precisely controlled to $5\times10^{-7}$ Torr, thereby improving an orientation degree of the metal oxide $La_2O_3$ and improving a crystallinity thereof. In addition, an X-ray diffraction evaluation indicates that the $La_2O_3$ layer 3a is an epitaxial layer oriented in a direction of (001) surface orientation, and that a lattice distance of $La_2O_3$ in a direction parallel to an interface between the $SiO_2$ layer 3b and the $La_2O_3$ layer 3a, i.e., in the direction of (001) surface orientation is 5.70 angstroms. The lattice distance of 5.70 angstroms is larger by 5.0% than the lattice distance of Si in the direction of (001) surface orientation. The X-ray diffraction evaluation also indicates that a half-value width of the X-ray diffraction is narrow, and that the $La_2O_3$ layer 3a is a film strongly oriented in the direction of (001) surface orientation and having a high crystallinity. An Si layer 5 having a thickness of, for example, one micrometer is formed by the CVD method (see FIG. 4C). At this time, Si on an $La_2O_3$ layer 3a-side interface of the Si layer 5 is oxidized, and an $SiO_2$ layer 3c having a thickness of 0.5 nanometer is formed between the Si layer 5 and the $La_2O_3$ layer 3a. Namely, the insulating film 3 has a three-layer structure composed by the $SiO_2$ layer 3b having a thickness of 0.5 nanometer, the $La_2O_3$ layer 3a having a thickness of five nanometers, and the $SiO_2$ layer 3c having a thickness of 0.5 nanometer (see FIGS. 4C and 5C).

A surface of the Si layer 5 is bonded to the substrate 1b (see FIGS. 4D and 5D). Thereafter, the substrate 1b is peeled off with the intermediate layer 2 set as a boundary, thereby exposing the Si layer 5a onto the insulating film 3 including the metal oxide film. The exposed surface of the Si layer 5a is planarized by, for example, the CMP method (see FIGS. 4E and 5E). An impurity profile can be then formed in the Si layer 5a, to serve as the channel region, by implanting boron ions.

As shown in FIGS. 6A and 7A, a depleted hydrofluoric acid treatment is carried out to terminate a surface of the Si layer 5a by hydrogen. The resultant substrate 1a is introduced into the MBE system. While the substrate temperature is set at, for example, 600° C. and $La_2O_3$ is used as an evaporation source, a metal oxide $La_2O_3$ is evaporated by a thickness of five nanometers, thereby forming an insulating film 6. At this time, the oxygen partial pressure is precisely controlled to $5\times10^{-7}$ Torr, thereby improving the orientation degree of the $La_2O_3$ and improving the crystallinity thereof. In addition, although not shown in the figures, an oxide film consisting of $SiO_2$ is formed on the interface between the Si layer 5a and the insulating film 6.

As shown in FIGS. 6B and 7B, the insulating film 6 and the Si layer 5a are patterned by an anisotropic etching method such as the RIE method, thereby forming a channel region 5b and an insulating film 6a. At the same time, the SiO.sub.2 layer 3b formed between the La.sub.2O.sub.3 layer 3a and the Si layer 5a is patterned.

Next, the resultant substrate 1a is introduced into the electron beam evaporations system. While the substrate temperature is set at, for example, 600° C. and $Dy_2O_3$ is used as an evaporation source, a metal oxide $Dy_2O_3$ is evaporated by a thickness of five nanometers, thereby forming a gate insulating film 7 around the channel region 5b (see FIGS. 6C and 7C). At this time, an $SiO_2$ layer (not shown) having a thickness of 0.5 nanometer is formed between the gate insulating film 7 and the Si layer 5a. In addition, a height (gate width) of a Fin channel region is set at 20 nanometers, a Fin width (channel region width) is set at 20 nanometers, and a Fin length is set at 200 nanometers, for example. At this time, the oxygen partial pressure is precisely controlled to $1\times10^{-7}$ Torr, thereby improving an orientation degree of $Dy_2O_3$ and the crystallinity thereof.

Next, a polysilicon film 9 serving as a gate electrode is deposited on entire surfaces of the $La_2O_3$ film 3a and the gate insulating film 7 by the CVD method (see FIGS. 6D and 7D). The polysilicon film 9 is patterned by the anisotropic etching method such as the RIE method, thereby forming a gate electrode 9a (see FIGS. 6E and 7E). Using the gate electrode 5a as a mask, ion implantation and a heat treatment are carried out, thereby forming the source and drain regions 10a and 10b doped with impurities (see FIGS. 8A and 9A). An interlayer insulating film 11 consisting of $SiO_2$ is deposited on entire surfaces of the La$_2$O$_3$ film 3a and the gate electrode 9a by the CVD Method (see FIGS. 8B and 9B).

As shown in FIGS. 8C and 9C, contact holes are formed on the source and drain regions 10a and 10b, metal such as Al is evaporated to form a metal film on the entire surfaces, thereby forming source and drain electrodes 12a and 12b and a gate electrode 12c. The n-MISFET is thus completed.

Figure 29:
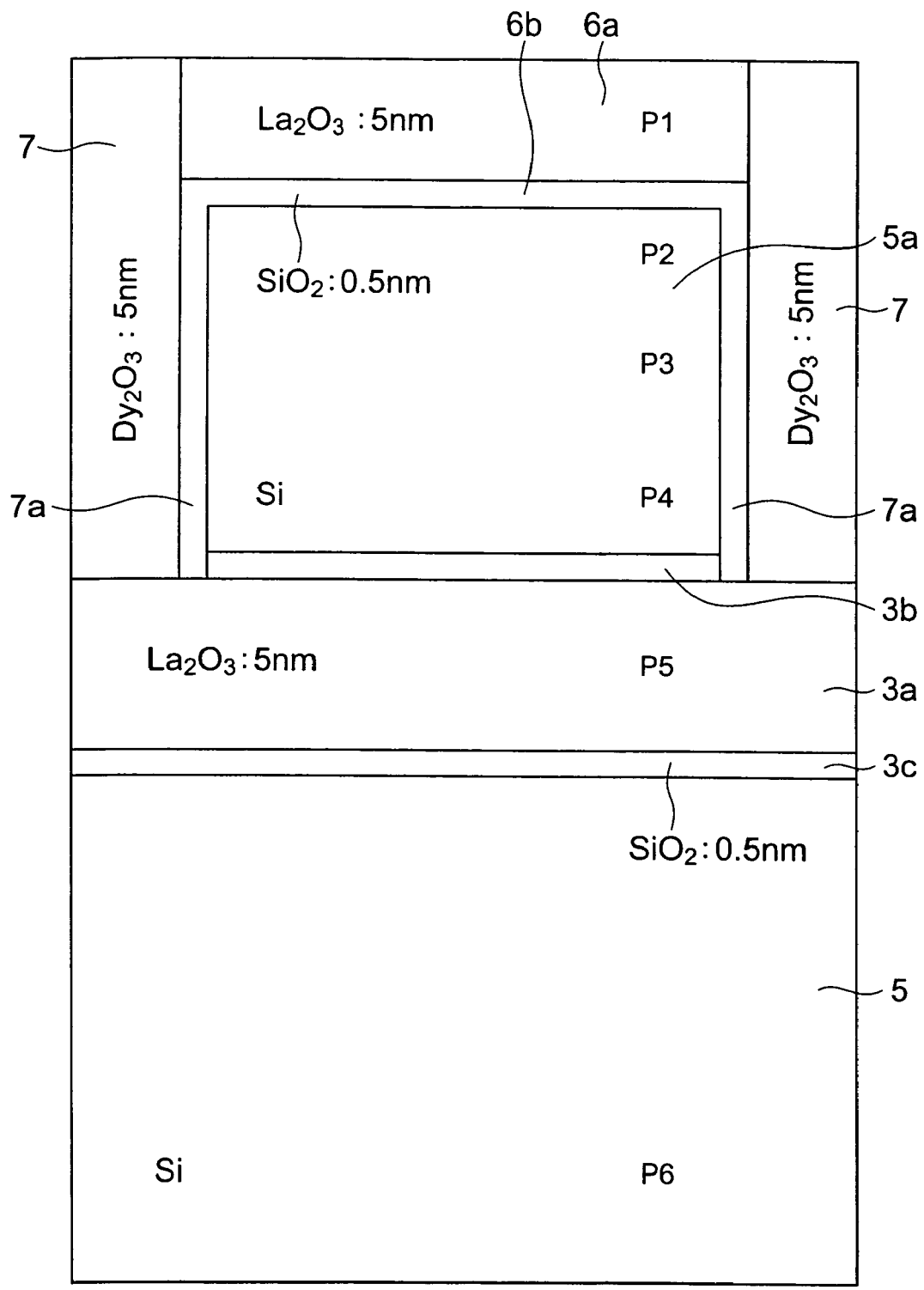
FIG. 29 depicts measurement positions of $Si/SiO_2/La_2O_3/SiO_2/Si/SiO_2/La_2O_3$ interfaces according to an eighth embodiment of the present invention.
Figure 30:
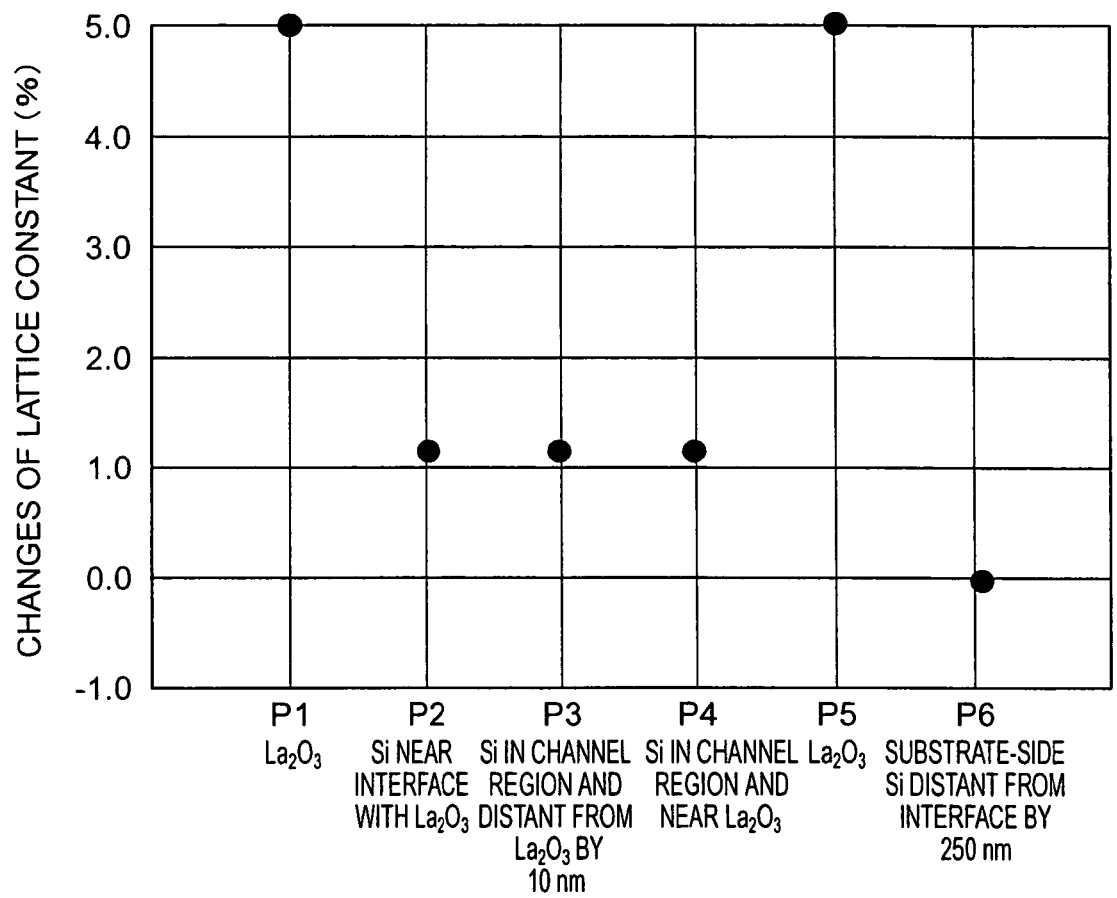
FIG. 30 is a chart that depicts changes of a lattice distance at the measurement positions shown in FIG. 29.

Characteristics of the channel region 5b of the n-MISFET according to this embodiment will next be described with reference to FIGS. 29 to 32. FIG. 29 is an enlarged view of the insulating film 3 having the layered structure of the SiO$_2$ layer 3b/La$_2$O$_3$ layer 3a/SiO$_2$ layer 3c and the channel region 5b, and is a typical view which depicts a cross-sectional structure. FIG. 30 depicts changes of the lattice distance obtained from an electron beam diffraction image measured using the TEM. The lattice distance measured herein is the lattice distance in a direction of (100) surface orientation parallel to the interface. As shown in FIG. 29, measurement points are a point P1 in the insulating film 6a consisting of La$_2$O$_3$, a point P2 of Si on the interface between the insulating film 6a consisting of SiO$_2$ and the Si layer 5a, a point P3 of Si in the channel region distant from the interface between the insulating film 6a and the Si layer 5a by ten nanometers, a point P3 of Si in the channel region 5b distant from the interface between the insulating film 6a and the Si layer 5a, a position P4 of Si near the interface between the insulating film 3a consisting of La$_2$O$_3$ and the Si layer 5a, a point P5 in the insulating film 3a, and a point P6 of Si distant from the interface between the insulating film 3a and the Si layer 5 by 250 nanometers. In FIG. 29, an SiO$_2$ layer 6b having a thickness of, for example, 0.5 nanometer is formed between the Si layer 5a and the insulating film 6a consisting of La$_2$O$_3$, and an SiO$_2$ layer 7a having a thickness of, for example, 0.5 nanometer is formed between the Si layer 5a and the gate insulating film 7 consisting of Dy$_2$O$_3$. The SiO$_2$ layer 6b is an oxide film formed during the formation of the insulating film 6a consisting of La$_2$O$_3$, and the SiO$_2$ layer 7a is an oxide film formed during the formation of the gate insulating film 7 consisting of Dy$_2$O$_3$.

In FIG. 30, changes of the lattice distance are shown with reference to the lattice distance of Si distant from the interface by 250 nanometers at the position P6. A lattice distance change of La$_2$O$_3$ that constitutes each of the insulating films 3a and 6a is +5.0%, which coincides with a result obtained from the X-ray diffraction. Si near the interface between the insulating film 6a and the Si layer 5a at the position P2 and Si near the interface between the insulating film 3a and the Si layer 5a at the position P4 are strained by +1.1% to follow the lattice distance change of La$_2$O$_3$. Even Si distant from the interface at the position P3 undergoes a lattice distance change, which is as large as +1.1%. This result shows that by using the insulating films larger in lattice distance than Si and each including the metal oxide having the high crystallinity as the underlying insulating film and the insulating film arranged above the channel region, respectively, and by arranging the insulating film including the metal oxide film having the high crystallinity as the gate insulating film, the lattice distance of the Si in the entire channel region can be made uniform and wide more effectively.

Figure 31:
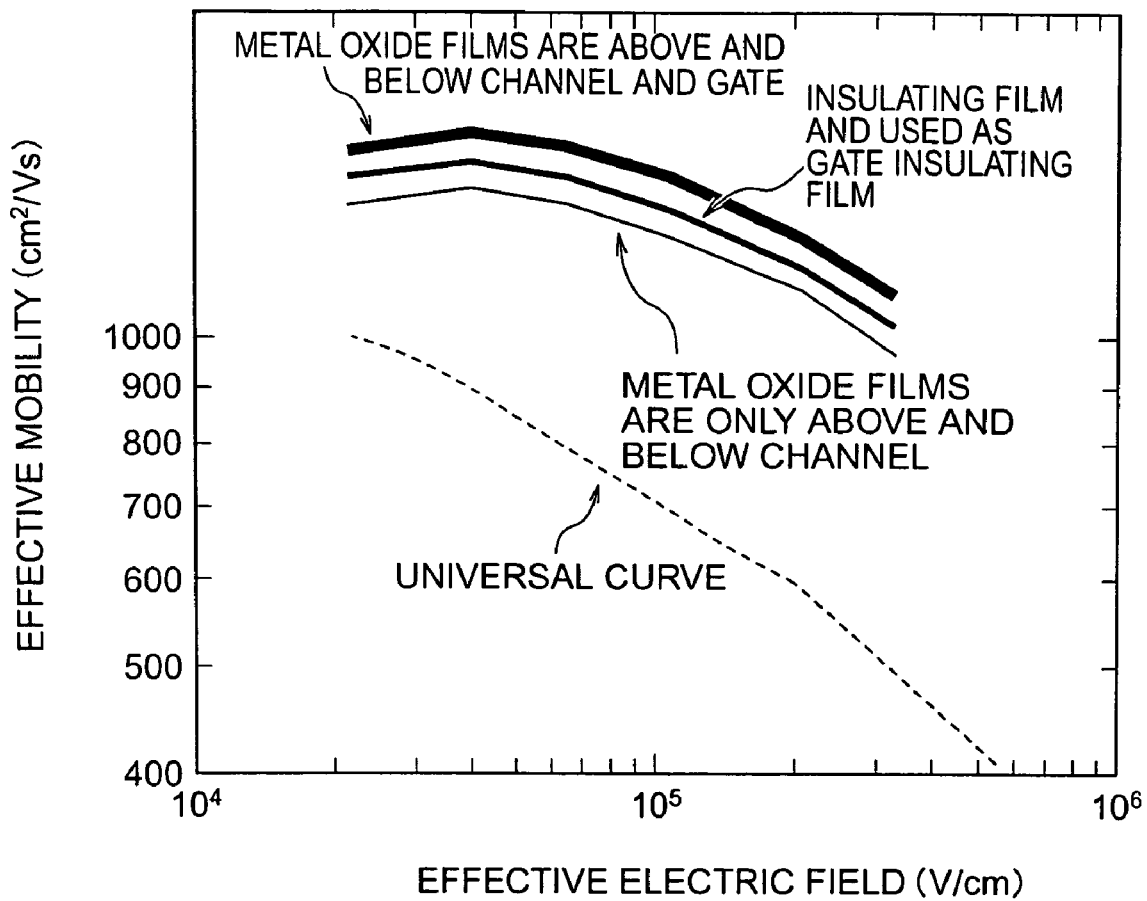
FIG. 31 is a characteristic chart which depicts the relationship between the effective electric field and the electron mobility of a new Fin FET according to the eighth embodiment and that according to the comparison example.
Figure 32:
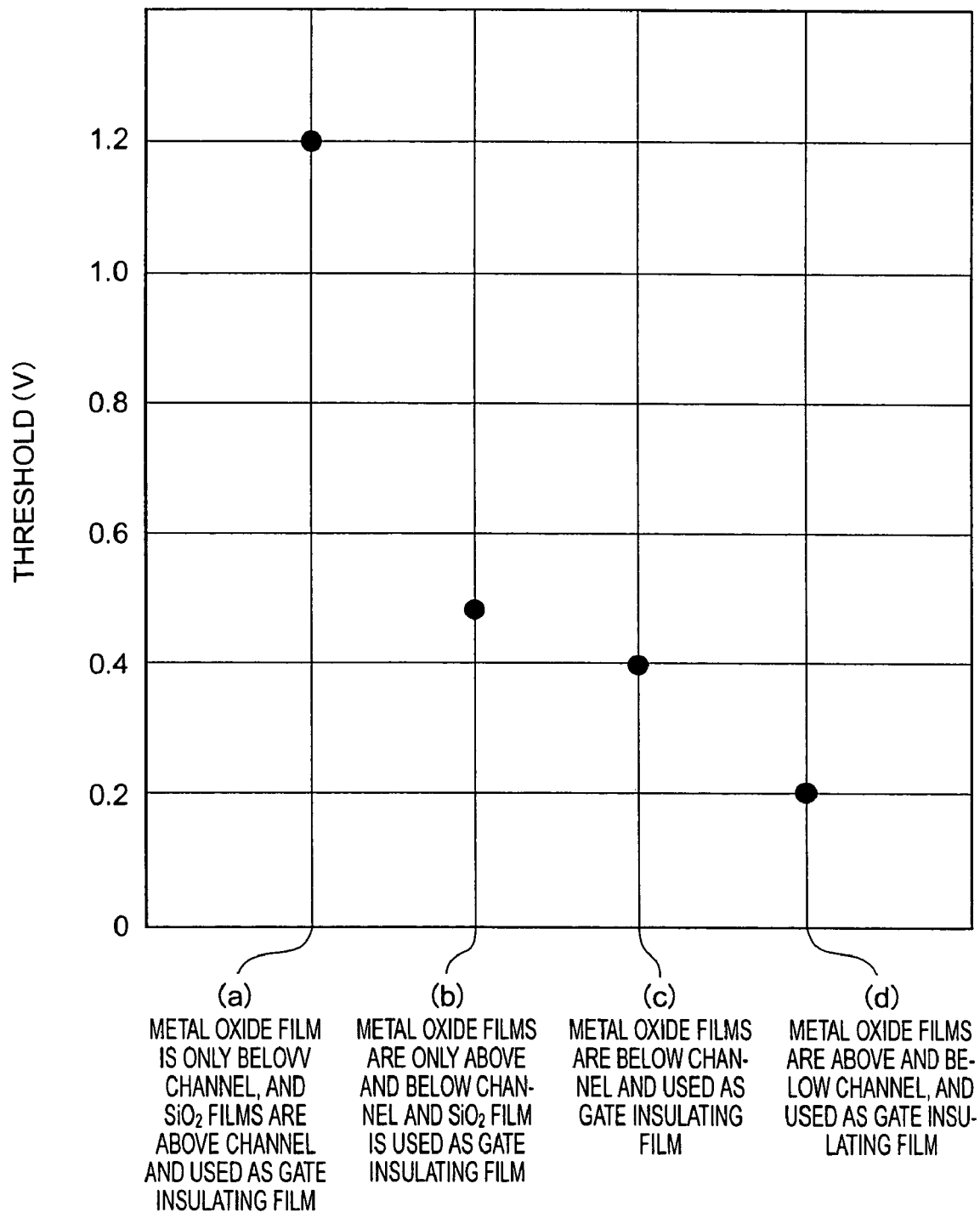
FIG. 32 is a chart which depicts the relationship of thresholds according to the eighth embodiment and that according to the comparison example.

Characteristics of a new Fin n-MOSFET in which crystalline metal oxides different in lattice distance from Si are used for the underlying insulating film, the insulating film above the channel region, and the gate insulating film, respectively according to this embodiment, a new Fin n-MOSFET in which crystalline metal oxides different in lattice distance from Si are used for the underlying insulating film and the insulating film above the channel region, respectively, and a new Fin n-MOSFET in which crystalline metal oxides different in lattice distance from Si are used for the underlying insulating film, the gate insulating film, respectively will be compared. FIG. 31 depicts the relationship between an effective electric field and an electron mobility. FIG. 32 depicts the relationship between a threshold and a structure.

Attention will be first paid to the relationship between the effective electric field and the electron mobility shown in FIG. 31. In FIG. 31, a broken line indicates a universal curve, a solid line (a thin line) indicates a characteristic curve of a new Fin n-MOSFET in which metal oxide films arranged above and below the channel region, respectively, a solid line (an intermediate thick line) indicates a characteristic curve of a new Fin n-MOSFET in which metal oxide films are arranged below the channel region and as the gate insulating film, and a solid line (a thick line) indicates a characteristic curve of a new Fin n-MOSFET in which metal oxide films are arranged as the insulating films above and below the channel region and as the gate insulating film, respectively. As is obvious from FIG. 31, the mobility is improved by using the metal oxide film as the gate insulating film. This is because a large tensile strain can be applied to the entire channel region by setting the lattice distance of the gate metal oxide film smaller than that of Si.

Attention will be next paid to the relationship between the structure and the threshold shown in FIG. 32. In FIG. 32, (a) shows a threshold of an instance in which the insulating film 3 is the metal oxide film and the insulating films 6a and 7 are the SiO$_2$ films, i.e., the first embodiment; (b) shows a threshold of an instance in which the insulating films 3 and 6a are the metal oxide films and the insulating film 7 is the SiO$_2$ film, i.e., the fifth embodiment; (c) shows a threshold of an instance in which the insulating films 3 and 7 are the metal oxide films and the insulating film 6a is the SiO$_2$ film, i.e., the seventh embodiment; and (d) shows a threshold of an instance in which the insulating films 3, 6a, and 7 are the metal oxide films, i.e., the eighth embodiment. A work function of the gate electrode is 4.2 eV and a channel concentration is $10^{15}$ cm$^{-3}$, so that it is estimated that all the thresholds are zero volt. However, in the instance of (a) in which the insulating film 3 is the metal oxide film and the insulating films 6a and 7 are the SiO$_2$ film, the threshold is as high as 1.2 volts. This is due to the structure of the Fin MOSFET and the fact that the gate insulating films 7 and 6a are the SiO$_2$ films. Since the Fin MOSFET has a double gate structure in which the side surfaces of the channel are surrounded by the gate electrode, a quantity of separated boron atoms is larger than that of the Fin MOSFET having a single gate, and the high threshold is exhibited. However, as shown in (b) and (c), by inserting the metal oxide film as one of the insulating films 6a and 7, the threshold is reduced to 0.4 volt. This is because the metal oxide film suppresses boron diffusion. Further, by using the metal oxide films as both the insulating films 6a and 7, the threshold is reduced down to 0.2 volt, thus exhibiting a further improvement. The reason that the threshold is not zero volt is as follows. Since the channel region is isolated, an electron energy level is quantized and a sub-band occurs (K. Uchida et al., "IEDM Tech. Dig." (2002)47).

As stated above in detail, according to this embodiment, the uniform tensile strain can be applied to Si in the entire channel region of the Fin transistor by using the metal oxide film as the gate insulating film. As compared with the instance of using the metal oxide films as the insulating films above and below the channel region or below the channel region and on the side surface of the channel region, the electron mobility can be improved. Further, by allowing the metal oxide film to suppress boron diffusion, the threshold can be controlled and a yield can be improved.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of S.

If the rare-earth oxide containing at least one selected from Ce, Dy, Y, La, Pr and Gd is used, in particular, a film having a high crystallinity scan be realized and a particularly excellent effect can be obtained.

The eighth embodiment has been described while referring to the instance of using $La_2O_3$ and $Dy_2O_3$ as the crystalline metal oxides. The crystalline metal oxide may be a crystalline oxide having a perovskite structure such as $SrTiO_3$, $SrZrO_3$, $Sr(TiZr)O_3$ or $SrCeO_3$. Further, even if an oxide having a rock-salt structure such as MgO, CaO, SrO or BaO, $Al_2O_3$, or $MgAl_2O_4$ having a spinel structure exhibits an equivalent effect. If a monocrystalline metal oxide film having uniform orientation is used, a larger lattice distance change occurs. As the film formation method for the crystalline metal oxide, the electron beam evaporation method has been used. Alternatively, the other film formation method such as the CVD method, the sputtering method, or the MBE method may be used.

In the eighth embodiment, the instance of using the Si substrate having (001) surface orientation has been described. However, the surface orientation of the Si substrate may be any one of (111), (111), and (110). Further, the surface orientation may be shifted from these surface orientations.

In the eighth embodiment, the n-MISFET has been described. However, the eighth embodiment can be carried out using a p-MISFET by the similar method. The selection of one of the crystalline metal oxides stated above depends on whether the tensile stress or the compressive stress is to be applied to Si. If the n-MISFET is manufactured, the electron mobility is improved in Si applied with the tensile stress. Therefore, the metal oxides larger in lattice distance than Si may be selected as those included in the insulating films 3 and 6a, respectively, and the metal oxide smaller in lattice distance than Si may be selected as that included in the insulating film 7. If the p-MISFET is manufactured, the hole mobility of the p-MISFET can be improved whether the tensile stress or the compressive stress. Therefore, the metal oxides larger in lattice distance than Si may be selected as those included in the insulating films 3 and 6a, respectively, and the metal oxide smaller in lattice distance than Si may be selected as that included in the insulating film 7. Alternatively, the metal oxides smaller in lattice distance than Si may be selected as those included in the insulating films 3 and 6a, respectively, and the metal oxide larger in lattice distance than Si may be selected as that included in the insulating film 7. In addition, depending on the stress to be applied to Si, the lattice distance of each metal oxide may be selected. If a desired lattice distance and a desired stress cannot be achieved by the metal oxide consisting only of one metal element, a metal oxide consisting of two or more metal elements may be used. For example, by using $(Eu_xDy_{1-x})_2O_3$ containing two metal elements of Eu and Dy, the lattice distance change of each metal oxide relative to Si can be arbitrarily varied in a range between zero to −1.8%.

Ninth Embodiment

Figure 33:
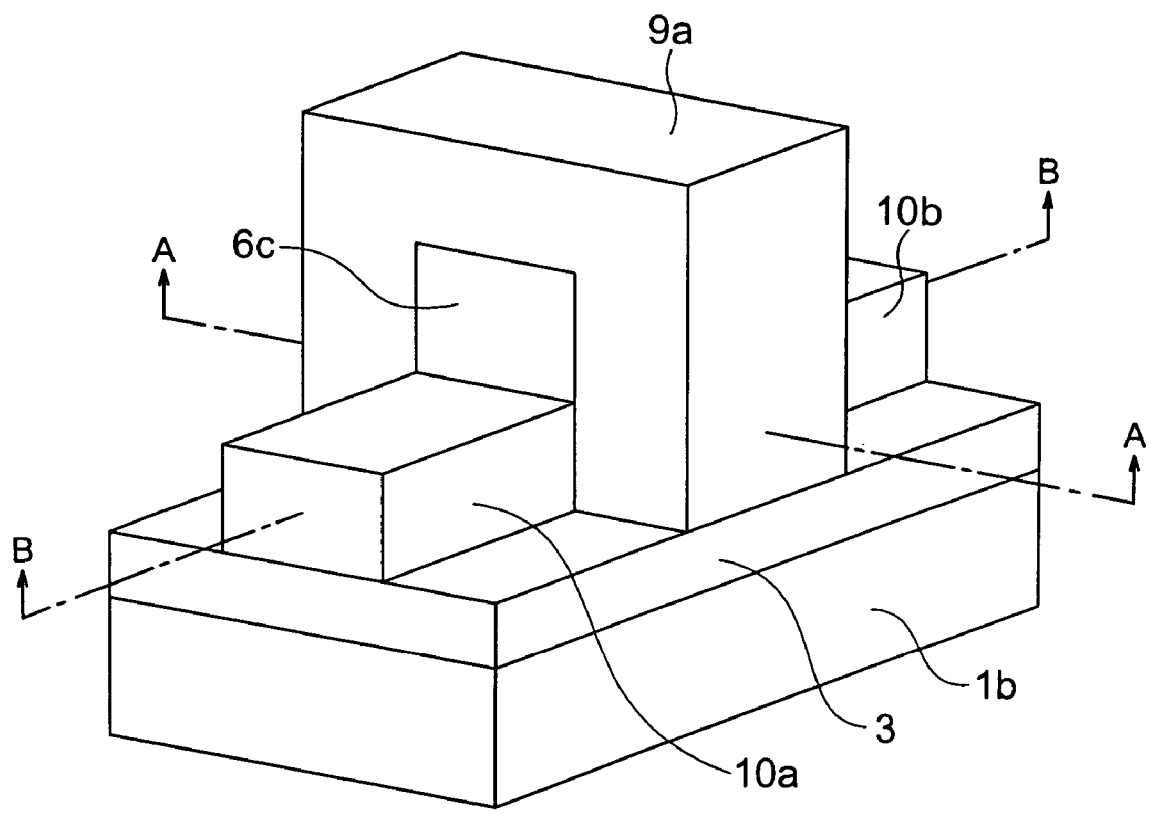
FIG. 33 is a perspective view which depicts configuration of an FET according to a ninth embodiment of the present invention.
Figure 34:
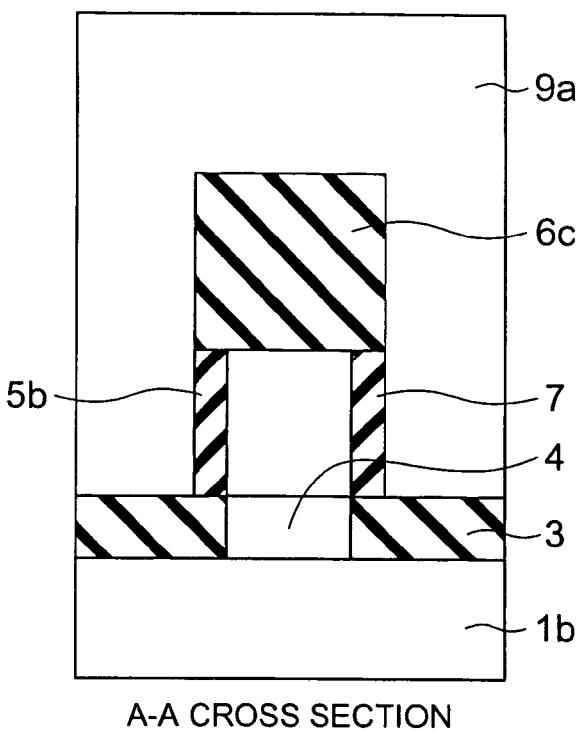
FIG. 34 is a cross-sectional view of the FET taken along a line A-A according to the ninth embodiment.
Figure 35:
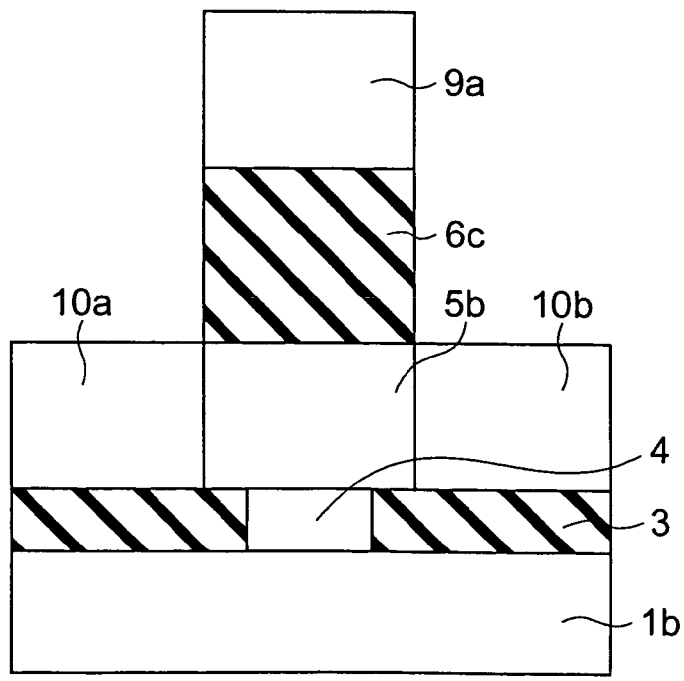
FIG. 35 is a cross-sectional view of the FET taken along a line B-B according to the ninth embodiment.

The configuration of an n-MISFET according to a ninth embodiment of the present invention will be described with reference to FIGS. 33 to 35. FIG. 33 is a perspective view of a Fin n-MISFET according to the ninth embodiment. FIG. 34 is a cross-sectional view taken along a line A-A of FIG. 33. FIG. 35 is a cross-sectional view taken along a line B-B of FIG. 33.

In the MISFET according to this embodiment, an insulating film 3 including at least a crystalline metal oxide is formed on a surface of a semiconductor substrate 1b consisting of Si. The metal oxide included in the insulating film 3 is a metal oxide a metal to oxygen blending ratio of which is a stoichiometric ratio. To electrically connect a channel region to be described later to the semiconductor substrate 1b, a region 4 which consists of a metal oxide a metal to oxygen blending ratio of which is lower than the stoichiometric ratio, e.g., $Sr(Ti_{0.16}Zr_{0.84})O_x$ is formed in the insulating film 3. Oxygen deficiency in $Sr(Ti_{0.16}Zr_{0.84})O_x$ occurs, a level occurs in a bandgap, and a conductive region is formed. By using this film formation method, a semiconductor interface can be electrically connected to a channel region by a simple method without forming bores in the insulating film 3.

A channel region (channel layer) 5b is formed on the region 4. Since lattice distances of the metal oxides that respectively constitute the insulating film 3 and the region 4 are larger than that of Si, Si in the channel region 5b is applied with stresses from the insulating film 3 and the region 4, thereby forming a strained Si layer. A source region 10a and a drain region 10b different in conduction type from the channel region 5b are formed on both sides of the channel region 5b, respectively. In addition, an insulating film 6c is formed right above the channel region 5b. A gate insulating film 7 is formed on side surfaces of the channel region 5b. A gate electrode 9a consisting of polysilicon is formed around the gate insulating film 7. Namely, according to this embodiment, the lattice distances of the metal oxide films are widened by Si and that of Si in the channel region is widened by the tensile stress. It is thereby possible to improve an electron mobility in the channel region.

Figure 42:
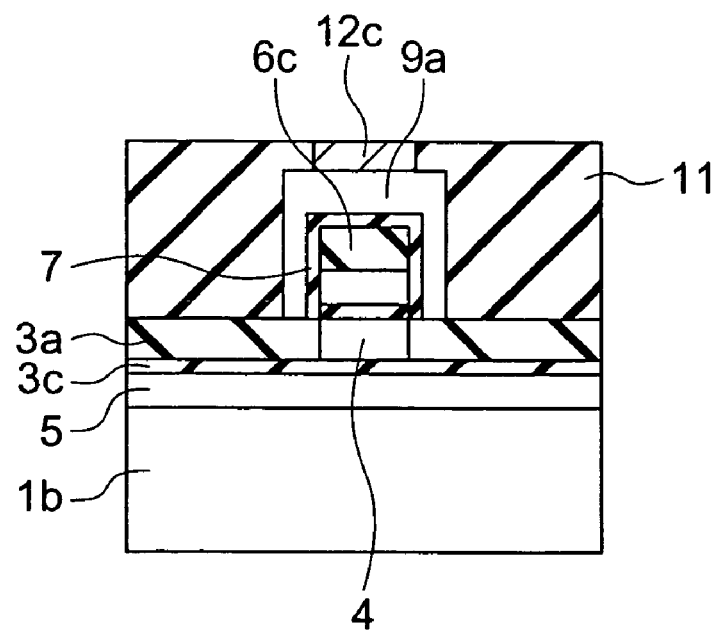
FIG. 42 is a cross-sectional view which depicts a manufacturing step of the method for manufacturing the FET according to the ninth embodiment.
Figure 43:
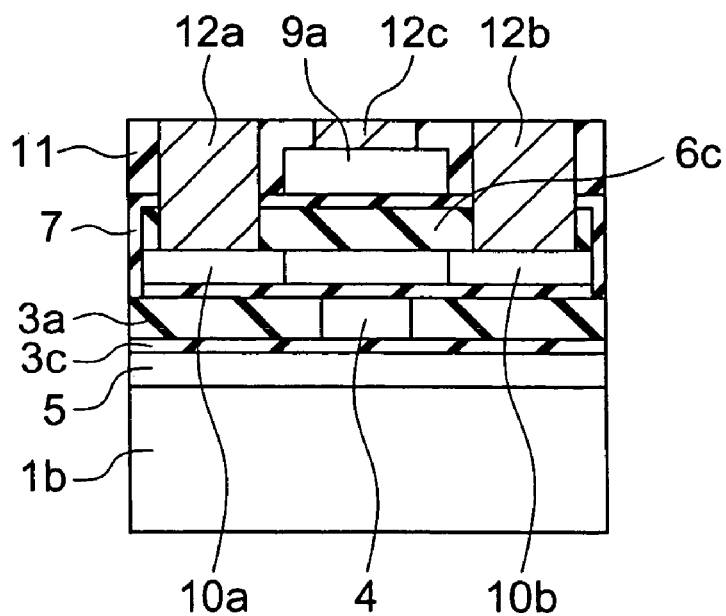
FIG. 43 is a cross-sectional view which depicts a manufacturing step of the method for manufacturing the FET according to the ninth embodiment.

A method for manufacturing the n-MISFET according to this embodiment will be described with reference to FIGS. 36A to 43. FIGS. 36A to 36E are manufacturing step cross-sectional views taken along the line A-A of FIG. 33, and FIGS. 37A to 37E are manufacturing step cross-sectional views corresponding to FIGS. 36A to 36E, respectively, and taken along the line B-B. FIGS. 38A to 38E are manufacturing step cross-sectional views taken along the line A-A of FIG. 33, and FIGS. 39A to 39E are manufacturing step cross-sectional views corresponding to FIGS. 38A to 38E, respectively, and taken along the line B-B. FIGS. 40A to 40D are manufacturing step cross-sectional views taken along the line A-A of FIG. 33, and FIGS. 41A to 41D are manufacturing step cross-sectional views corresponding to FIGS. 40A to 40D, respectively, and taken along the line B-B. FIG. 42 is a manufacturing step cross-sectional view taken along the line A-A of FIG. 33, and FIG. 43 is a manufacturing step cross-sectional view corresponding to FIG. 42, and taken along the line B-B.

First, hydrogen ions, for example, are implanted into a Si substrate 1a having (001) surface orientation at an energy of a dosage of $5\times10^{16}/cm^2$ and a peak range of, for example, a 50-nanometer depth from a surface, thereby forming a high hydrogen concentration region.

To recover the Si substrate 1a from a damage caused by the ion implantation, the Si substrate 1a is subjected to a heat treatment in a hydrogen atmosphere at 800° C. for 30 minutes, for example. By subjecting the Si substrate 1a to the heat treatment, the substrate 1a is recovered from the damage, an intermediate layer 2 having a lower mechanical strength than that of surroundings of the intermediate layer 2 is formed in the high hydrogen concentration region. At the same time, a silicon layer 5a to serve as the channel region is formed (see FIGS. 36A and 37A). Microscopic vacancies are continuously formed in the intermediate layer 2, so that the intermediate layer has the lower mechanical strength.

A depleted hydrofluoric acid treatment is carried out to terminate an Si surface of the Si substrate 1a by hydrogen. The resultant substrate 1a is introduced into the MBE system. While a substrate temperature is set at, for example, 500° C. and Sr, Zr, and Ti are used as evaporation sources, a metal oxide film 3a consisting of $Sr(Ti_{0.16}Zr_{0.84})O_x$ by a thickness of five nanometers (see FIGS. 36B and 37B). At this time, an oxygen blending ratio of the $Sr(Ti_{0.16}Zr_{0.84})O_x$ film thus formed is the stoichiometric ratio (x=3.0) and a lattice distance of $Sr(Ti_{0.16}Zr_{0.84})O_x$ parallel to an interface with Si is 5.50 angstroms. Further, Si on a surface of the Si layer 5a is oxidized, and an $SiO_2$ layer having a thickness of 0.5 nanometer is formed between the Si layer 5a and the $Sr(Ti_{0.16}Zr_{0.84})O_x$ layer 3a. Namely, the insulating film 3 includes a layered structure composed by the $SiO_2$ layer having a thickness of 0.5 nanometer and the $Sr(Ti_{0.16}Zr_{0.84})O_x$ layer 3a having a thickness of five nanometers. At this time, a lattice distance of the metal oxide layer 3a is larger than that of Si, a strain of +0.3% is applied to Si.

Figure 36A:
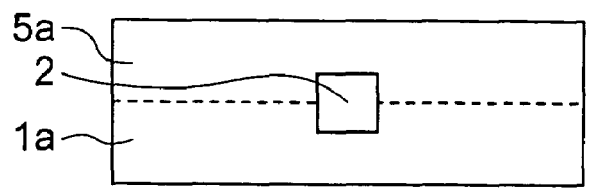
FIGS. 36A to 36E are cross-sectional views which depict manufacturing steps of a method for manufacturing the FET according to the ninth embodiment.
Figure 36B:
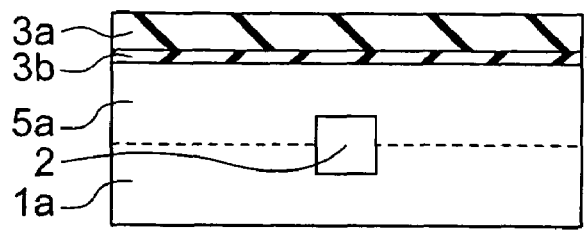
Figure 36C:
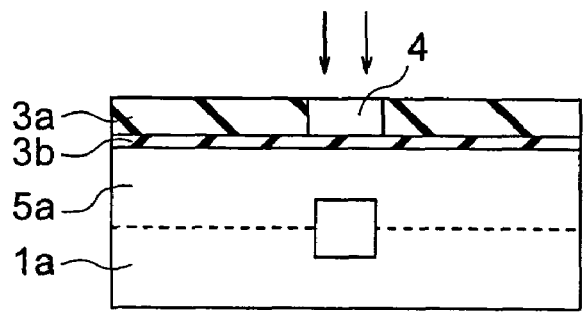
Figure 37A:
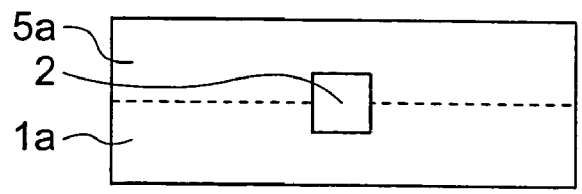
FIGS. 37A to 37E are cross-sectional views which depict manufacturing steps of the method for manufacturing the FET according to the ninth embodiment.
Figure 37B:
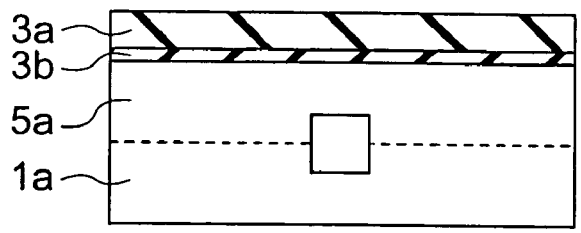
Figure 37C:
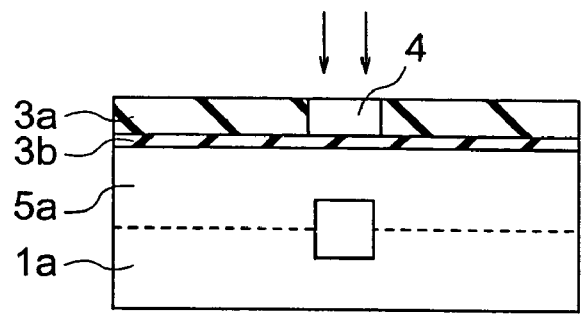

As shown in FIGS. 36C and 37C, a laser beam is locally irradiated to the $Sr(Ti_{0.16}Zr_{0.84})O$ layer 3a. In the region 4 irradiated with the laser beam, the oxygen blending ratio x is reduced to 2.7. A lattice distance of this region 4 is as large as 5.56 angstroms, so that the conductive region 4 is formed. This is because the irradiation of the laser beam causes oxygen deficiency and a level occurs in a bandgap, accordingly. At this time, a lattice distance of the conductive region is larger than that of Si. Therefore, Si in a region below the conductive region is applied with a strain of +1.0%.

Figure 36D:
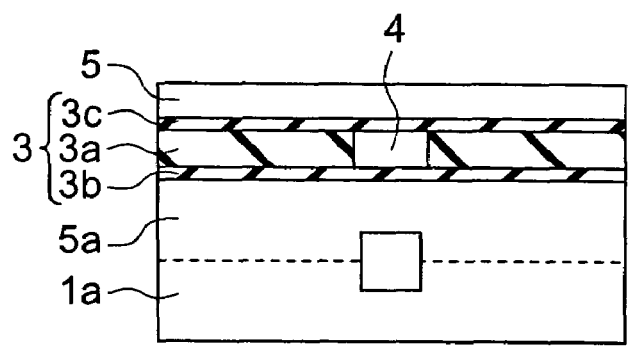
Figure 37D:
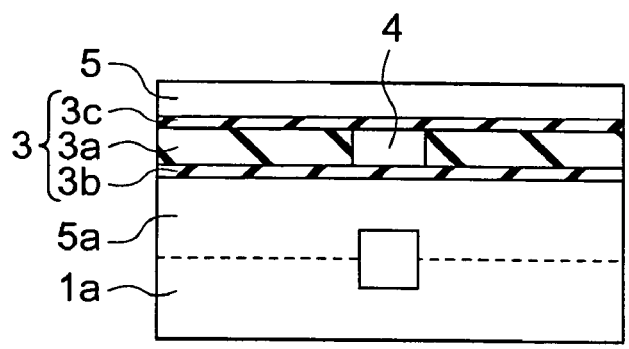

Next, an Si layer 5 having a thickness of, for example, one micrometer is formed by the CVD method (see FIGS. 36D and 37D). At this time, Si on a metal oxide layers 3a and 4-side interface of the Si layer 5 is oxidized, and an $SiO_2$ layer 3c having a thickness of 0.5 nanometer is formed between the Si layer 5 and the metal oxide layers 3a and 4. Namely, with this manufacturing method, the insulating film 3 having a three-layer structure composed by the $SiO_2$ layer 3b having a thickness of 0.5 nanometer, the metal oxide layer 3a having a thickness of five nanometers, and the $SiO_2$ layer 3c having a thickness of 0.5 nanometer is formed between the Si layers 5a and 5 (see FIGS. 36D and 37D).

Figure 36E:
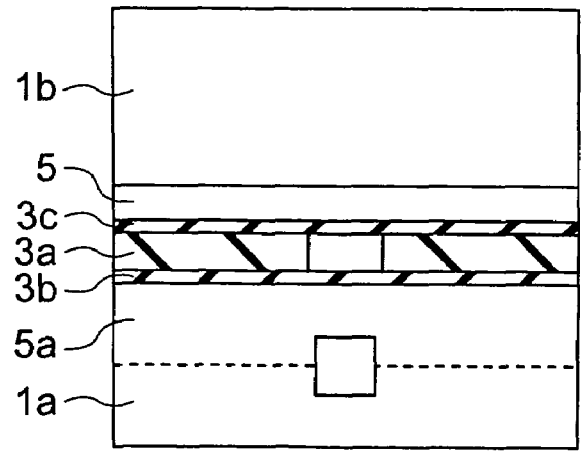
Figure 37E:
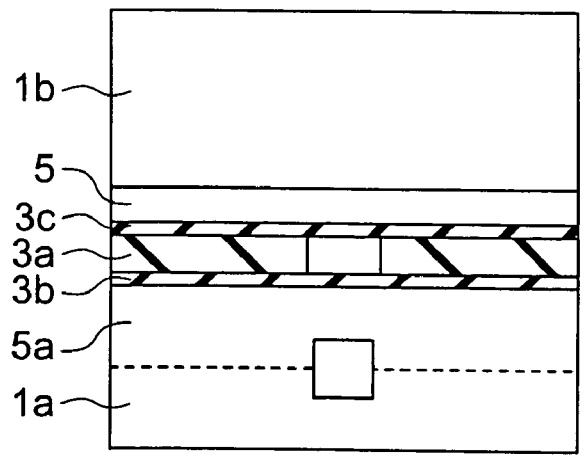

A surface of the Si layer 5 is bonded to the substrate 1b (see FIGS. 36E and 37E). Thereafter, the substrate 1b is peeled off with the intermediate layer 2 set as a boundary, thereby exposing the Si layer 5a onto the insulating film 3 consisting of the metal oxide. The exposed surface of the Si layer 5a is planarized by, for example, the CMP method (see FIGS. 38A and 39A). An impurity profile can be then formed in the Si layer 5a, to serve as the channel region, by implanting element ions.

A depleted hydrofluoric acid treatment is carried out to terminate an Si surface of the Si layer 5a by hydrogen. The resultant substrate 1b s introduced into the MBE system. While the substrate temperature is set at, for example, 500° C. and $CeO_2$ is used as an evaporation source, an insulating film 6 including a metal oxide consisting of a Ce oxide is formed by a thickness of five nanometers (see FIGS. 38B and 39B). The Ce oxide formed at this time has an oxygen blending ratio of the stoichiometric ratio (x=2.0) and a lattice distance of 5.41 angstroms.

A laser beam is irradiated to the insulating film 6 consisting of the Ce oxide, thereby forming an insulating film 6a. After the irradiation of the laser beam, an oxygen blending ratio of the insulating film 6a is measured. As a result, the oxygen blending ratio x is reduced to 1.77 and the lattice distance is widened to 5.48 angstroms (see FIGS. 38C and 39C). This is because oxygen deficiency occurs and the oxygen blending ratio of the Ce oxide that constitutes the insulating film 6a is thereby reduced. By using such a method, the Ce oxide layer 6b having the wide lattice distance can be formed. An instance of irradiating the laser beam has been described herein. However, even if a heat treatment, electron beam irradiation, or electromagnetic wave irradiation is performed, the effect of reducing the oxygen ratio can be achieved. Further, by widening the lattice distances of the conductive region 4 and the Ce oxide layer 6b, Si in the channel region 5b above the conductive region 4 is applied with a uniform strain of +1.0%.

Figure 38A:
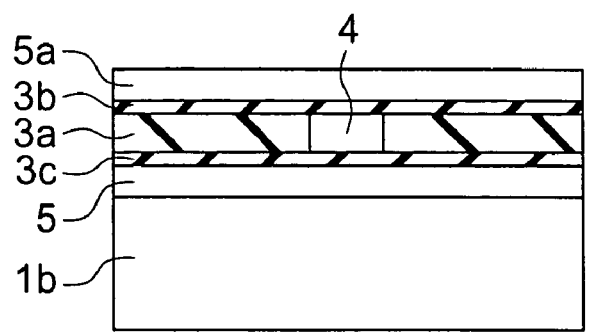
FIGS. 38A to 38E are cross-sectional views which depict manufacturing steps of the method for manufacturing the FET according to the ninth embodiment.
Figure 38B:
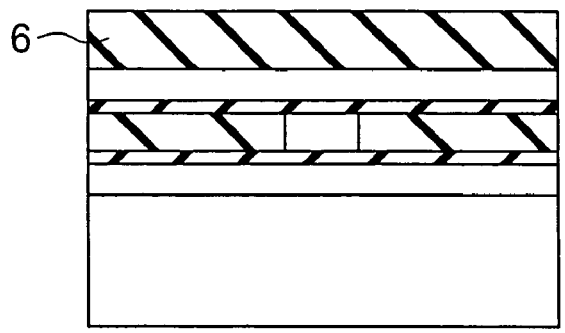
Figure 38C:
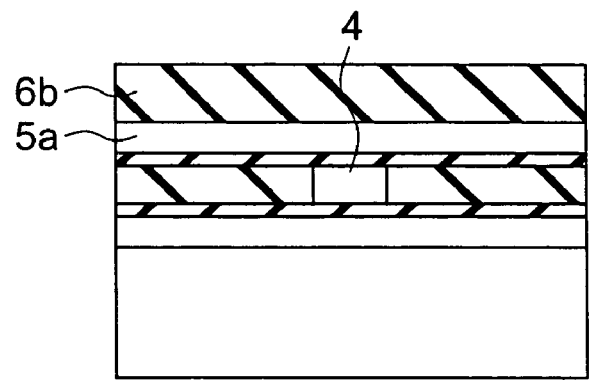
Figure 38D:
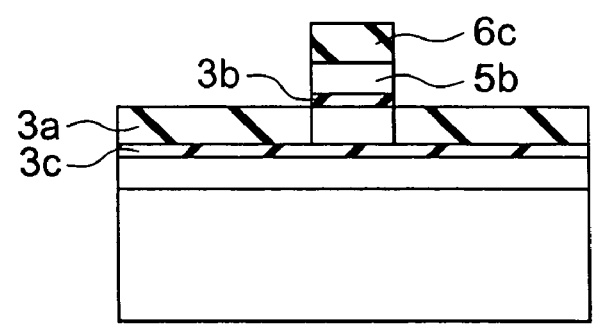
Figure 38E:
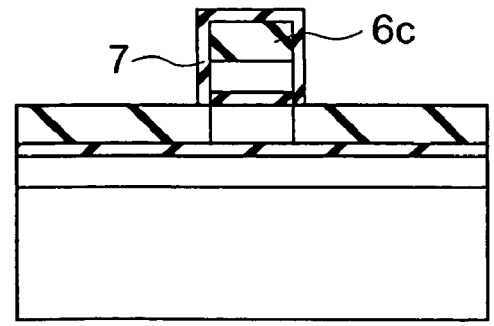
Figure 39A:
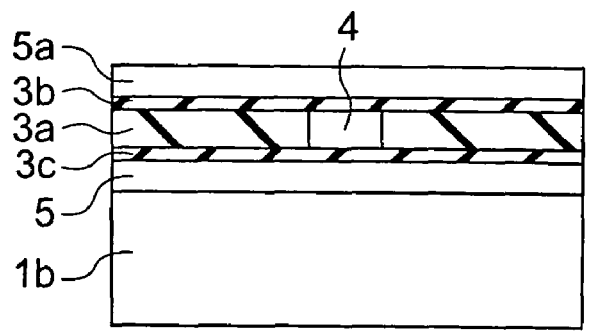
FIGS. 39A to 39E are cross-sectional views which depict manufacturing steps of the method for manufacturing the FET according to the ninth embodiment.
Figure 39B:
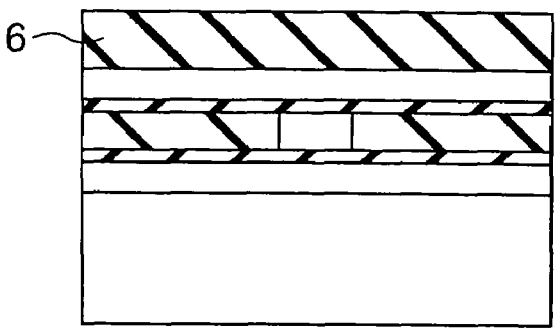
Figure 39C:
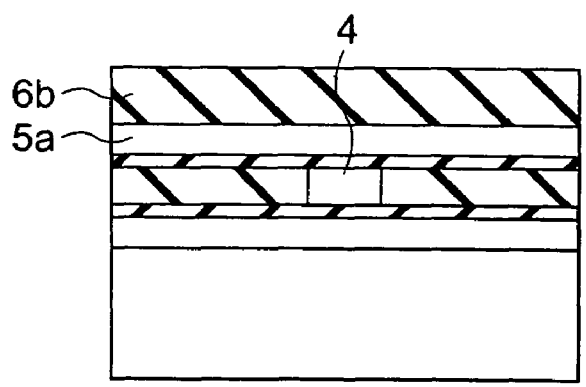
Figure 39D:
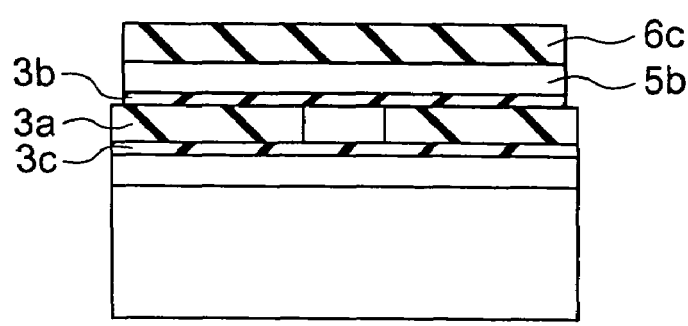
Figure 39E:
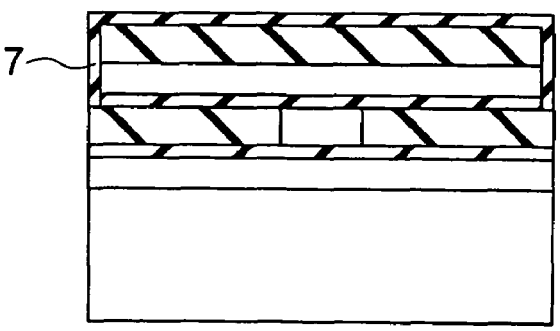

The insulating film 6b and the Si layer 5a are patterned by an anisotropic etching method such as the RIE method, thereby forming a channel region 5b right above the region 4 as shown in FIGS. 38D and 39D. At the same time, the SiO.sub.2 layer 3b formed between the Si layer 5a and the insulating film 3 is patterned.

Next, the resultant substrate 1 bis introduced into the electron beam evaporations system. While the substrate temperature is set at, for example, 600° C. and $Dy_2O_3$ is used as an evaporation source, a metal oxide $Dy_2O_3$ is evaporated by a thickness of five nanometers, thereby forming a gate insulating film 7 including $Dy_2O_3$ around the channel region 5b (see FIGS. 38E and 39E). At this time, a height (gate width) of a Fin channel region is set at 20 nanometers, a Fin width (channel region width) is set at 20 nanometers, and a Fin length is set at 200 nanometers, for example. In addition, the oxygen partial pressure is precisely controlled to $5 \times 10^{-7}$ Torr, thereby improving an orientation degree of $Dy_2O_3$ and the crystallinity thereof.

Figure 40A:
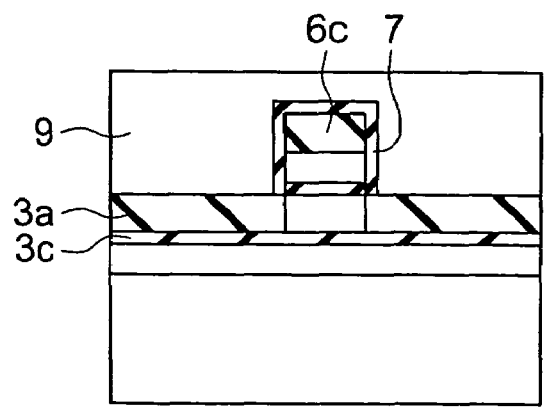
FIGS. 40A to 40D are cross-sectional views which depict manufacturing steps of the method for manufacturing the FET according to the ninth embodiment.
Figure 40B:
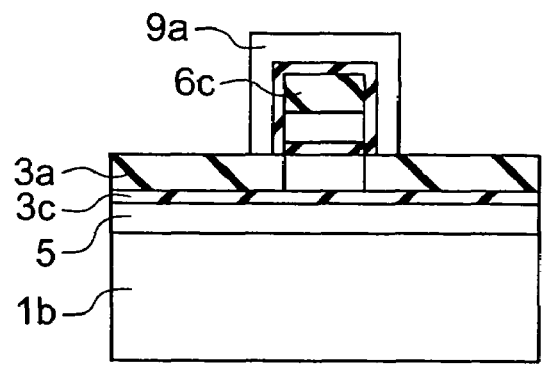
Figure 40C:
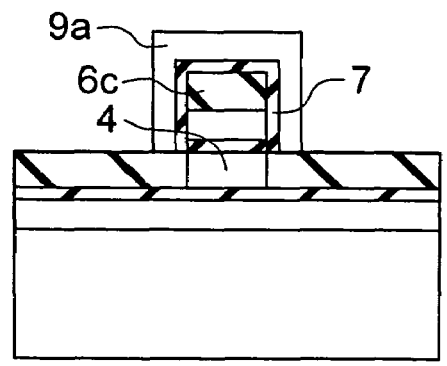
Figure 40D:
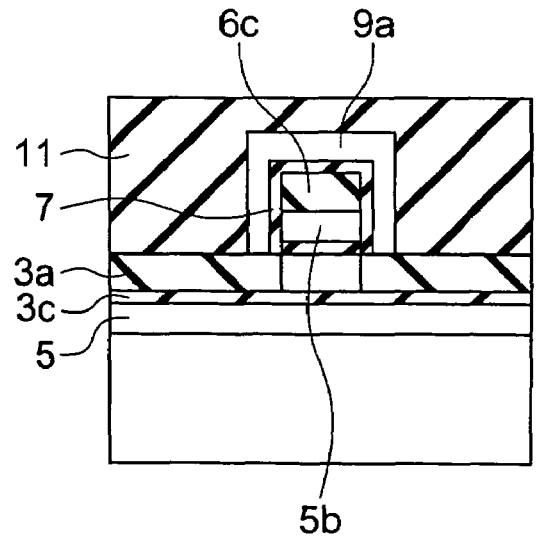

A polysilicon film 9 is deposited on entire surfaces by the CVD method (see FIGS. 40A and 41A). The polysilicon film 9 is patterned by the anisotropic etching method such as the RIE method, thereby forming a gate electrode 9a (see FIGS. 40B and 41B). Using the gate electrode 9a as a mask, ion implantation and a heat treatment are carried out, thereby forming the source and drain regions 10a and 10b doped with impurities (see FIGS. 40C and 41C). An $SiO_2$ film 11 is deposited on the entire surfaces by the CVD Method (see FIGS. 40D and 41D).

As shown in FIGS. 42 and 43, contact holes are formed on the source and drain regions 10a and 10b, metal such as Al is evaporated to form a metal film on the entire surfaces, thereby forming source and drain electrodes 12a and 12b and a gate electrode 12c. The n-MISFET is thus completed.

Figure 44:
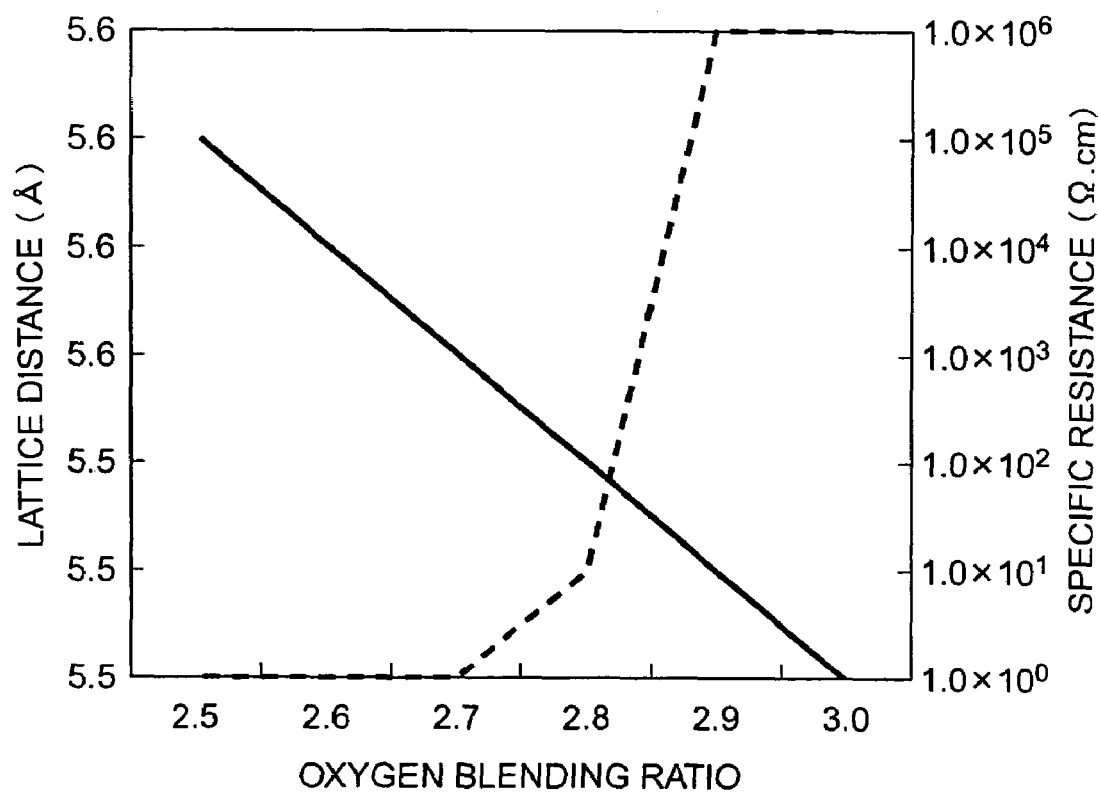
FIG. 44 is a chart which depicts the relationship between a blending ratio of metal to oxygen and a lattice spacing of $Sr(Ti_{0.16}Zr_{0.84})O_x$ of the FET according to the ninth embodiment.

Referring next to FIG. 44, the relationship among the oxygen blending ratio, the lattice distance, and the specific resistance of $Sr(Ti_{0.16}Zr_{0.84})O_x$ will be described. The oxygen blending ratio is measured by the EDX. When the oxygen blending ratio is the stoichiometric ratio (x=3.0), the lattice distance is 5.50 angstroms. If the oxygen blending ratio is lower than the stoichiometric ratio and less than 3.0 (x<3.0), the lattice distance is widened. The reason that the lattice distance of $Sr(Ti_{0.16}Zr_{0.84})O_x$ is greatly changed according to the oxygen blending ratio is considered as follows.

$Sr(Ti_{0.16}Zr_{0.84})O_x$ is a crystal forming strong ionic bonds. The lower the oxygen ratio is, the lower the specific resistance becomes. This is because oxygen deficiency occurs in the film by reducing the oxygen blending ratio, and a level in the bandgap occurs.

Figure 45:
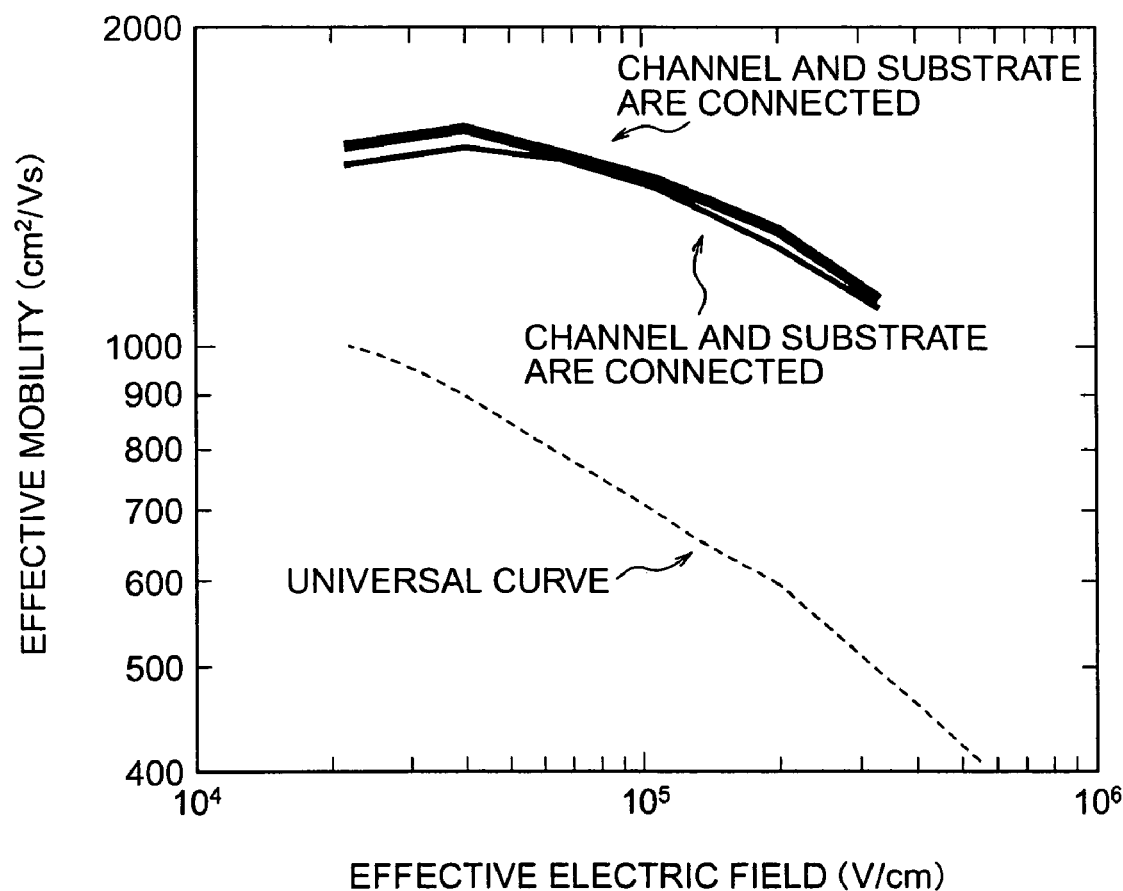
FIG. 45 is a characteristic chart which depicts the relationship between the effective electric field and the electron mobility of a new Fin FET according to the ninth embodiment and that according to the comparison example.
Figure 46:
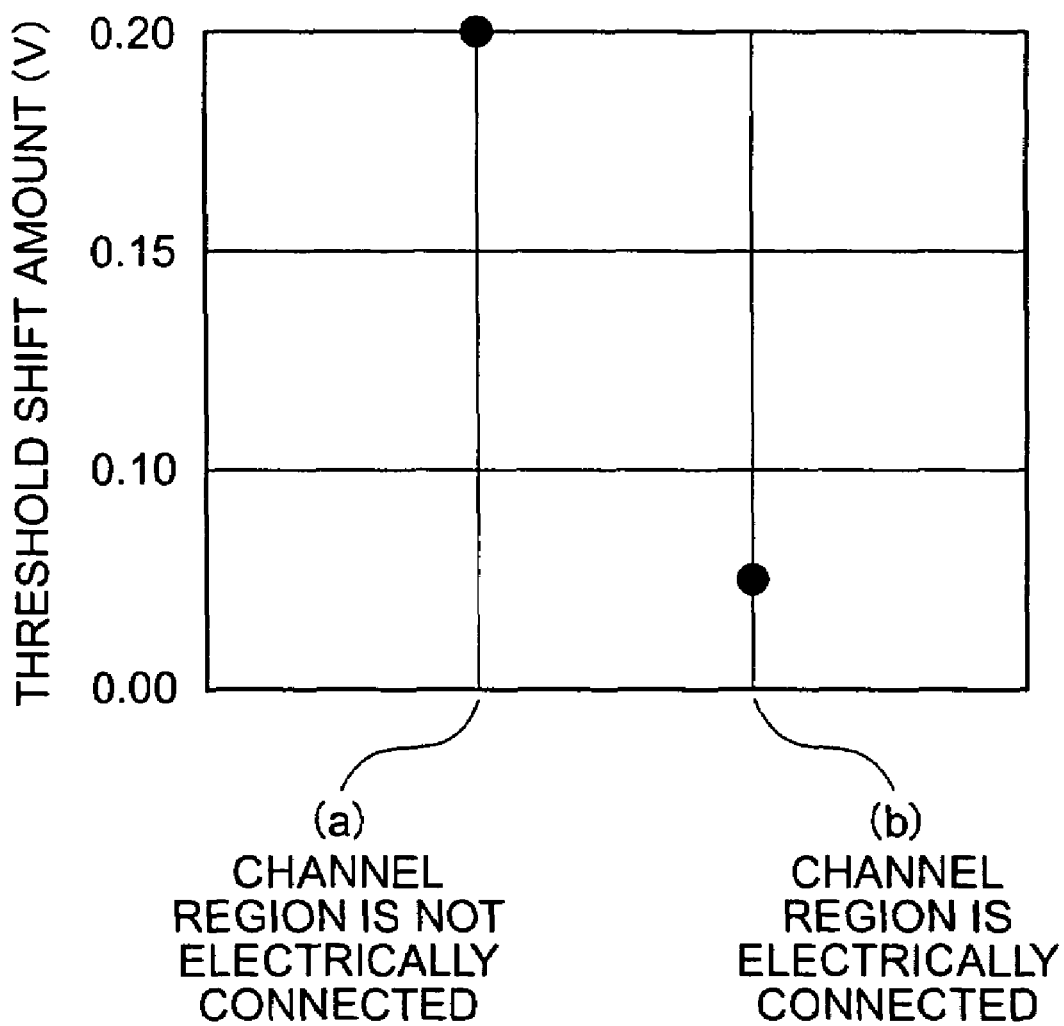
FIG. 46 is a chart which depicts threshold shift amounts according to the ninth embodiment and the comparison example.

Characteristics of a new Fin n-MOSFET according to this embodiment in which crystalline metal oxides different in lattice distance from Si are used as a underlying insulating film ($Sr(Ti_{0.16}Zr_{0.84})O_x$), an insulating film above the channel region ($La_2O_3$), and a gate insulating film ($Dy_2O_3$), respectively, and in which the semiconductor substrate is electrically connected to the channel region, and a new Fin n-MOSFET in which the insulating films are provided similarly to the new Fin n-MOSFET according to the present invention, and in which the channel region is electrically isolated from the semiconductor substrate will be compared. FIGS. 45 and 46 depict a difference between (a) the new Fin n-MOSFET in which the channel region is not electrically connected to the semiconductor substrate and (b) the new Fin n-MOSFET according to this embodiment in which the channel region is electrically connected to the semiconductor substrate with the gate electrode as $Dy_2O_3$ having the thickness of five nanometers and with the with the reference of threshold of plane n-MOSFET without a insulating layer below it. As is obvious from FIGS. 45 and 46, by electrically connecting the channel region to the semiconductor substrate, a threshold is lowered and the difference with a plane n-MOSFET is reduced to 0.05 volt. The reason is as follows. Since the channel region is electrically connected to the semiconductor substrate, a threshold shift due to the quantization of an electronic energy level and the occurrence of a sub-band as seen in the instance in which the channel region is electrically isolated from the semiconductor substrate can be avoided. Further, if attention is paid to a mobility, the mobility is improved by electrically connecting the channel region to the semiconductor substrate (see FIG. 46). The reason is as follows. By electrically connecting the channel region to the semiconductor substrate, hole accumulation can be prevented and, accordingly, the deterioration of the mobility due to carrier scattering caused by the hole accumulation can be avoided.

As stated above in detail, according to this embodiment, the channel region can be electrically connected to the semiconductor substrate more easily than conventional SOI-MISFET and Fin MISFET, and the change of threshold due to the sub band and the deterioration of the electron mobility caused by the hole accumulation can be prevented, and the mobility can be thereby improved more effectively.

The ninth embodiment has been described while referring to the instance of using $Sr(Ti_{0.16}Zr_{0.84})O_x$ as the crystalline metal oxide. The crystalline metal oxide may be a crystalline oxide having a perovskite structure such as $SrTiO_3$, $SrZrO_3$, $Sr(TiZr)O_3$ or $SrCeO_3$. Further, even if $Al_2O_3$ or $MgAl_2O_4$ having a spinel structure is used, the equivalent advantage can be obtained by reducing the oxygen blending ratio thereof. As the film formation method for the crystalline metal oxide, the MBE method has been used. Alternatively, the other film formation method such as the CVD method, the sputtering method, or the electron beam evaporation method may be used.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of S. If the rare-earth oxide containing at least one selected from Ce, Dy, Y, La, Pr and Gd is used, in particular, a film having a high crystallinity scan be realized and a particularly excellent effect can be obtained.

In the ninth embodiment, the n-MISFET has been described. However, a p-MISFET can be carried out by the same method.

In the ninth embodiment, the instance of using the Si substrate having (001) surface orientation has been described. However, the surface orientation of the Si substrate may be any one of (111), (111), and (110). Further, the surface orientation may be shifted from these surface orientations.

Furthermore, in the fifth to the ninth embodiments, with a view of straining Si in the channel region more effectively, metal oxides each having a rock-salt structure may be put between the crystalline metal oxide arranged above the channel region, the crystalline metal oxide on the Si substrate, and the crystalline metal oxide included in the gate insulating film, and the channel region, respectively. The effect is equivalent to that described in the fourth embodiment in detail. By providing the metal oxides each having the rock-salt structure therebetween, respectively, no amorphous $SiO_2$ layer is formed on an interface with the crystalline oxide, and the difference in lattice distance can influence the Si channel region more directly. Further, the crystallinity of the channel Si region can be improved. A thickness of the oxide having the rock-salt structure is preferably in a range between one to three atomic layers. A matter such as SrO or MgO is unstable in the air. Due to this, if the thickness of the SrO layer is made larger than the two atomic layer, the crystallinity of the SrO layer changes with the passage of time and the characteristic thereof is deteriorated. If the thickness is smaller than one atomic layer, the effect of suppressing oxygen diffusion cannot be obtained and the amorphous $SiO_2$ layer is generated. If the metal oxide film having the rock-salt structure such as SrO, MgO, CaO, or BaO film, in particular, the effect of suppressing oxygen diffusion can be conspicuously observed and the transistor characteristics can be greatly improved. If the tensile stress is to be applied to Si, BaO that is the metal oxide having the rock-salt structure and larger in lattice distance than Si is preferably used. If the compressive stress is to be applied to Si, SrO, MgO, or CaO that is the metal oxide having the rock-salt structure and smaller in lattice distance than Si is preferably used. However, the lattice distance change of the Si layer mainly depends on the crystalline metal oxide having a large thickness. In the structure, for example, in which SrO smaller in lattice distance than Si is provided, and in which $Pr_2O_3$ larger in lattice distance than Si is provided on SrO, Si in the channel region is applied with the tensile stress. Therefore, a combination of the metal oxide having the rock-salt structure and the crystalline metal oxide can be arbitrarily selected. Further, the metal oxide each having the rock-salt structure are not always put between the crystalline metal oxide included in the insulating film below the channel region and different in lattice distance from Si, the crystalline metal oxide included in the insulating film above the channel region and different in lattice distance from Si, and the crystalline metal oxide included in the gate insulating film and different in lattice distance from Si, and the channel region, respectively. Even if the metal oxide having the rock-salt structure is put one of between the crystalline metal oxide arranged above the channel region, the crystalline metal oxide on the Si substrate, and the crystalline metal oxide included in the gate insulating film, and the channel region, the equivalent effect can be achieved.

In the ninth embodiment, the instance of using the metal oxides as the insulating films 6c and 7 has been described.

Alternatively, at least one of the insulating films 6c and 7 may consist of an insulator other than the metal oxide film.

Tenth Embodiment

Figure 47:
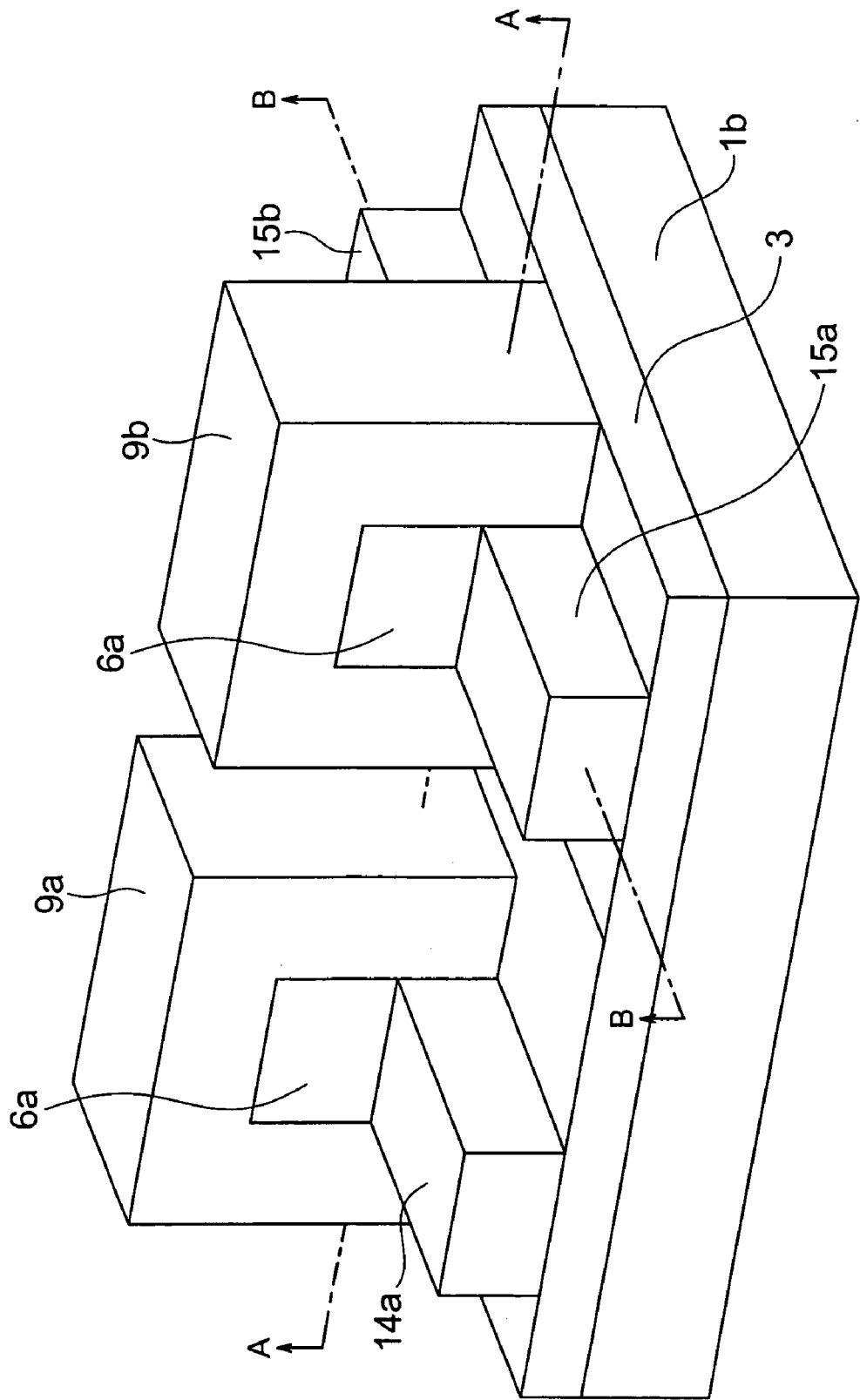
FIG. 47 is a perspective view which depicts configuration of an FET according to a tenth embodiment of the present invention.
Figure 48:
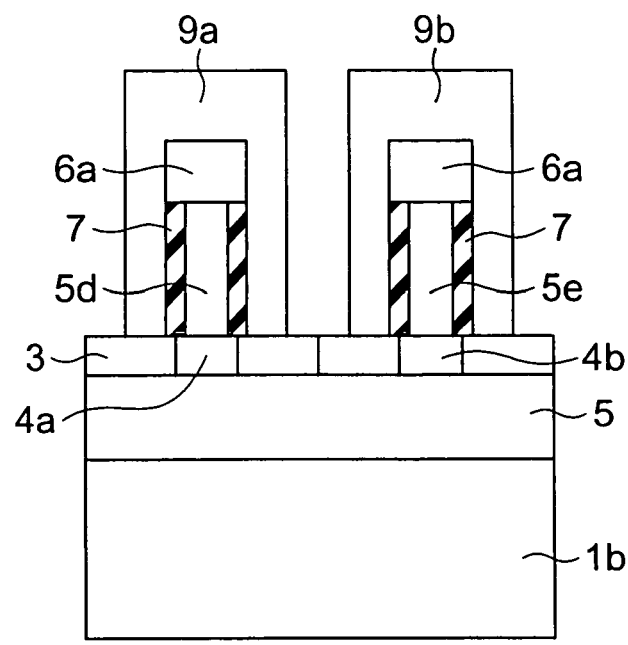
FIG. 48 is a cross-sectional view of the FET taken along a line A-A according to the tenth embodiment.
Figure 49:
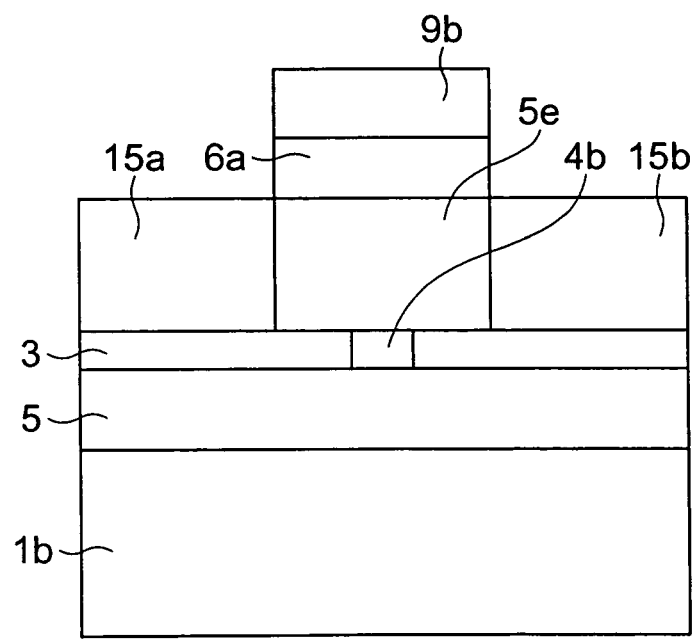
FIG. 49 is a cross-sectional view of the FET taken along a line B-B according to the tenth embodiment.

The configuration of a semiconductor device including an n-MISFET and a p-MISFET according to a tenth embodiment of the present invention will be described with reference to FIGS. 47 to 59. FIG. 47 is a perspective view of the semiconductor device according to the ninth embodiment. FIG. 48 is a cross-sectional view taken along a line A-A of FIG. 47. FIG. 49 is a cross-sectional view taken along a line B-B of FIG. 47. A method for manufacturing the semiconductor device according to this embodiment will be described with reference to FIGS. 50A to 59. FIGS. 50A to 50F are manufacturing step cross-sectional views taken along the line A-A of FIG. 47, and FIGS. 51A to 51F are manufacturing step cross-sectional views corresponding to FIGS. 50A to 50F, respectively, and taken along the line B-B. FIGS. 52A to 52C are manufacturing step cross-sectional views taken along the line A-A of FIG. 47, and FIGS. 53A to 53C are manufacturing step cross-sectional views corresponding to FIGS. 52A to 52C, respectively, and taken along the line B-B. FIGS. 54A to 54C are manufacturing step cross-sectional views taken along the line A-A of FIG. 47, and FIGS. 55A to 55C are manufacturing step cross-sectional views corresponding to FIGS. 54A to 54C, respectively, and taken along the line B-B. FIG. 56 is a manufacturing step cross-sectional view taken along the line A-A of FIG. 47, and FIG. 57 is a manufacturing step cross-sectional view corresponding to FIG. 56, and taken along the line B-B.

Figure 50A:
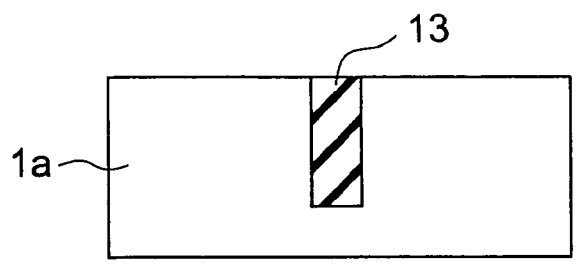
FIGS. 50A to 50F are cross-sectional views which depict manufacturing steps of a method for manufacturing the FET according to the tenth embodiment.
Figure 50B:
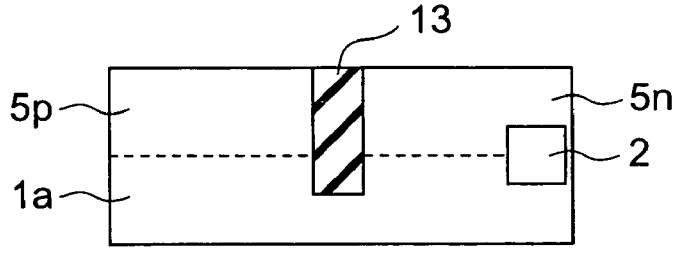
Figure 50C:
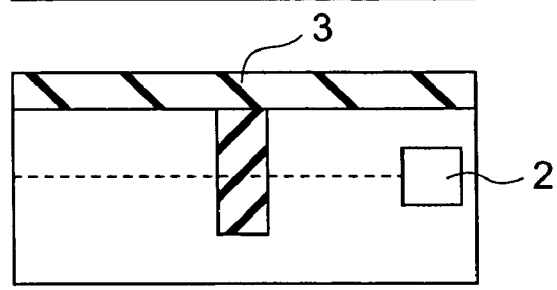
Figure 50D:
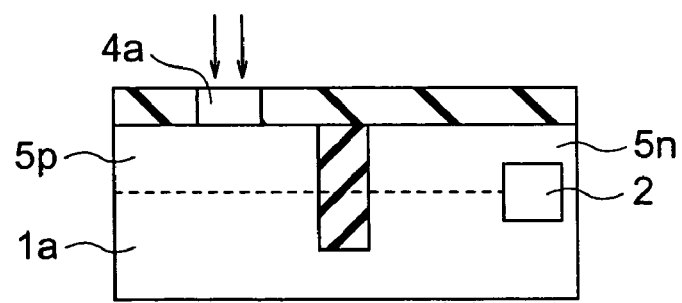
Figure 50E:
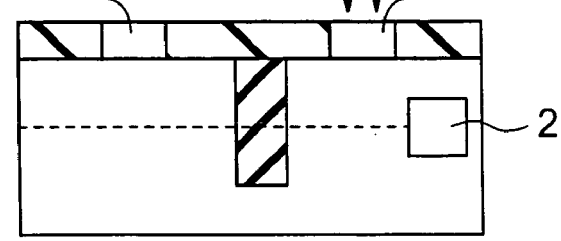
Figure 51A:
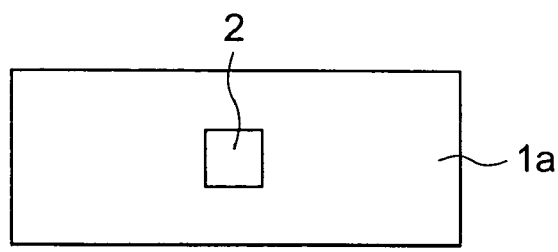
FIGS. 51A to 51F are cross-sectional views which depict manufacturing steps of the method for manufacturing the FET according to the tenth embodiment.
Figure 51B:
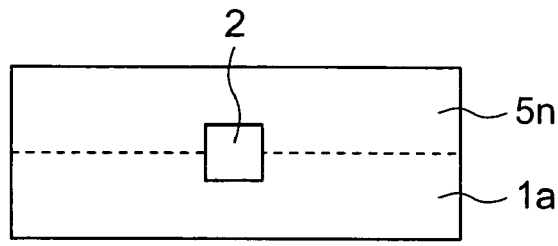
Figure 51C:
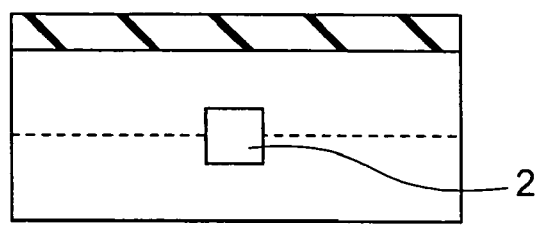
Figure 51D:
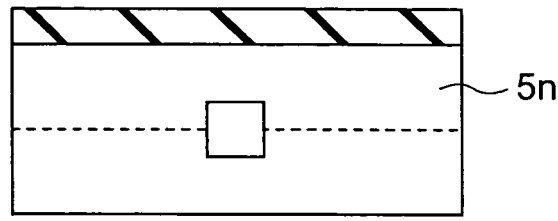
Figure 51E:
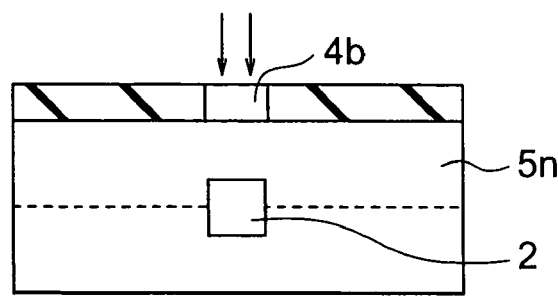
Figure 52A:
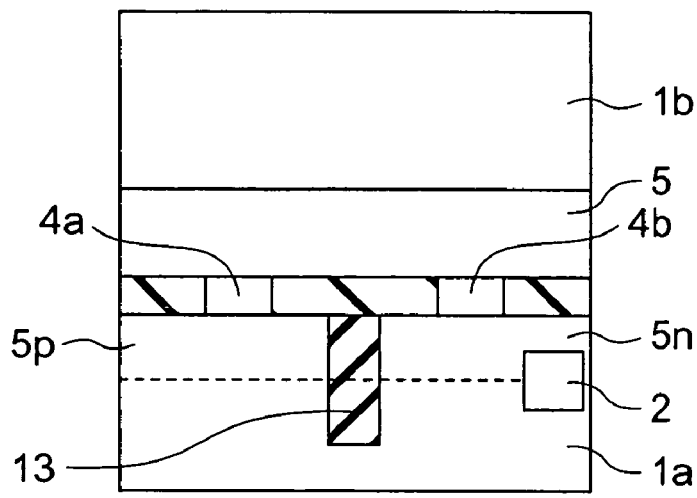
FIGS. 52A to 52C are cross-sectional views which depict manufacturing steps of the method for manufacturing the FET according to the tenth embodiment.
Figure 52B:
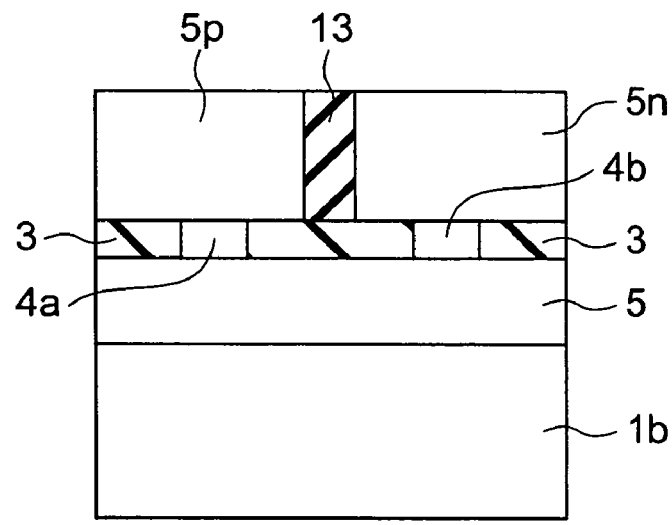
Figure 52C:
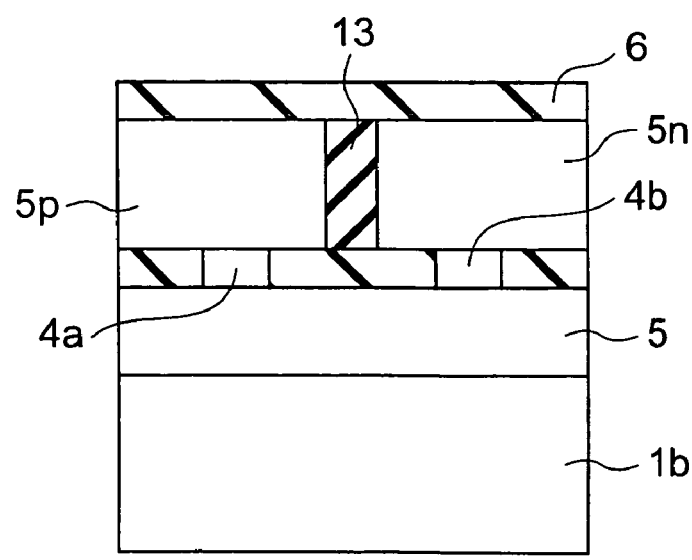

First, an element isolation region 13 having a depth of, for example, 100 nanometers is formed in an Si substrate 1a having (001) surface orientation (see FIGS. 50A and 51A). Hydrogen ions, for example, are implanted into the Si substrate 1a at an energy of a dosage of $5 \times 10^{16}/cm^2$ and a peak range of, for example, a 50-nanometer depth from a surface, thereby forming a high hydrogen concentration region. To recover the Si substrate 1a from a damage caused by the ion implantation, the Si substrate 1a is subjected to a heat treatment in a hydrogen atmosphere at 800° C. for 30 minutes, for example. By subjecting the Si substrate 1a to the heat treatment, the substrate 1a is recovered from the damage, an intermediate layer 2 having a lower mechanical strength than that of surroundings of the intermediate layer 2 is formed in the high hydrogen concentration region. At the same time, silicon layers 5a and 5p to serve as channel regions are formed (see FIGS. 50B and 51B). Microscopic vacancies are continuously formed in the intermediate layer 2, so that the intermediate layer has the lower mechanical strength.

A depleted hydrofluoric acid treatment is carried out to terminate an Si surface of the Si substrate 1a by hydrogen. The resultant substrate 1a is introduced into the MBE system. While Sr, Zr, and Ti are used as evaporation sources, an insulating film 3 consisting of $Sr(Ti_{0.43}Zr_{0.57})O_x$ by a thickness of five nanometers (see FIGS. 50C and 51C). At this time, an oxygen partial pressure is precisely controlled to $1 \times 10^{-7}$ Torr, thereby improving an orientation degree of $Sr(Ti_{0.43}Zr_{0.57})O_x$ and improving a crystallinity thereof. In addition, Si on the surface of the Si layer is oxidized, thereby forming an $SiO_2$ layer having a thickness of 0.5 nanometer, not shown, between the Si layers 5n and 5p and the metal oxide $Sr(Ti_{0.43}Zr_{0.57})O_x$. Namely, the insulating film has a layered structure composed by the $SiO_2$ layer having a thickness of 0.5 nanometer and the $Sr(Ti_{0.43}Zr_{0.57})O_x$ layer having a thickness of five nanometers. An X-ray diffraction evaluation indicates that the $Sr(Ti_{0.43}Zr_{0.57})O_x$ layer is an epitaxial layer oriented in a direction of (001) surface orientation, and that a lattice distance of $Sr(Ti_{0.43}Zr_{0.57})O_x$ in (001) surface orientation parallel to an interface between Si and $Sr(Ti_{0.43}Zr_{0.57})O_x$ is 5.01 angstroms. The lattice distance of 5.01 angstroms is smaller by 7.3% than that of Si. The evaluation also indicates that a half-width value of the X-ray diffraction is narrow, and that the $Sr(Ti_{0.43}Zr_{0.57})O_x$ layer is a film strongly oriented in the direction of (001) surface orientation and having a high crystallinity. A result of a lattice distance evaluation using the electron beam diffraction indicates that if the $Sr(Ti_{0.43}Zr_{0.57})O_x$ layer strongly oriented in the direction of (001) surface orientation and having the high crystallinity, a compressive stress is applied to Si in the channel region and the lattice distance of Si is narrowed. A lattice distance change of the $Sr(Ti_{0.43}Zr_{0.57})O_x$ is −7.0%, Si on the interface is strained following this $Sr(Ti_{0.43}Zr_{0.57})O_x$ layer, and a lattice distance change of each of the silicon layers 5n and 5p is −1.2%. Even Si distant from the interface by 20 nanometers undergoes a lattice distance change of −0.8%.

Next, a laser beam is locally irradiated only to the insulating film 3 on the silicon layer 5p. If so, an oxygen blending ratio x of $Sr(Ti_{0.43}Zr_{0.57})O_x$ is changed, thereby forming a region 4a having an oxygen blending ratio x of 2.7 (see FIGS. 50D and 51D). A lattice distance of $Sr(Ti_{0.43}Zr_{0.57})O_x$ is larger by −1.8% than that of Si. The reason is as follows. If oxygen atoms at lattice positions in the ionic crystal are separated, an average distance between the lattices is widened and the lattice distance is widened, accordingly. Following this, the lattice distance of Si in the silicon layer 5p is larger by −0.3% than that of Si. In addition, oxygen deficiency in the film occurs, so that a level caused by the oxygen deficiency is generated in a bandgap, and the region 4a is provided as a conductive region.

A laser beam is locally irradiated only to the insulating film 3 on the silicon layer 5n. If so, the oxygen blending ratio x of $Sr(Ti_{0.43}Zr_{0.57})O_x$ is changed, thereby forming a region 4b having an oxygen blending ratio x of 2.5 (see FIGS. 50E and 51E). A lattice distance of $Sr(Ti_{0.43}Zr_{0.57})O_x$ is larger by +1.8% than that of Si. The lattice distance of Si in the silicon layer 5b below the region 4b is larger by +0.3% than that of Si. The reason is as follows. By setting the lattice distance of $Sr(Ti_{0.43}Zr_{0.57})O_x$ strongly oriented in the direction of (001) surface orientation and having the high crystallinity larger than that of Si, a tensile stress is applied to Si and the lattice distance of Si is widened. In addition, oxygen deficiency in the film occurs, so that a level caused by the oxygen deficiency is generated in a bandgap, and the region 4b is provided as a conductive region.

Figure 50F:
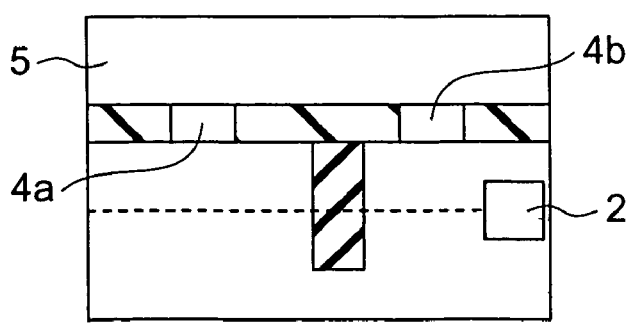
Figure 51F:
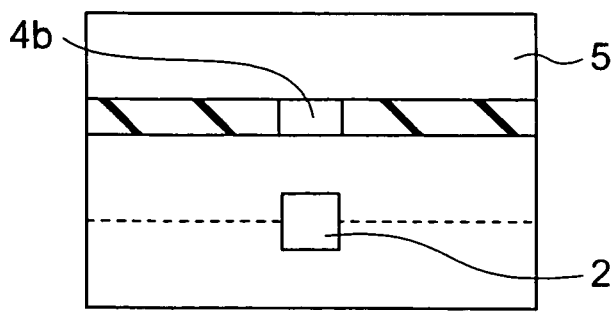

Next, an Si layer 5 having a thickness of, for example, one micrometer is formed by the CVD method (see FIGS. 50F and 51F). A surface of the Si layer 5 is bonded to the substrate 1b (see FIGS. 52A and 53A).

Figure 53A:
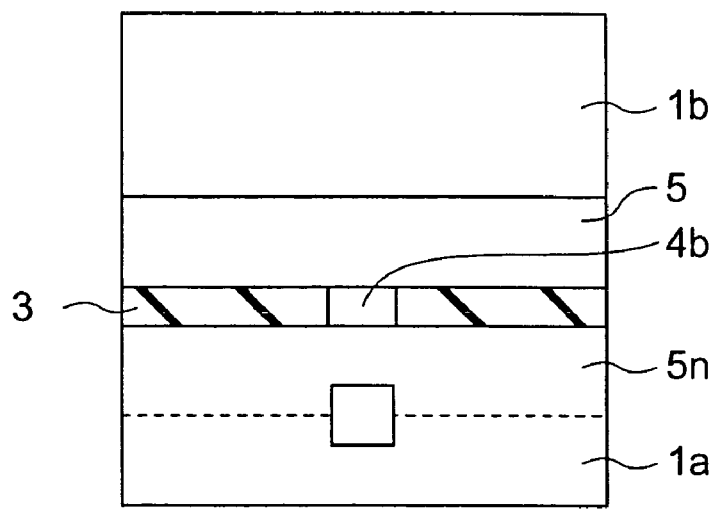
FIGS. 53A to 53C are cross-sectional views which depict manufacturing steps of the method for manufacturing the FET according to the tenth embodiment.
Figure 53B:
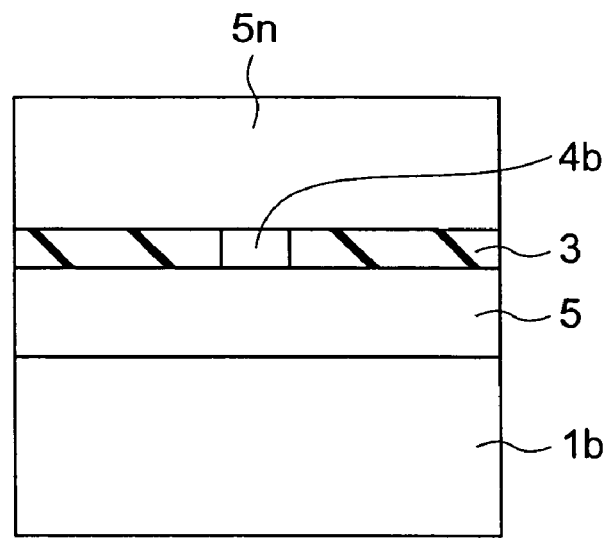
Figure 53C:
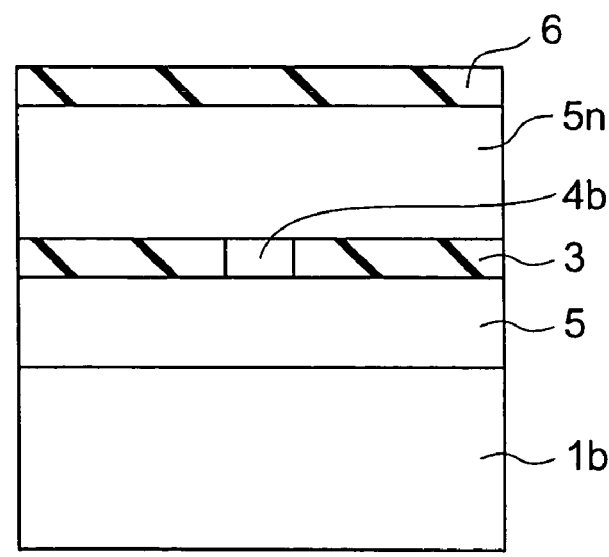
Figure 54A:
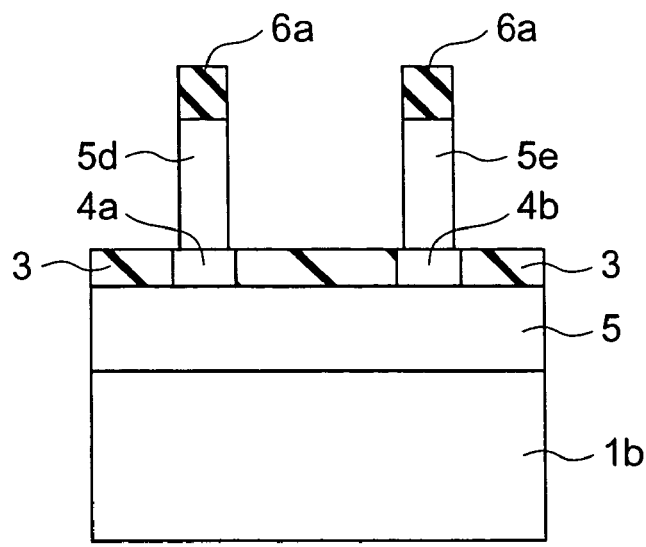
FIGS. 54A to 54C are cross-sectional views which depict manufacturing steps of the method for manufacturing the FET according to the tenth embodiment.
Figure 54B:
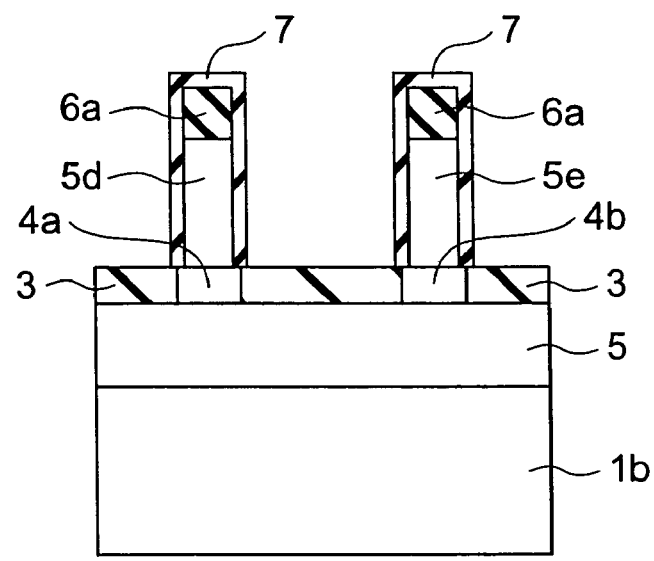
Figure 54C:
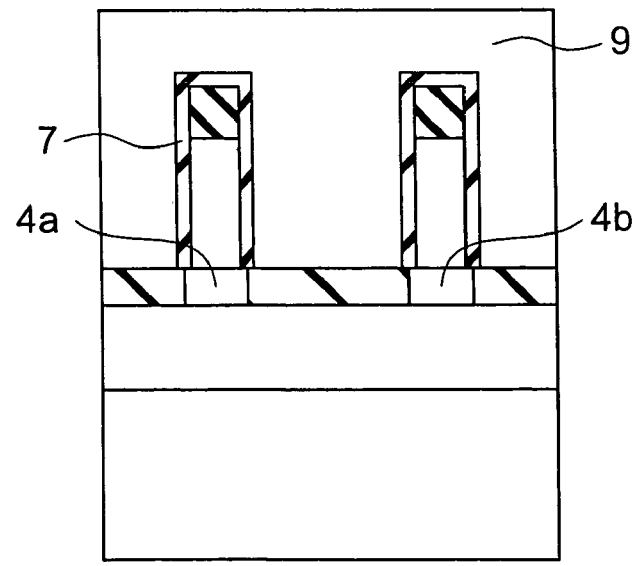

Thereafter, the substrate 1b is peeled off with the intermediate layer 2 set as a boundary, and the surface is planarized by, for example, the CMP (see FIGS. 52B and 53B). As a result, the Si layers 5n and 5p are exposed onto the metal oxide film. An impurity profile can be then formed in the Si layer 5n and 5p, to serve as the channel regions, by implanting element ions.

A depleted hydrofluoric acid treatment is carried out to terminate surfaces of the Si layer 5n and 5p by hydrogen. $SiO_2$ having a thickness of 50 nanometers is coated on entire surfaces, thereby forming an insulating film 6 consisting of $SiO_2$ (see FIGS. 52C and 53C).

Figure 55A:
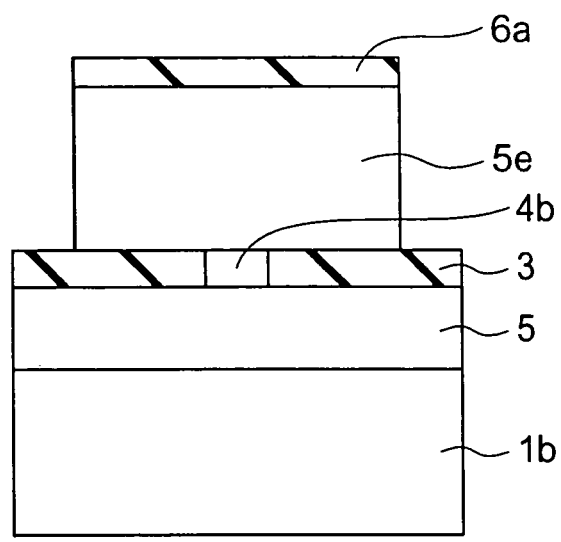
FIGS. 55A to 55C are cross-sectional views which depict manufacturing steps of the method for manufacturing the FET according to the tenth embodiment.
Figure 55B:
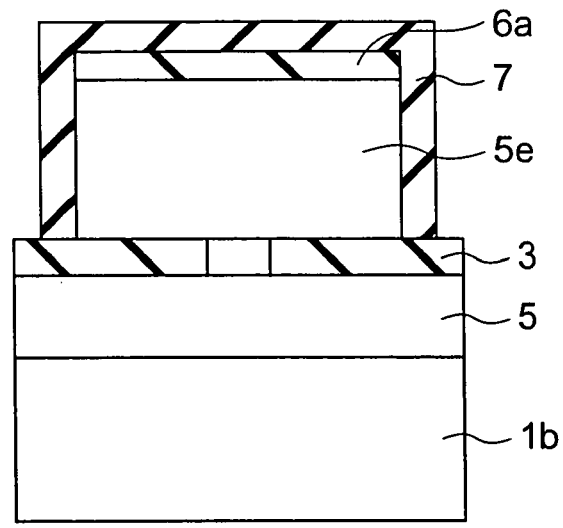
Figure 56A:
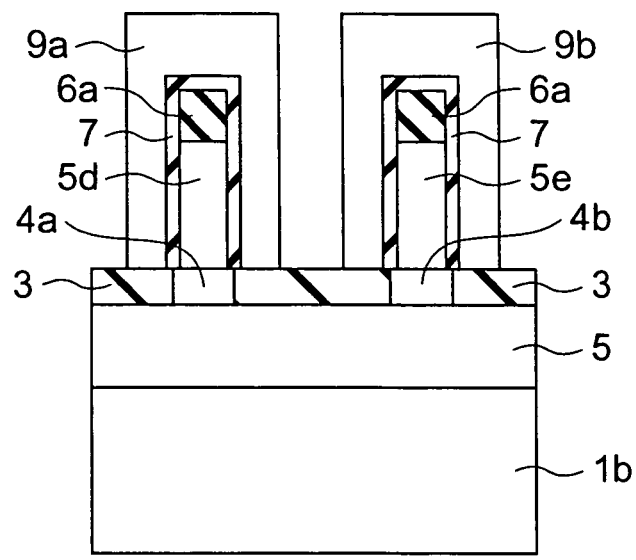
FIGS. 56A to 56C are cross-sectional views which depict manufacturing steps of the method for manufacturing the FET according to the tenth embodiment.

The insulating film 6 and the Si layers 5p and 5n are patterned by an anisotropic etching method such as the RIE method, thereby forming channel regions 5d and 5e right above the regions 4a and 4b, respectively, as shown in FIGS. 54A and 55A. SiO.sub.2 having a thickness of three nanometers is coated on side surfaces of the channel regions 5d and 5e, thereby forming a gate insulating film 7 consisting of SiO.sub.2 (see FIGS. 54B and 55B).

Figure 55C:
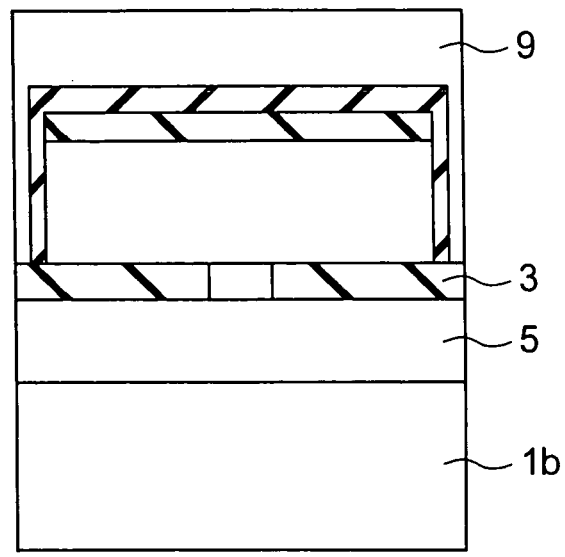

Next, a polysilicon film 9 to serve as gate electrodes is deposited on entire surfaces by the CVD method (see FIGS. 54C and 55C). The polysilicon film 9 is patterned by the anisotropic etching method such as the RIE method, thereby forming gate electrodes 9a and 9b (see FIGS. 56A and 57A).

Figure 56B:
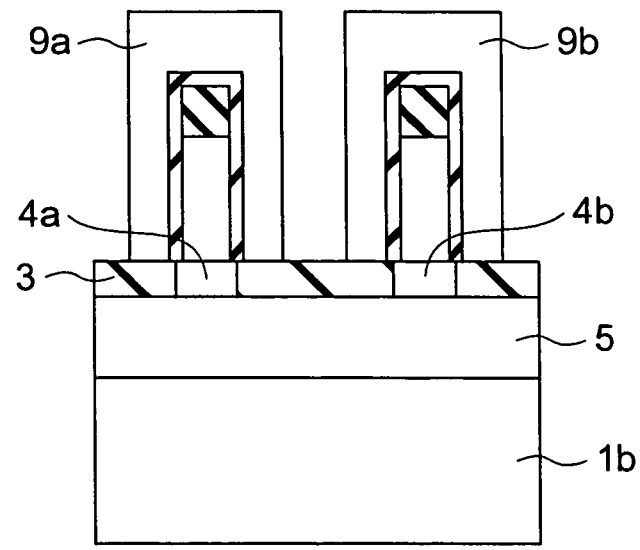
Figure 56C:
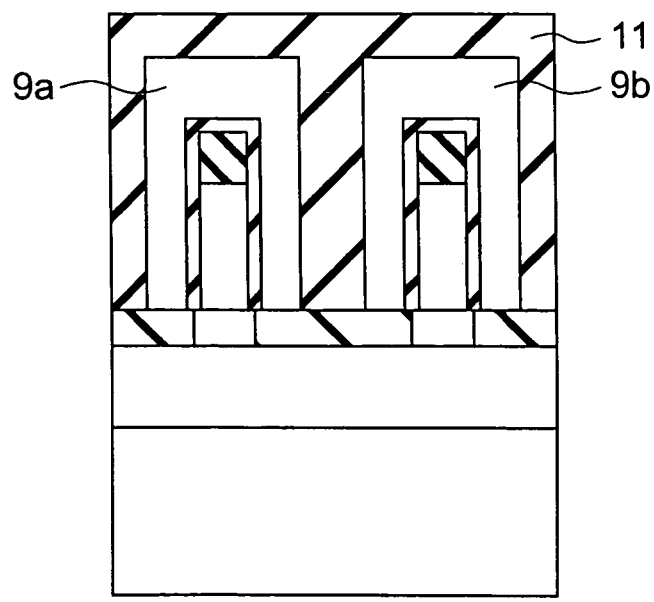
Figure 57A:
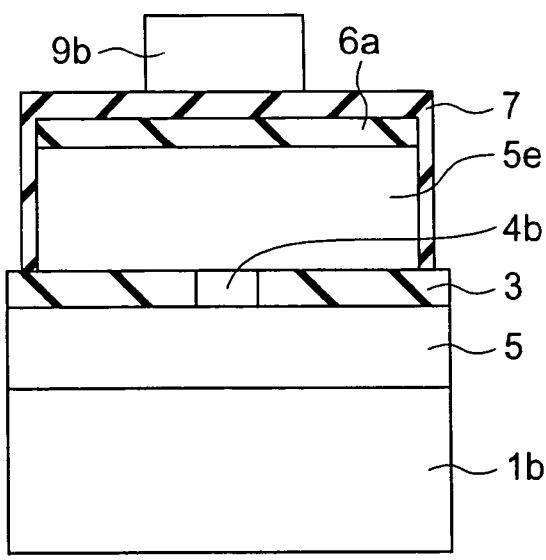
FIGS. 57A to 57C are cross-sectional views which depict manufacturing steps of the method for manufacturing the FET according to the tenth embodiment.
Figure 57B:
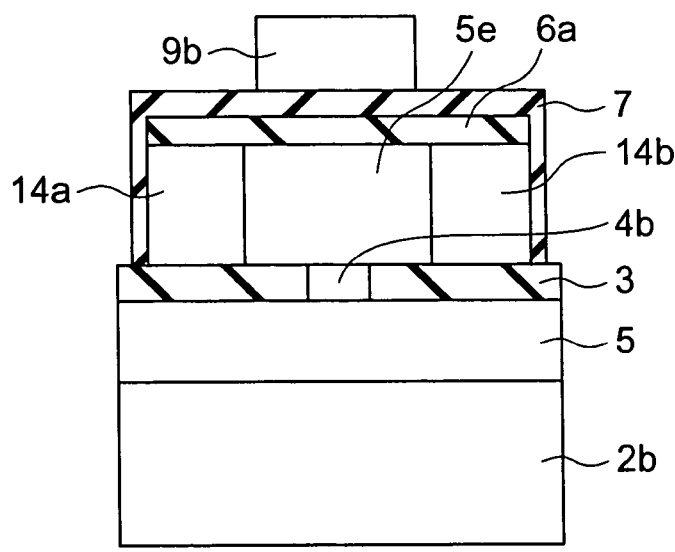
Figure 57C:
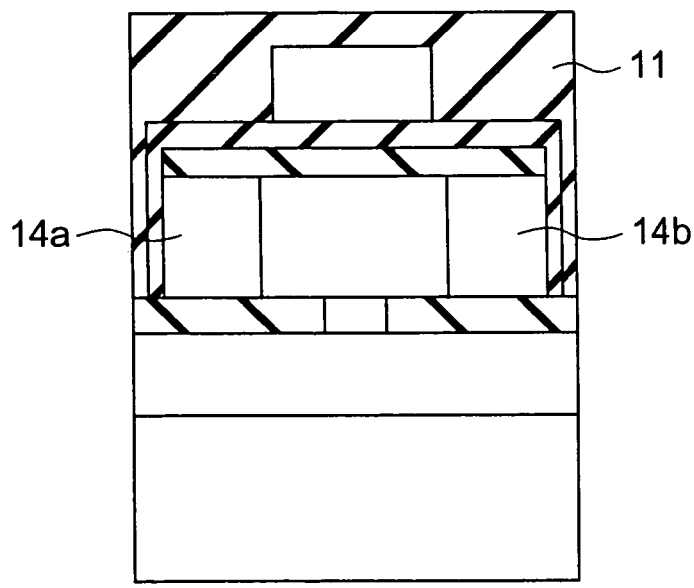

Using the gate electrodes 9a and 9b as a mask, ion implantation and a heat treatment are carried out, thereby forming source regions 14a and 15a and drain regions 14b and 15b doped with impurities (see FIGS. 56B and 57B). An SiO$_2$ film 11 is deposited on the entire surfaces by the CVD Method (see FIGS. 56C and 57C).

Figure 58:
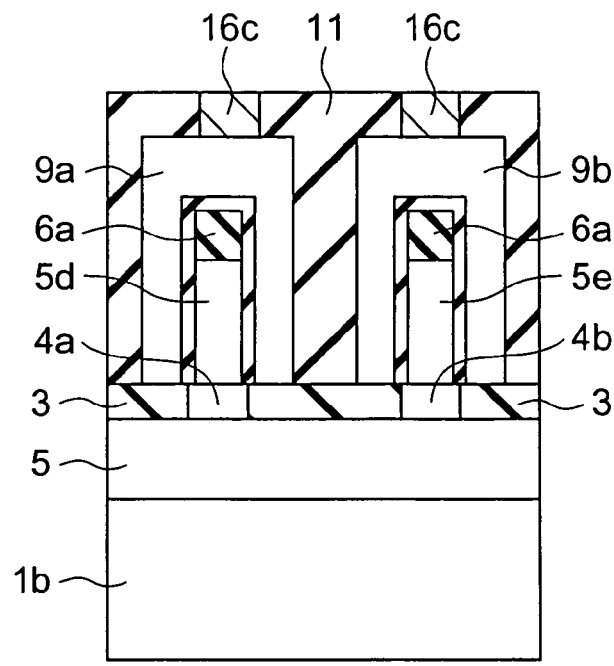
FIG. 58 is a cross-sectional view which depicts a manufacturing step of the method for manufacturing the FET according to the tenth embodiment.
Figure 59:
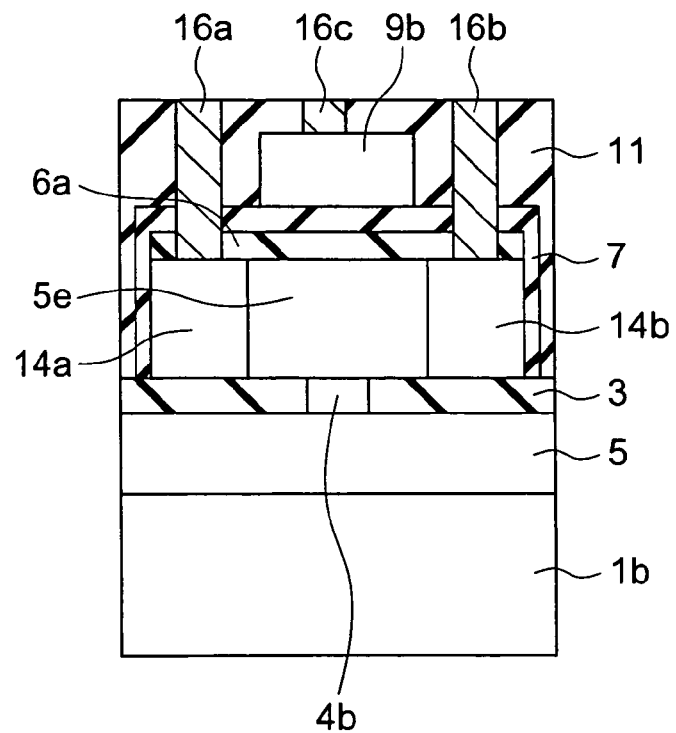
FIG. 59 is a cross-sectional view which depicts a manufacturing step of the method for manufacturing the FET according to the tenth embodiment.

As shown in FIGS. 58 and 59, contact holes are formed on the source regions 14a and 15a and the drain regions 14b and 15b, metal such as Al is evaporated to form a metal film on the entire surfaces, thereby forming a source electrode 16a, a drain electrode 16b, and a gate electrode 16c. The n-MISFET and the p-MISFET are thus completed.

Figure 60:
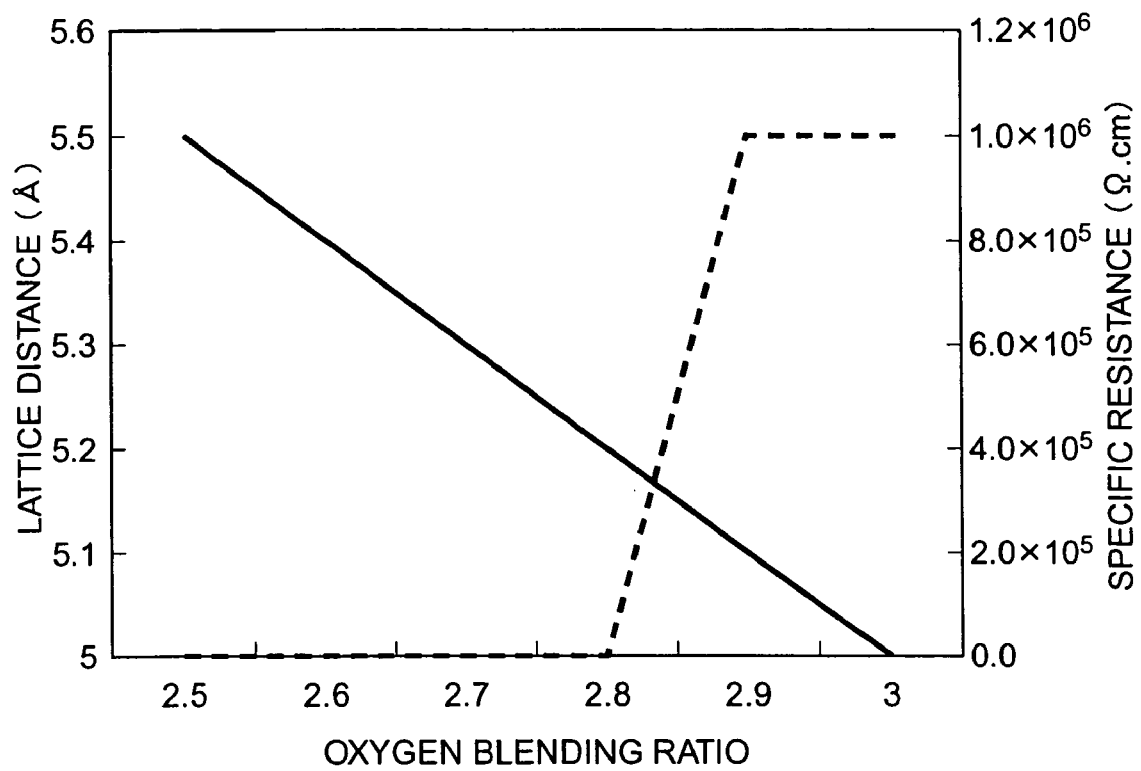
FIG. 60 is a chart which depicts the relationship between a blending ratio of metal to oxygen and a lattice spacing of $Sr(Ti_{0.43}Zr_{0.57})O_x$ of the FET according to the tenth embodiment.

FIG. 60 depicts the relationship among the oxygen blending ratio, the lattice distance, and the specific resistance of $Sr(Ti_{0.43}Zr_{0.57})O_x$. The oxygen blending ratio is measured by the EDX. When the oxygen blending ratio is the stoichiometric ratio (x=3.0), the lattice distance is 5.01 angstroms.

If the oxygen blending ratio x is lower than the stoichiometric ratio and less than 3.0 (x<3.0), the lattice distance is widened. The reason that the lattice distance in $Sr(Ti_{0.43}Zr_{0.57})O$ is greatly changed according to the oxygen blending ratio is considered as follows. $Sr(Ti_{0.43}Zr_{0.57})O_x$ is a crystal forming strong ionic bonds. The lower the oxygen ratio is, the lower the specific resistance becomes. This is because oxygen deficiency occurs in the film by reducing the oxygen blending ratio, and a level in the bandgap occurs.

Figure 61:
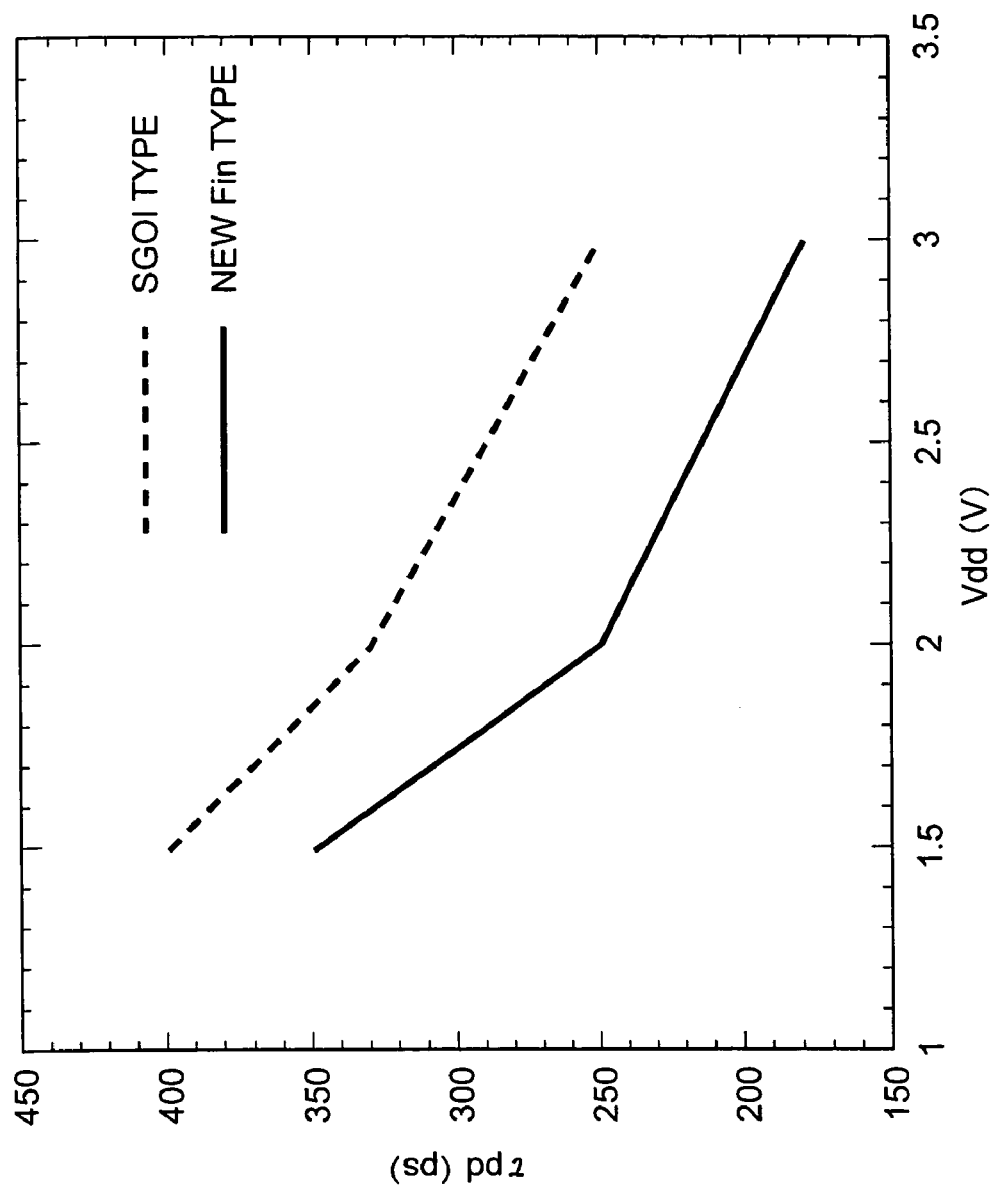
FIG. 61 is a characteristic chart which depicts the relationship between a drain voltage and a delay time of a new Fin FET according to the tenth embodiment and that according to the comparison example.

As shown in FIG. 61, a dependency of a gate delay time on a power supply voltage of an SGOI CMOS including a gate insulating film that consists of SiO$_2$ having an SiO$_2$ EOT of three nanometers is compared with that of a Fin CMOS including a gate insulating film that consists of SiO$_2$ having an SiO$_2$ EOT of three nanometers and including $Sr(Ti_{0.43}Zr_{0.57})O_x$ as the insulating film 3. As is obvious from FIG. 61, the Fin CMOS is lower in the dependency than the SGOI CMOS over entire voltages, and the delay time can be, therefore, reduced by using the Fin CMOS. The reason is as follows. In the SGOI CMOS, both an n type transistor and a p type transistor apply tensile strains to Si. As a result, only the mobility of electrons is improved while the mobility of holes is not improved so greatly. In the Fin CMOS, by contrast, the n type transistor can apply a tensile strain to Si and the p type transistor can apply a compressive strain thereto. Therefore, carrier scattering caused by Ge can be avoided, and both the electron mobility and the hole mobility are greatly improved.

The tenth embodiment has been described while referring to the instance of using the crystalline metal oxide $Sr(Ti_{0.43}Zr_{0.57})O_x$ as the insulating film 3. The crystalline metal oxide may be a crystalline oxide having a perovskite structure such as $SrTiO_3$, $SrZrO_3$, $Sr(TiZr)O_3$ or $SrCeO_3$. Further, even if an oxide having a rock-salt structure such as MgO, CaO, SrO or BaO, $Al_2O_3$, or $MgAl_2O_4$ having a spinel structure exhibits an equivalent effect by reducing the oxygen blending ratio thereof. As the film formation method for the crystalline metal oxide, the MBE method has been used. Alternatively, the other film formation method such as the CVD method, the sputtering method, or the electron beam evaporation method may be used.

More preferably, a rare-earth oxide containing at least one element selected from rare-earth elements (Sc, Y, La, Ce, Pr, Nd, Pm, Sm, Eu, Gd, Tb, Dy, Ho, Er, Tm, Yb, and Lu) is used as the crystalline metal oxide. This is because the crystallinity of the rare-earth oxide can be easily improved by controlling film formation conditions, and the rare-earth oxide enables effectively changing the lattice distance of S. If the rare-earth oxide containing at least one selected from Ce, Dy, Y, La, Pr and Gd is used, in particular, a film having a high crystallinity scan be realized and a particularly excellent effect can be obtained.

In the tenth embodiment, the surface orientation of the Si substrate may be any one of (001), (111), and (110). Further, the surface orientation may be shifted from these surface orientations.

Furthermore, in the tenth embodiment, with a view of straining Si in the channel region more effectively, metal oxides each having a rock-salt structure may be put between the crystalline metal oxide buried in the Si substrate, the crystalline metal oxide arranged above the channel region, and the crystalline metal oxide included in the gate insulating film, and the channel region, respectively. The effect is equivalent to that described in the fourth embodiment in detail. By providing the metal oxides each having the rock-salt structure therebetween, respectively, no amorphous SiO$_2$ layer is formed on an interface with the crystalline oxide, and the difference in lattice distance can influence the Si channel region more directly. A thickness of the oxide having the rock-salt structure is preferably in a range between one to three atomic layers. A matter such as SrO or MgO is unstable in the air. Due to this, if the thickness of the SrO layer is made larger than the two atomic layer, the crystallinity of the SrO layer changes with the passage of time and the characteristic thereof is deteriorated. If the thickness is smaller than one atomic layer, the effect of suppressing oxygen diffusion cannot be obtained and the amorphous SiO$_2$ layer is generated. If the metal oxide film having the rock-salt structure such as SrO, MgO, CaO, or BaO film, in particular, the effect of suppressing oxygen diffusion can be conspicuously observed and the transistor characteristics can be greatly improved. If the tensile stress is to be applied to Si, BaO that is the metal oxide having the rock-salt structure and larger in lattice distance than Si is preferably used. If the compressive stress is to be applied to Si, SrO, MgO, or CaO that is the metal oxide having the rock-salt structure and smaller in lattice distance than Si is preferably used. However, the lattice distance change of the Si layer mainly depends on the crystalline metal oxide having a large thickness. In the structure, for example, in which SrO smaller in lattice distance than Si is provided, and in which $Pr_2O_3$ larger in lattice distance than Si is provided on SrO, Si in the channel region is applied with the tensile stress. Therefore, a combination of the metal oxide having the rock-salt structure and the crystalline metal oxide can be arbitrarily selected. Further, the metal oxide each having the rock-salt structure are not always put between the crystalline metal oxide included in the insulating film below the channel region and different in lattice distance from Si, the crystalline metal oxide included in the insulating film above the channel region and different in lattice distance from Si, and the crystalline metal oxide included in the insulating film and different in lattice distance from Si, and the channel region, respectively. Even if the metal oxide having the rock-salt structure is put one of between the crystalline metal oxide included in the insulating film below the channel region and different in lattice distance from Si, the crystalline metal oxide included in the insulating film above the channel region and different in lattice distance from Si, and the crystalline metal oxide included in the gate insulating film and different in lattice distance from Si, and the channel region and the channel region, the equivalent effect can be achieved.

In the tenth embodiment, the instance of using the $SiO_2$ films as the insulating films 6a and 7 has been described. Alternatively, at least one of the insulating films 6a and 7 may be a metal oxide film.

As described so far, according to the respective embodiments of the present invention, the strain in an arbitrary amount can be introduced into the channel region. Therefore, the disadvantage of the very thin SOI transistor and the conventional Fin transistor, that is, the deterioration of the carrier mobility caused by the compressive strain applied from the underlying insulating film can be solved. In addition, the p-MISFET can achieve a great improvement in the mobility, which cannot be achieved by the strained Si transistor using SiGe. Besides, since the channel region and the substrate can be electrically connected to each other by the simple method for locally changing the element blending ratio of the insulating film, the manufacturing cost can be reduced as compared with the conventionally proposed Fin transistors.

As described so far, according to the respective embodiments of the present invention, the Fin MOSFET can achieve a great improvement in transistor characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A field effect transistor manufacturing method comprising:
    implanting hydrogen ions into a first semiconductor substrate to form an intermediate layer, which has hydrogen, into the first semiconductor substrate;
    subjecting the first semiconductor substrate to a heat treatment;
    forming a first insulating film on the first semiconductor substrate, the first insulating film including a metal oxide having a crystallinity and different in a lattice distance of a crystal on an interface from the first semiconductor substrate;
    forming a first semiconductor layer on the first insulating film;
    bonding a second semiconductor substrate to a surface of the first semiconductor layer;
    peeling off the second semiconductor substrate with the intermediate layer set as a boundary to divide the first semiconductor substrate in two and to expose one of the two of the first semiconductor substrate on the first insulating film;
    flattening an exposed surface of one of the two of the first semiconductor substrate;
    forming a second insulating film on the exposed surface;
    patterning the second insulating film and the exposed one of the first semiconductor substrate to form a channel region;
    forming a gate insulating film on side surfaces of the channel region;
    forming a gate electrode to cover at least the gate insulating film on the side surfaces of the channel region; and
    forming a source region and a drain region above the first insulating film on side surfaces of the channel region different from the side surfaces of the channel region on which the gate insulating film is formed.

2. The field effect transistor manufacturing method according to claim 1, wherein the lattice distance of the metal oxide included in the first insulating film differs from the lattice distance when an oxygen blending ratio of the metal oxide is a stoichiometric ratio, by setting the oxygen blending ratio lower than the stoichiometric ratio.

3. The field effect transistor manufacturing method according to claim 1, wherein a crystalline metal oxide having a rock-salt structure is put between the metal oxide included in the first insulating film and the channel region.

4. The field effect transistor manufacturing method according to claim 1, wherein the metal oxide included in the first insulating film includes one or more metal elements selected from a group consisting of rare-earth elements.

5. The field effect transistor manufacturing method according to claim 1, further comprising changing a conduction of a region of a part of the metal oxide included in the first insulating film after forming the first insulating film.

6. The field effect transistor manufacturing method according to claim 1, wherein the second insulating film includes another metal oxide having the crystallinity and different in the lattice distance from the first semiconductor substrate.

7. The field effect transistor manufacturing method according to claim 6, wherein the first insulating film and the second insulating film are equal in a direction in which a strain is applied to the channel region.

8. The field effect transistor manufacturing method according to claim 6, wherein the another metal oxide included in the second insulating film includes one or more metal elements selected from a group consisting of rare-earth elements.

9. The field effect transistor manufacturing method according to claim 6, wherein the lattice distance of the another metal oxide included in the second insulating film differs from the lattice distance when an oxygen blending ratio of the metal oxide is a stoichiometric ratio, by setting the oxygen blending ratio lower than the stoichiometric ratio.

10. The field effect transistor manufacturing method according to claim 6, wherein a crystalline metal oxide having a rock-salt structure is put between the another metal oxide included in the second insulating film and the channel region.

11. The field effect transistor manufacturing method according to claim 1, wherein the gate insulating film includes another metal oxide having the crystallinity and different in the lattice distance from the first semiconductor substrate.

12. The field effect transistor manufacturing method according to claim 11, wherein the first insulating film and the gate insulating film differ in a direction in which a strain is applied to the channel region.

13. The field effect transistor manufacturing method according to claim 11, wherein the another metal oxide included in the gate insulating film includes one or more metal elements selected from a group consisting of rare-earth elements.

14. The field effect transistor manufacturing method according to claim 1, wherein the lattice distance of the another metal oxide included in the gate insulating film differs from the lattice distance when an oxygen blending ratio of the metal oxide is a stoichiometric ratio, by setting the oxygen blending ratio lower than the stoichiometric ration.

15. The field effect transistor manufacturing method according to claim 11, wherein a crystalline metal oxide having a rock-salt structure is put between the another metal oxide included in the gate insulating film and the channel region.

16. The field effect transistor manufacturing method according to claim 1, wherein the forming of the first insulating film is performed in an atmosphere having an oxygen partial pressure of $1\times10^{-8}$ Torr to $1\times10^{-7}$ Torr.

* * * * *